US012527215B2

(12) United States Patent
Park et al.

(10) Patent No.: US 12,527,215 B2
(45) Date of Patent: Jan. 13, 2026

(54) COMPOUND FOR ORGANIC ELECTRICAL ELEMENT, ORGANIC ELECTRICAL ELEMENT USING SAME AND ELECTRONIC DEVICE THEREOF

(71) Applicant: DUK SAN NEOLUX CO., LTD., Cheonan-si (KR)

(72) Inventors: Hyoung Keun Park, Cheonan-si (KR); Yun Jong Ko, Cheonan-si (KR); Dae Sic Kim, Cheonan-si (KR); Sun Hee Lee, Cheonan-si (KR); Soung Yun Mun, Cheonan-si (KR); Nam Kyun Kim, Cheonan-si (KR)

(73) Assignee: DUK SAN NEOLUX CO., LTD., Cheonan-si (KR)

( * ) Notice: Subject to any disclaimer, the term of this patent is extended or adjusted under 35 U.S.C. 154(b) by 884 days.

(21) Appl. No.: 17/757,324

(22) PCT Filed: Dec. 17, 2020

(86) PCT No.: PCT/KR2020/018561

§ 371 (c)(1),
(2) Date: Jun. 14, 2022

(87) PCT Pub. No.: WO2021/125834

PCT Pub. Date: Jun. 24, 2021

(65) Prior Publication Data

US 2023/0100154 A1 Mar. 30, 2023

(30) Foreign Application Priority Data

Dec. 18, 2019 (KR) ........................ 10-2019-0170122

(51) Int. Cl.

| | |
|---|---|
| ***C07C 211/61*** | (2006.01) |
| ***C07C 211/54*** | (2006.01) |
| ***C07D 307/91*** | (2006.01) |
| ***C07D 319/24*** | (2006.01) |
| ***C07D 333/76*** | (2006.01) |
| ***C07D 493/04*** | (2006.01) |
| ***C09K 11/06*** | (2006.01) |
| ***H10K 85/60*** | (2023.01) |
| *H10K 50/81* | (2023.01) |
| *H10K 50/82* | (2023.01) |

(52) U.S. Cl.

CPC .......... *H10K 85/633* (2023.02); *C07C 211/54* (2013.01); *C07D 307/91* (2013.01); *C07D 319/24* (2013.01); *C07D 333/76* (2013.01); *C07D 493/04* (2013.01); *C09K 11/06* (2013.01); *H10K 85/636* (2023.02); *C07C 2603/97* (2017.05); *C09K 2211/1007* (2013.01); *C09K 2211/1011* (2013.01); *C09K 2211/1014* (2013.01); *C09K 2211/1018* (2013.01); *H10K 50/81* (2023.02); *H10K 50/82* (2023.02); *H10K 85/624* (2023.02); *H10K 85/626* (2023.02); *H10K 85/6574* (2023.02); *H10K 85/6576* (2023.02)

(58) Field of Classification Search

None

See application file for complete search history.

(56) References Cited

U.S. PATENT DOCUMENTS

2022/0393108 A1* 12/2022 Heo ...................... C07C 211/54

FOREIGN PATENT DOCUMENTS

| | | | |
|---|---|---|---|
| CN | 107663214 | A | 2/2018 |
| KR | 10-2013-0076842 | A | 7/2013 |
| KR | 10-2015-0012835 | A | 2/2015 |
| KR | 10-2017-0076599 | A | 7/2017 |
| KR | 10-2018-0009522 | A | 1/2018 |
| KR | 10-2019-0079646 | A | 7/2019 |

* cited by examiner

*Primary Examiner* — Robert S Loewe

(74) *Attorney, Agent, or Firm* — Vorys, Sater, Seymour and Pease LLP; Mih Suhn Koh

(57) ABSTRACT

Provided are an OLED compound, an organic electronic element employing the compound, and an electronic device comprising the element, where the compound improves the luminous efficiency, stability and lifetime of the organic electronic element.

15 Claims, 2 Drawing Sheets

COMPOUND FOR ORGANIC ELECTRICAL ELEMENT, ORGANIC ELECTRICAL ELEMENT USING SAME AND ELECTRONIC DEVICE THEREOF

BACKGROUND

Technical Field

The present invention relates to compound for organic electronic element, organic electronic element using the same, and an electronic device thereof.

Background Art

In general, organic light emitting phenomenon refers to a phenomenon that converts electric energy into light energy by using an organic material. An organic electronic element using an organic light emitting phenomenon usually has a structure including an anode, a cathode, and an organic material layer interposed therebetween. Here, in order to increase the efficiency and stability of the organic electronic element, the organic material layer is often composed of a multi-layered structure composed of different materials, and for example, may include a hole injection layer, a hole transport layer, an emitting layer, an electron transport layer, an electron injection layer and the like.

A material used as an organic material layer in an organic electronic element may be classified into a light emitting material and a charge transport material, such as a hole injection material, a hole transport material, an electron transport material, an electron injection material and the like depending on its function.

In the organic light emitting diode, the most problematic is the lifetime and the efficiency. As the display becomes large, the efficiency and the lifetime problem must be solved. Efficiency, life span, driving voltage and the like are related to each other. As the efficiency is increased, the driving voltage is relatively decreased, and as the driving voltage drops, the crystallization of the organic material due to joule heating generated during driving is reduced, and as a result, the life span tends to increase.

However, simply improving the organic material layer cannot maximize the efficiency. This is because, when the optimal combination of the energy level and T1 value between each organic material layer and the intrinsic properties (mobility, interface characteristics, etc.) of the material are achieved, long life and high efficiency can be achieved at the same time.

Further, recently, in organic electroluminescent devices, in order to solve the emission problem in the hole transport layer, an emitting-auxiliary layer must be present between the hole transport layer and an emitting layer, and it is necessary to develop different emitting-auxiliary layers according to the respective emitting layers (R, G, B).

In general, electrons are transferred from the electron transport layer to the emitting layer, and holes are transferred from the hole transport layer to the emitting layer to generate excitons by recombination.

However, the material used for the hole transport layer has a low HOMO value and therefore has mostly low T1 value. As a result, the exciton generated in the emitting layer is transferred to the hole transport layer, resulting in charge unbalance in the emitting layer, and light is emitted at the interface of the hole transport layer.

When light is emitted at the interface of the hole transport layer, the color purity and efficiency of the organic electronic device are lowered and the life span is shortened. Therefore, it is urgently required to develop an emitting-auxiliary layer having a high T1 value and a HOMO level between the HOMO energy level of the hole transport layer and the HOMO energy level of the emitting layer.

Meanwhile, it is necessary to develop a hole injection layer material having stable characteristics, that is, a high glass transition temperature, against joule heating generated when the device is driven, while delaying penetration of the metal oxide from the anode electrode (ITO), which is one of the causes of shortening the lifetime of the organic electronic device, into the organic layer. The low glass transition temperature of the hole transport layer material has a characteristic that when the device is driven, the uniformity of the surface of the thin film is lowered, which has been reported to have a great influence on the lifetime of the device. In addition, OLED devices are mainly formed by a deposition method, and it is necessary to develop a material that can withstand long time in deposition, that is, a material having high heat resistance characteristics.

That is, in order to sufficiently exhibit the excellent characteristics of the organic electronic element, a material for forming an organic material layer in an element such as a hole injection material, a hole transport material, a light emitting material, an electron transport material, an electron injection material, an emitting-auxiliary layer material should be supported by stable and efficient materials. However, such a stable and efficient organic material layer material for an organic electronic element has not been sufficiently developed yet. Therefore, development of new materials is continuously required, and development of materials for the hole transport layer or the emitting-auxiliary layer is urgently required.

As a reference prior art document, KR1020130076842 A was used.

DETAILED DESCRIPTION OF THE INVENTION

Summary

In order to solve the problems of the background art described above, the present invention has revealed a compound having a novel structure, and that when the compound is applied to an organic electronic element, the luminous efficiency, stability and lifetime of the element are greatly improved.

Accordingly, an object of the present invention is to provide a novel compound, an organic electronic element using the same, and an electronic device.

Technical Solution

The present invention provides a compound represented by Formula (1).

<Formula (1)>

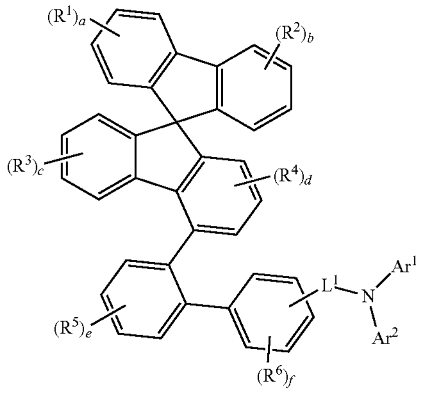

In another aspect, the present invention provides an organic electronic element including the compound represented by Formula (1) and an electronic device thereof.

Effects of the Invention

By using the compound according to the present invention, it is possible to achieve a high luminous efficiency, a low driving voltage, and a high heat resistance of the element, and can greatly improve the color purity and lifetime of the element.

Figure 1:
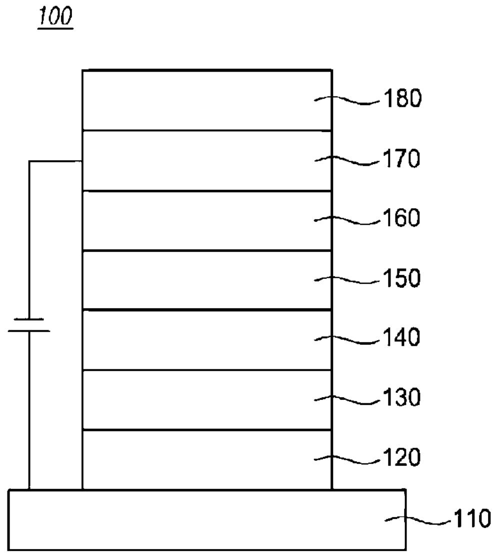
FIG. 1 to FIG. 3 each illustrate an example of an organic electronic element according to the present invention.

| | |
|---|---|
| 100, 200, 300: organic electronic element | 110: the first electrode |
| 120: hole injection layer | 130: hole transport layer |
| 140: emitting layer | 150: electron transport layer |
| 160: electron injection layer | 170: second electrode |
| 160: electron transport layer | 170: electron injection layer |
| 180: light efficiency enhancing Layer | 210: buffer layer |
| 220: emitting-auxiliary layer | 320: first hole injection layer |
| 330: first hole transport layer | 340: first emitting layer |
| 350: first electron transport layer | 360: first charge generation layer |
| 361: second charge generation layer | 420: second hole injection layer |
| 430: second hole transport layer | 440: second emitting layer |
| 450: second electron transport layer | CGL: charge generation layer |
| ST1: first stack | ST2: second stack |

DETAILED DESCRIPTION

Hereinafter, some embodiments of the present invention will be described in detail. Further, in the following description of the present invention, a detailed description of known functions and configurations incorporated herein will be omitted when it may make the subject matter of the present invention rather unclear.

In addition, terms, such as first, second, A, B, (a), (b) or the like may be used herein when describing components of the present invention. Each of these terminologies is not used to define an essence, order or sequence of a corresponding component but used merely to distinguish the corresponding component from other component(s). It should be noted that if a component is described as being "connected", "coupled", or "connected" to another component, the component may be directly connected or connected to the other component, but another component may be "connected", "coupled" or "connected" between each component.

As used in the specification and the accompanying claims, unless otherwise stated, the following is the meaning of the term as follows.

Unless otherwise stated, the term "halo" or "halogen", as used herein, includes fluorine, bromine, chlorine, or iodine.

Unless otherwise stated, the term "alkyl" or "alkyl group", as used herein, has a single bond of 1 to 60 carbon atoms, and means saturated aliphatic functional radicals including a linear alkyl group, a branched chain alkyl group, a cycloalkyl group (alicyclic), an cycloalkyl group substituted with a alkyl or an alkyl group substituted with a cycloalkyl.

Unless otherwise stated, the term "alkenyl" or "alkynyl", as used herein, has double or triple bonds of 2 to 60 carbon atoms, but is not limited thereto, and includes a linear or a branched chain group.

Unless otherwise stated, the term "cycloalkyl", as used herein, means alkyl forming a ring having 3 to 60 carbon atoms, but is not limited thereto.

Unless otherwise stated, the term "alkoxyl group", "alkoxy group" or "alkyloxy group", as used herein, means an oxygen radical attached to an alkyl group, but is not limited thereto, and has 1 to 60 carbon atoms.

Unless otherwise stated, the term "aryloxyl group" or "aryloxy group", as used herein, means an oxygen radical attached to an aryl group, but is not limited thereto, and has 6 to 60 carbon atoms.

Unless otherwise stated, the term "aryl group" or "arylene group", as used herein, has 6 to 60 carbon atoms, but is not limited thereto. Herein, the aryl group or arylene group means a monocyclic and polycyclic aromatic group, and may also be formed in conjunction with an adjacent group. Examples of "aryl group" may include a phenyl group, a biphenyl group, a fluorene group, or a spirofluorene group.

The prefix "aryl" or "ar" means a radical substituted with an aryl group. For example, an arylalkyl may be an alkyl substituted with an aryl, and an arylalenyl may be an alkenyl substituted with aryl, and a radical substituted with an aryl has a number of carbon atoms as defined herein.

Also, when prefixes are named subsequently, it means that substituents are listed in the order described first. For example, an arylalkoxy means an alkoxy substituted with an aryl, an alkoxylcarbonyl means a carbonyl substituted with an alkoxyl, and an arylcarbonylalkenyl also means an alkenyl substituted with an arylcarbonyl, wherein the arylcarbonyl may be a carbonyl substituted with an aryl.

Unless otherwise stated, the term “heterocyclic group”, as used herein, contains one or more heteroatoms, but is not limited thereto, has 2 to 60 carbon atoms, includes any one of monocyclic and polycyclic rings, and may include heteroaliphadic ring and/or heteroaromatic ring. Also, the heterocyclic group may also be formed in conjunction with an adjacent group.

Unless otherwise stated, the term “heteroatom”, as used herein, represents at least one of N, O, S, P, or Si.

Also, the term “heterocyclic group” may include a ring including $SO_2$ instead of carbon consisting of cycle. For example, “heterocyclic group” includes a following compound.

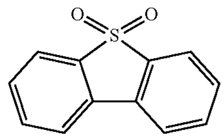 [SMILES: O=S1(=O)c2ccccc2-c2ccccc21]

Unless otherwise stated, the term “fluorenyl group” or “fluorenylene group”, as used herein, means a monovalent or divalent functional group, in which R, R' and R" are all hydrogen in the following structures, and the term “substituted fluorenyl group” or “substituted fluorenylene group” means that at least one of the substituents R, R', R" is a substituent other than hydrogen, and include those in which R and R' are bonded to each other to form a spiro compound together with the carbon to which they are bonded.

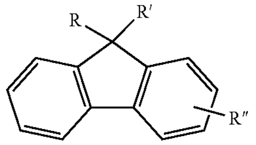

The term “spiro compound”, as used herein, has a ‘spiro union’, and a spiro union means a connection in which two rings share only one atom. At this time, atoms shared in the two rings are called ‘spiro atoms’, and these compounds are called ‘monospiro-’, ‘di-spiro’ and ‘tri-spiro’, respectively, depending on the number of atoms in a compound.

Unless otherwise stated, the term “aliphatic”, as used herein, means an aliphatic hydrocarbon having 1 to 60 carbon atoms, and the term “aliphatic ring”, as used herein, means an aliphatic hydrocarbon ring having 3 to 60 carbon atoms.

Unless otherwise stated, the term “ring”, as used herein, means an aliphatic ring having 3 to 60 carbon atoms, or an aromatic ring having 6 to 60 carbon atoms, or a hetero ring having 2 to 60 carbon atoms, or a fused ring formed by the combination of them, and includes a saturated or unsaturated ring.

Other hetero compounds or hetero radicals other than the above-mentioned hetero compounds include, but are not limited thereto, one or more heteroatoms.

Unless otherwise stated, the term “substituted or unsubstituted”, as used herein, means that substitution is substituted by at least one substituent selected from the group consisting of, but is not limited thereto, deuterium, halogen, an amino group, a nitrile group, a nitro group, a $C_1$-$C_{20}$ alkyl group, a $C_1$-$C_{20}$ alkoxyl group, a $C_1$-$C_{20}$ alkylamine group, a $C_1$-$C_{20}$ alkylthiopen group, a $C_6$-$C_{20}$ arylthiopen group, a $C_2$-$C_{20}$ alkenyl group, a $C_2$-$C_{20}$ alkynyl group, a $C_3$-$C_{20}$ cycloalkyl group, a $C_6$-$C_{20}$ aryl group, a $C_6$-$C_{20}$ aryl group substituted by deuterium, a $C_8$-$C_{20}$ arylalkenyl group, a silane group, a boron group, a germanium group, and a $C_2$-$C_{20}$ heterocyclic group.

Unless otherwise expressly stated, the Formula used in the present invention, as used herein, is applied in the same manner as the substituent definition according to the definition of the exponent of the following Formula.

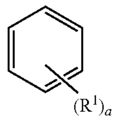

wherein, when a is an integer of zero, the substituent $R^1$ is absent, when a is an integer of 1, the sole substituent $R^1$ is linked to any one of the carbon constituting the benzene ring, when a is an integer of 2 or 3, each substituent $R^1$s may be the same and different, when a is an integer of 4 to 6, and is linked to the benzene ring in a similar manner, whereas the indication of hydrogen bound to the carbon forming the benzene ring is omitted.

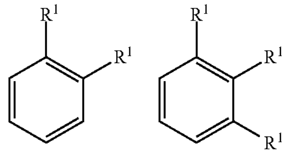

(a = 2) (a = 3)

Hereinafter, a compound according to an aspect of the present invention and an organic electronic element comprising the same will be described.

The present invention provides a compound represented by Formula (1).

<Formula (1)>

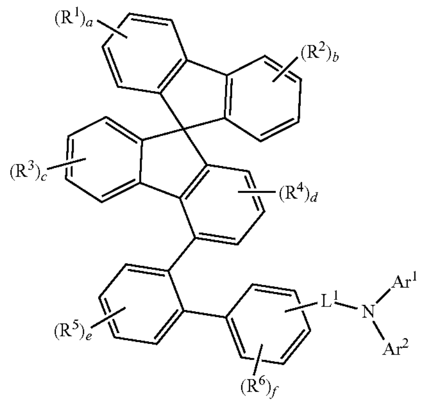

In Formula (1), each symbol may be defined as follows.

1) $R^1$, $R^2$, $R^3$, $R^4$, $R^5$ and $R^6$ are each the same or different, and are each independently selected from the group consisting of hydrogen; deuterium; tritium; halogen; cyano group; nitro group; $C_6$-$C_{60}$ aryl group; a fluorenyl group; a $C_2$-$C_{60}$ heterocyclic group including at least one heteroatom of O, N, S, Si or a fused ring group of a $C_3$-$C_{60}$ aliphatic ring and a $C_6$-$C_{60}$ aromatic ring; $C_1$-$C_{50}$ alkyl group; $C_2$-$C_{20}$ alkenyl group; $C_2$-$C_{20}$ alkynyl group; $C_1$-$C_{30}$ alkoxyl group; $C_6$-$C_{30}$ aryloxy group; and -L'-N($R_a$)($R_b$);

in case a, b, c, d, e and f are 2 or more, an adjacent plurality of $R^1$ or a plurality of $R^2$ or a plurality of $R^3$ or a plurality of $R^4$ or a plurality of $R^5$ or a plurality of $R^6$ may be bonded to each other to form a ring, a, b, c, e and f are each independently an integer of 0 to 4, d is an integer of 1 to 3.

wherein in case $R^1$, $R^2$, $R^3$, $R^4$, $R^5$ and $R^6$ are an aryl group, it is preferably an $C_6$~$C_{36}$ aryl group, more preferably an $C_6$~$C_{25}$ aryl group, in case $R^1$, $R^2$, $R^3$, $R^4$, $R^5$ and $R^6$ are an heterocyclic group, it is preferably a $C_2$~$C_{36}$ heterocyclic group, and more preferably a $C_2$~$C_{24}$ heterocyclic group, in case $R^1$, $R^2$, $R^3$, $R^4$, $R^5$ and $R^6$ are a fused ring group, it is preferably a fused ring group of an $C_6$~$C_{36}$ aliphatic ring and an $C_6$~$C_{36}$ aromatic ring, more preferably a fused ring group of an $C_6$~$C_{24}$ aliphatic ring and an $C_6$~$C_{24}$ aromatic ring, in case $R^1$, $R^2$, $R^3$, $R^4$, $R^5$ and $R^6$ are alkyl groups, it is preferably an $C_1$~$C_{36}$ alkyl group, more preferably an $C_1$~$C_{24}$ alkyl group, 2) wherein $L^1$ is selected from the group consisting of single bond; a $C_6$-$C_{60}$ arylene group; a fluorenylene group; a fused ring group of a $C_3$-$C_{60}$ aliphatic ring and a $C_6$~$C_{60}$ aromatic ring; and a $C_2$-$C_{60}$ heterocyclic group;

wherein in case $L^1$ is arylene group, it is preferably an $C_6$~$C_{36}$ arylene group, more preferably an $C_6$~$C_{24}$ arylene group, when $L^1$ is a fused ring group, it is preferably a fused ring group of an $C_6$~$C_{36}$ aliphatic ring and an $C_6$~$C_{36}$ aromatic ring, and more preferably a fused ring group of an $C_6$~$C_{24}$ aliphatic ring and an $C_6$~$C_{24}$ aromatic ring, when $L^1$ is a heterocyclic group, it is preferably a $C_2$~$C_{36}$ heterocyclic group, and more preferably a $C_2$~$C_{24}$ heterocyclic group.

3) $Ar^1$ and $Ar^2$ are the same or different from each other, and are each independently selected from the group consisting of deuterium; tritium; halogen; cyano group; nitro group; $C_6$-$C_{60}$ aryl group; a fluorenyl group; a $C_2$-$C_{60}$ heterocyclic group including at least one heteroatom of O, N, S, Si or P, a fused ring group of a $C_3$-$C_{60}$ aliphatic ring and a $C_6$-$C_{60}$ aromatic ring; $C_1$-$C_{50}$ alkyl group; $C_2$-$C_{20}$ alkenyl group; $C_2$-$C_{20}$ alkynyl group; $C_1$-$C_{30}$ alkoxyl group; $C_6$-$C_{30}$ aryloxy group; and -L'-N($R_a$)($R_b$); wherein $Ar^1$ and $Ar^2$ may be bonded to each other to form a ring.

In case $Ar^1$ and $Ar^2$ are an aryl group, it is preferably an $C_6$~$C_{36}$ aryl group, more preferably an $C_6$~$C_{25}$ aryl group, in case $Ar^1$ and $Ar^2$ are an heterocyclic group, it is preferably a $C_2$~$C_{36}$ heterocyclic group, and more preferably a $C_2$~$C_{24}$ heterocyclic group, in case $Ar^1$ and $Ar^2$ are a fused ring group, it is preferably a fused ring group of an $C_6$~$C_{36}$ aliphatic ring and an $C_6$~$C_{36}$ aromatic ring, more preferably a fused ring group of an $C_6$~$C_{24}$ aliphatic ring and an $C_6$~$C_{24}$ aromatic ring, in case $Ar^1$ and $Ar^2$ are alkyl groups, it is preferably an $C_1$~$C_{36}$ alkyl group, more preferably an $C_1$~$C_{24}$ alkyl group, 4) wherein L' is selected from the group consisting of single bond; a $C_6$-$C_{60}$ arylene group; a fluorenylene group; a $C_3$-$C_{60}$ aliphatic ring; a $C_2$-$C_{60}$ heterocyclic group including at least one heteroatom of O, N, S, Si or P; and combinations thereof; wherein $R_a$ and $R_b$ are each independently selected from a $C_6$-$C_{60}$ aryl group; a fluorenyl group; a $C_3$-$C_{60}$ aliphatic ring and a $C_2$-$C_{60}$ heterocyclic group including at least one heteroatom of O, N, S, Si or P;

In case L' is arylene group, it is preferably an $C_6$~$C_{36}$ arylene group, more preferably an $C_6$~$C_{24}$ arylene group, when L' is an aliphatic ring group, it is preferably an $C_3$~$C_{36}$ aliphatic ring, more preferably an $C_3$~$C_{24}$ aliphatic ring, when L' is a heterocyclic group, it is preferably a $C_2$~$C_{36}$ heterocyclic group including at least one heteroatom of O, N, S, Si or P; more preferably a $C_2$~$C_{24}$ heterocyclic group including at least one heteroatom of O, N, S, Si or P;

In case $R_a$ and $R_b$ are an aryl group, it is preferably an $C_6$~$C_{36}$ aryl group, more preferably an $C_6$~$C_{25}$ aryl group, in case $R_a$ and $R_b$ are an aliphatic ring group, it is preferably an $C_3$~$C_{36}$ aliphatic ring, more preferably an $C_3$~$C_{24}$ aliphatic ring, in case $R_a$ and $R_b$ are a heterocyclic group, it is preferably $C_2$~$C_{36}$ heterocyclic groups including at least one heteroatom of O, N, S, Si or P; more preferably $C_2$~$C_{24}$ heterocyclic groups including at least one heteroatom of O, N, S, Si or P;

wherein, the aryl group, arylene group, heterocyclic group, fluorenyl group, fluorenylene group, fused ring group, alkyl group, alkenyl group, alkoxy group and aryloxy group may be substituted with one or more substituents selected from the group consisting of deuterium; halogen; silane group; siloxane group; boron group; germanium group; cyano group; nitro group; $C_1$-$C_{20}$ alkylthio group; $C_1$-$C_{20}$ alkoxyl group; $C_1$-$C_{20}$ alkyl group; $C_2$-$C_{20}$ alkenyl group; $C_2$-$C_{20}$ alkynyl group; $C_6$-$C_{20}$ aryl group; $C_6$-$C_{20}$ aryl group substituted with deuterium; a fluorenyl group; $C_2$~$C_{20}$ heterocyclic group; $C_3$-$C_{20}$ cycloalkyl group; $C_7$-$C_{20}$ arylalkyl group; $C_8$-$C_{20}$ arylalkenyl group; and -L'-N($R_a$)($R_b$), wherein the substituents may be bonded to each other to form a saturated or unsaturated ring, wherein the term 'ring' means a $C_3$-$C_{60}$ aliphatic ring, a $C_6$-$C_{60}$ aromatic ring, or a $C_2$-$C_{60}$ heterocyclic group, or a fused ring formed by combination thereof.

Also, Formula (1) is represented by any one of Formulas (2) to (4).

Formula (2)

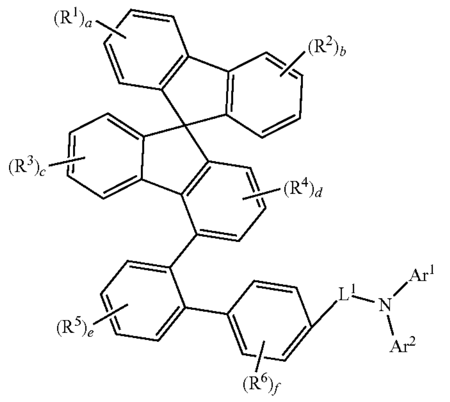

-continued

Formula (3)

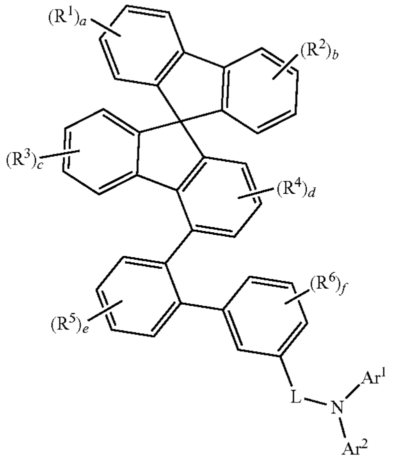

Formula (4)

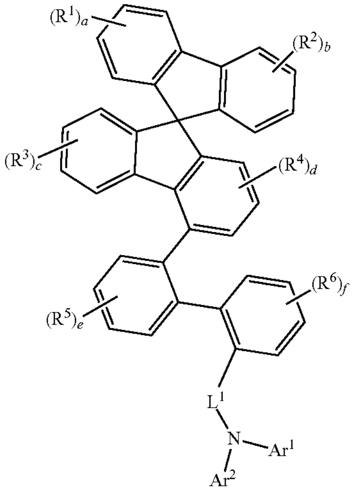

Wherein $R^1$, $R^2$, $R^3$, $R^4$, $R^5$, $R^6$, a, b, c, d, e, f, $L^1$, $Ar^1$ and $Ar^2$ are the same as defined above.

Also, Formula (1) is represented by any one of Formulas (5) to (7).

<Formula (5)>

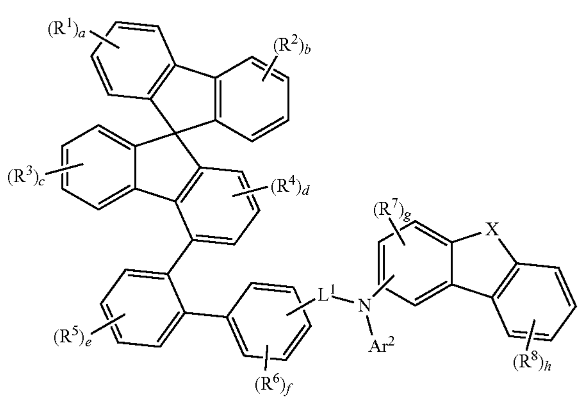

-continued

<Formula (6)>

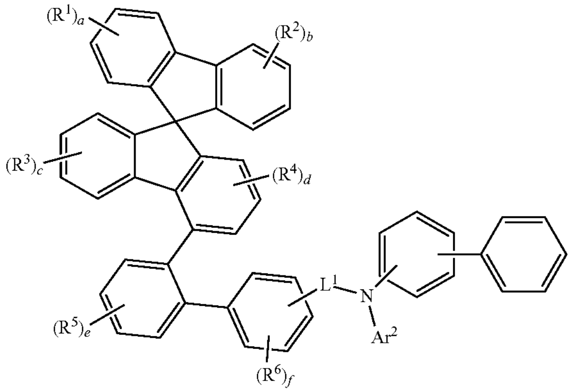

<Formula (7)>

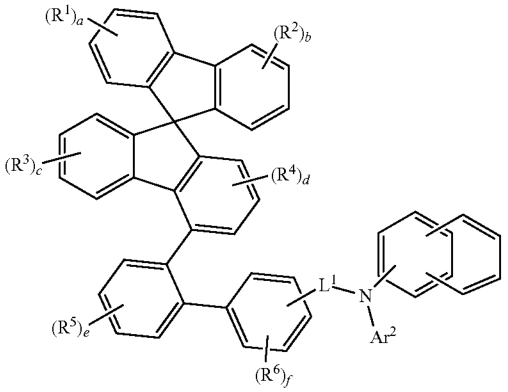

wherein, each symbol may be defined as follows.

1) $R^1$, $R^2$, $R^3$, $R^4$, $R^5$, $R^6$, a, b, c, d, e, f, $L^1$, and $Ar^2$ are the same as defined above.

2) $R^7$ and $R^8$ are selected from the group consisting of hydrogen; deuterium; tritium; halogen; cyano group; nitro group; $C_6$-$C_{60}$ aryl group; a fluorenyl group; a $C_2$-$C_{60}$ heterocyclic group including at least one heteroatom of O, N, S, Si or P; a fused ring group of a $C_3$-$C_{60}$ aliphatic ring and a $C_6$-$C_{60}$ aromatic ring; $C_1$-$C_{50}$ alkyl group; $C_2$-$C_{20}$ alkenyl group; $C_2$-$C_{20}$ alkynyl group; $C_1$-$C_{30}$ alkoxyl group; $C_6$-$C_{30}$ aryloxy group; and -L'-N($R_a$)($R_b$);

L', $R_a$ and $R_b$ are the same as defined above, adjacent plurality of $R^7$ or a plurality of $R^8$ may be bonded to each other to form a ring.

When $R^7$ and $R^8$ are an aryl group, it is preferably a $C_6$-$C_{36}$ aryl group, more preferably a $C_6$-$C_{25}$ aryl group, when $R^7$ and $R^8$ are a heterocyclic group, it is preferably a $C_2$-$C_{36}$ heterocyclic group, more preferably a $C_2$-$C_{24}$ heterocyclic group, when $R^7$ and $R^8$ are a fused ring group, it is preferably a fused ring group of a $C_6$-$C_{36}$ aliphatic ring and a $C_6$-$C_{36}$ aromatic ring, and more preferably a fused ring group of a $C_6$-$C_{24}$ aliphatic ring and a $C_6$-$C_{24}$ aromatic ring, when $R^7$ and $R^8$ are an alkyl group, it is preferably a $C_1$-$C_{36}$ alkyl group, and more preferably a $C_1$-$C_{24}$ alkyl group.

3) g is an integer from any one of 0 to 3, h is an integer from any one of 0 to 4

4) X is O, S NR' or CR'R"

5) wherein R' and R" are each independently selected from the group consisting of a $C_6$-$C_{60}$ aryl group; a fluorenyl group; a $C_3$-$C_{60}$ aliphatic ring; and a $C_2$-$C_{60}$ heterocyclic group including at least one heteroatom of O, N, S, Si or P;

In case R' and R" are an aryl group, it is preferably a $C_6$-$C_{36}$ aryl group, more preferably a $C_6$-$C_{25}$ aryl group, when R' and R" are an aliphatic ring, it is preferably a $C_3$-$C_{36}$ aliphatic ring, more preferably a $C_3$-$C_{24}$ aliphatic ring, In case R' and R" are a heterocyclic group, it is preferably a $C_2$-$C_{36}$ heterocyclic group including at least one heteroatom of O, N, S, Si or P; more preferably a $C_2$-$C_{24}$ heterocyclic group including at least one heteroatom of O, N, S, Si or P;

Also, Formula (1) is represented by Formulas (8) to (13)

<Formula 8>

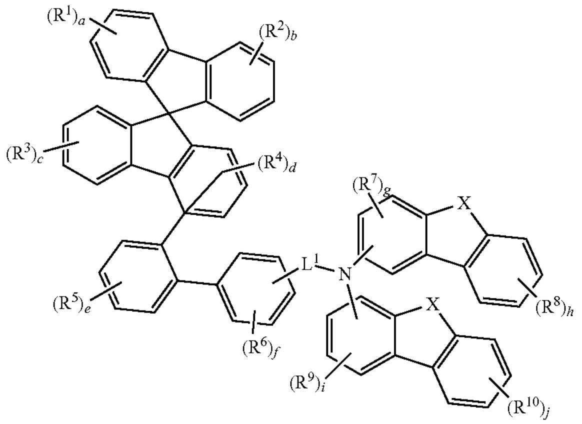

<Formula (9)>

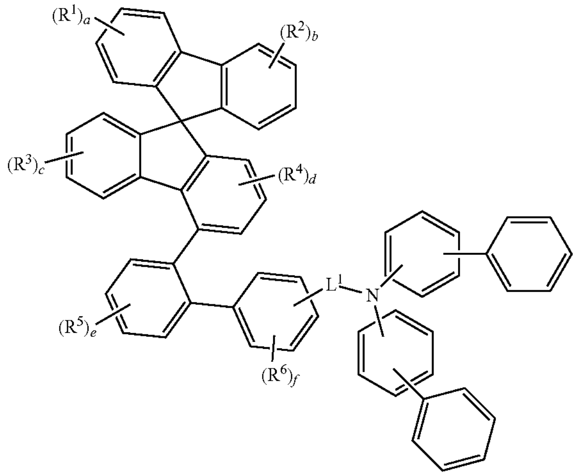

-continued

<Formula (10)>

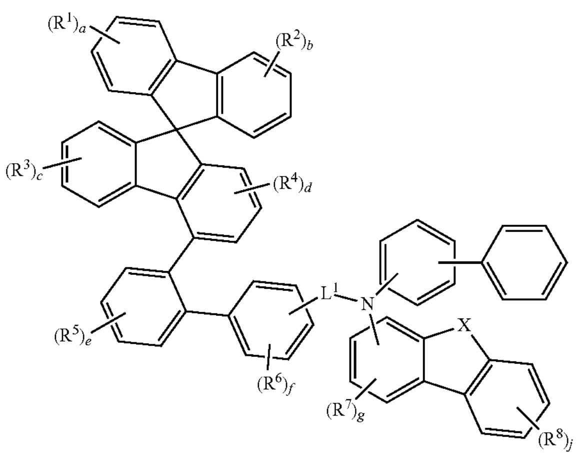

<Formula (11)>

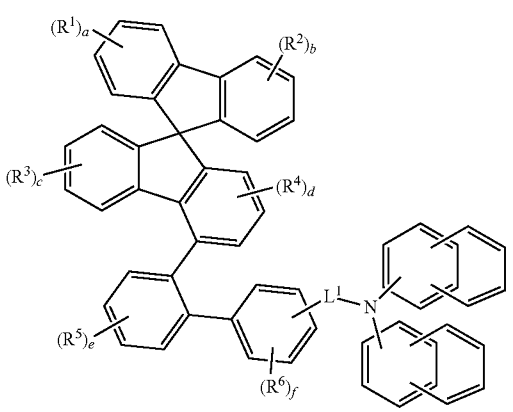

<Formula (12)>

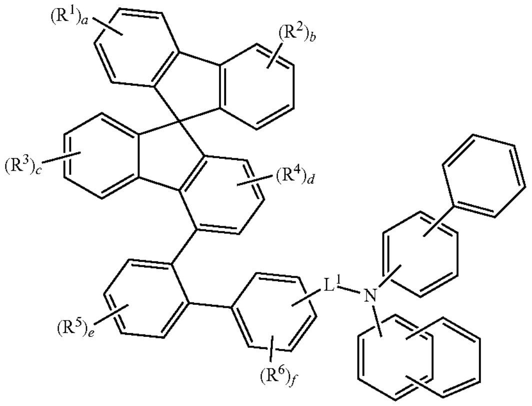

-continued

<Formula (13)>

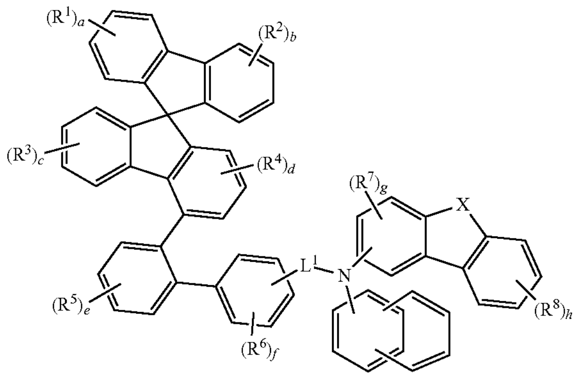

Wherein, each symbol may be defined as follows.

1) $R^1$, $R^2$, $R^3$, $R^4$, $R^5$, $R^6$, a, b, c, d, e, f and $L^1$ are the same as defined above.

2) $R^7$, $R^8$, $R^9$ and $R^{10}$ are selected from the group consisting of hydrogen; deuterium; tritium; halogen; cyano group; nitro group; $C_6$-$C_{60}$ aryl group; a fluorenyl group; a $C_2$-$C_{60}$ heterocyclic group including at least one heteroatom of O, N, S, Si or P; a fused ring group of a $C_3$-$C_{60}$ aliphatic ring and a $C_6$-$C_{60}$ aromatic ring; $C_1$-$C_{50}$ alkyl group; $C_2$-$C_{20}$ alkenyl group; $C_2$-$C_{20}$ alkynyl group; $C_1$-$C_{30}$ alkoxyl group; $C_6$-$C_{30}$ aryloxy group; and -L'-N($R_a$)($R_b$);

an adjacent plurality of $R^7$ or a plurality of $R^8$ or a plurality of $R^9$ or a plurality of $R^{10}$ may be bonded to each other to form a ring, L', $R_a$ and $R_b$ are the same as defined above.

In case $R^7$, $R^8$, $R^9$ and $R^{10}$ are an aryl group, it is preferably a $C_6$-$C_{36}$ aryl group, more preferably a $C_6$-$C_{25}$ aryl group, in case $R^7$, $R^8$, $R^9$ and $R^{10}$ are a heterocyclic group, it is preferably a $C_2$-$C_{36}$ heterocyclic group; more preferably a $C_2$-$C_{24}$ heterocyclic group; in case $R^7$, $R^8$, $R^9$ and $R^{10}$ are a fused ring group, it is preferably a fused ring group of a $C_6$-$C_{36}$ aliphatic ring and a $C_6$-$C_{36}$ aromatic ring, and more preferably a fused ring group of a $C_6$-$C_{24}$ aliphatic ring and a $C_6$-$C_{24}$ aromatic ring, in case $R^7$, $R^8$, $R^9$ and $R^{10}$ are an alkyl group, it is preferably a $C_1$-$C_{36}$ alkyl group, and more preferably a $C_1$-$C_{24}$ alkyl group.

3) g and i are each independently an integer of any one of 0 to 3, h and j are each independently an integer of any one of 0 to 4

4) X and Y are each independently O, S, NR' or CR'R"

5) wherein R' and R" are each independently selected from the group consisting of a $C_6$-$C_{60}$ aryl group; a fluorenyl group; a $C_3$-$C_{60}$ aliphatic ring; and a $C_2$-$C_{60}$ heterocyclic group including at least one heteroatom of O, N, S, Si or P;

In case R' and R" are an aryl group, it is preferably a $C_6$-$C_{36}$ aryl group, more preferably a $C_6$-$C_{25}$ aryl group, in case R' and R" are an aliphatic ring, it is preferably a $C_3$-$C_{36}$ aliphatic ring, more preferably a $C_3$-$C_{24}$ aliphatic ring, In case R' and R" are a heterocyclic group, it is preferably a $C_2$-$C_{36}$ heterocyclic group including at least one heteroatom of O, N, S, Si or P; more preferably a $C_2$-$C_{24}$ heterocyclic group including at least one heteroatom of O, N, S, Si or P;

Also, Formula (1) is represented by Formulas (14) to (16).

Formula (14)

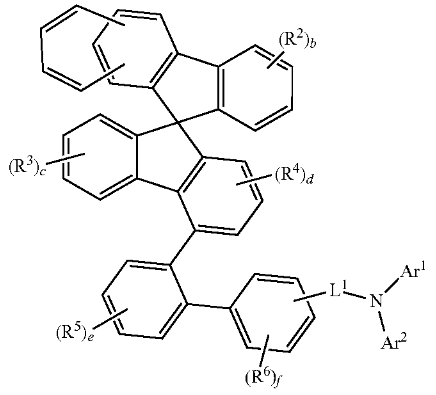

Formula (15)

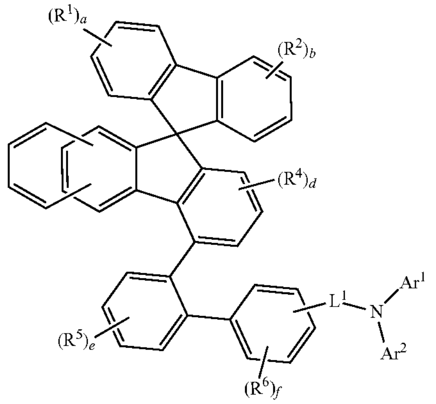

Formula (16)

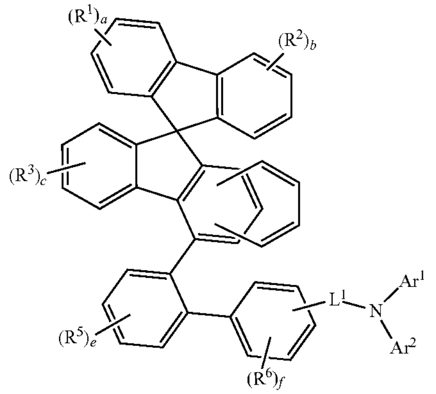

Wherein $R^1$, $R^2$, $R^3$, $R^4$, $R^5$, $R^6$, a, b, c, d, e, f, $L^1$, $Ar^1$ and $Ar^2$ are the same as defined above.

Specifically, the compound represented by Formula (1) provides the following compounds.

-continued
1-1
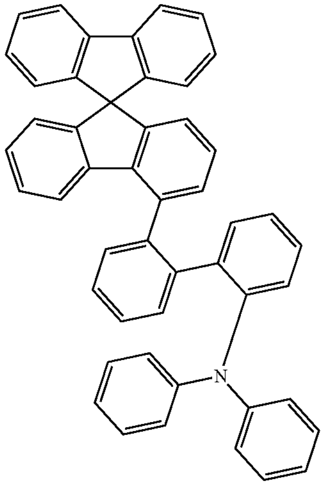
1-2
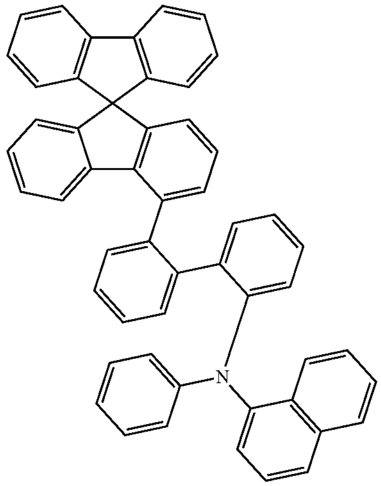
1-3
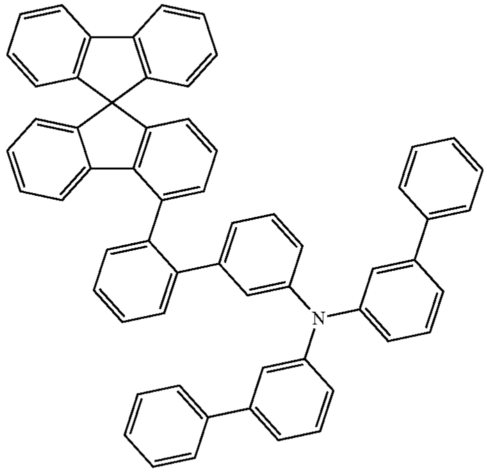
1-4
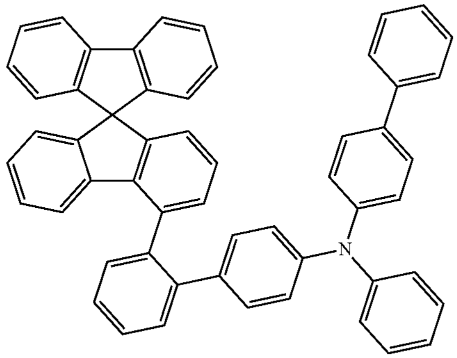
1-5
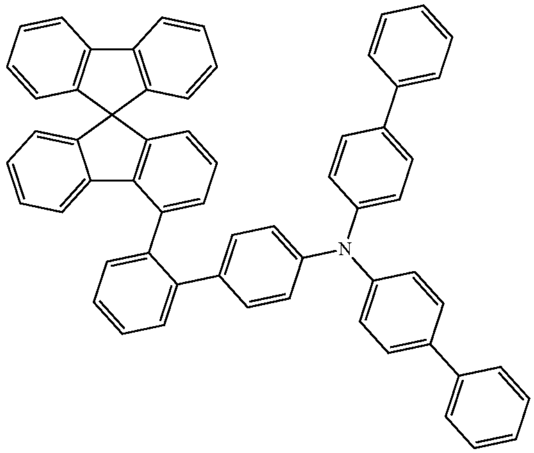
1-6
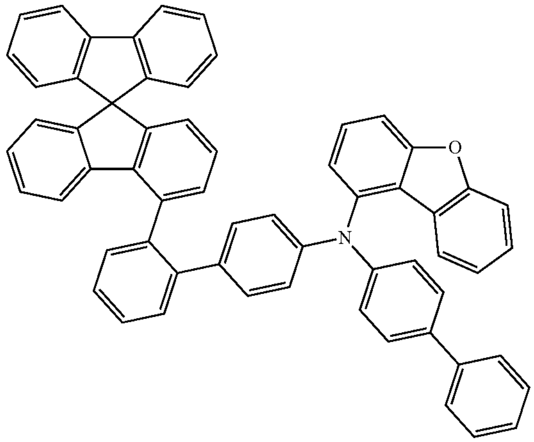

-continued
1-7
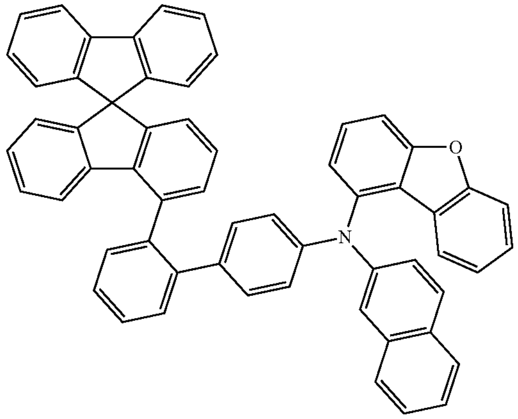
1-8
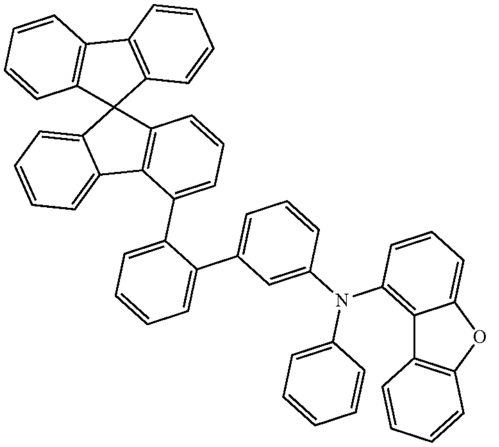
1-9
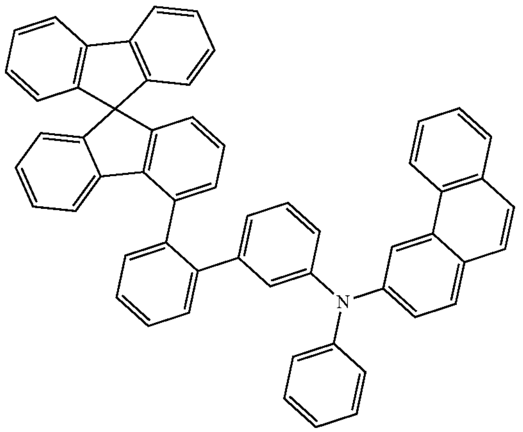
-continued
1-10
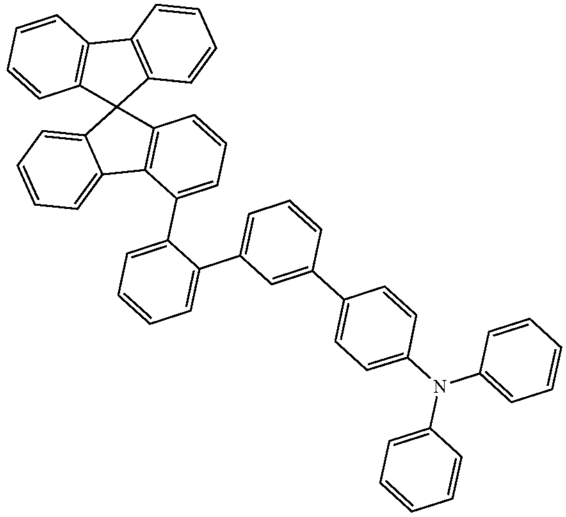
1-11
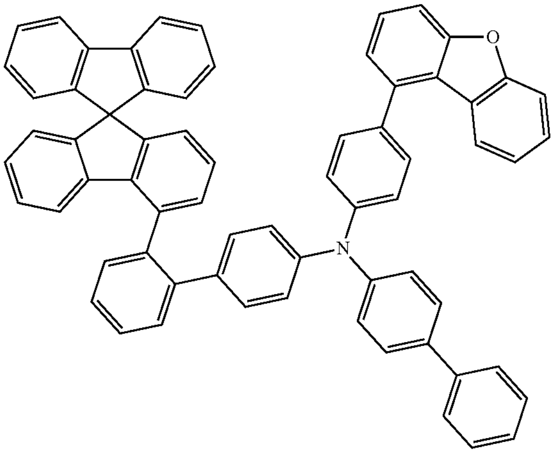
1-12
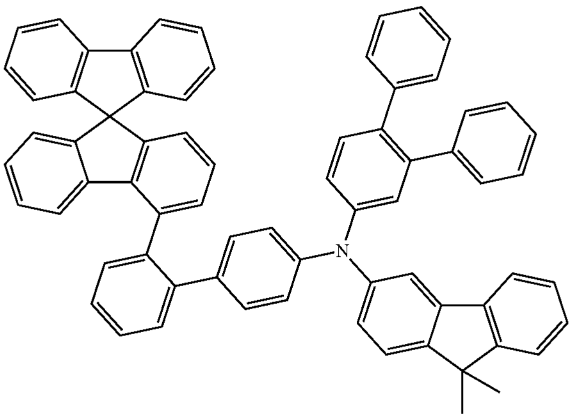

-continued
1-13
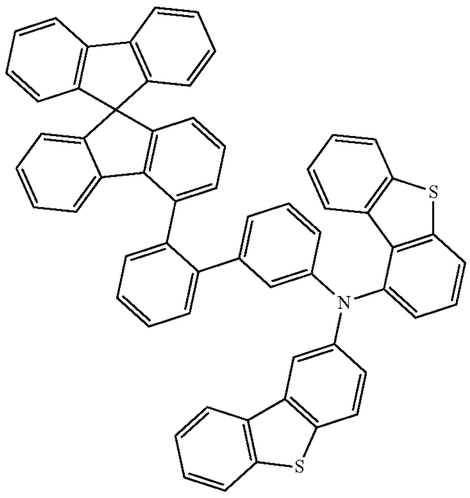
1-14
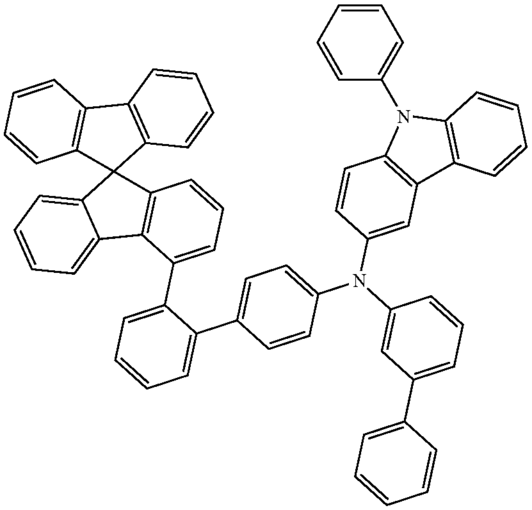
1-15
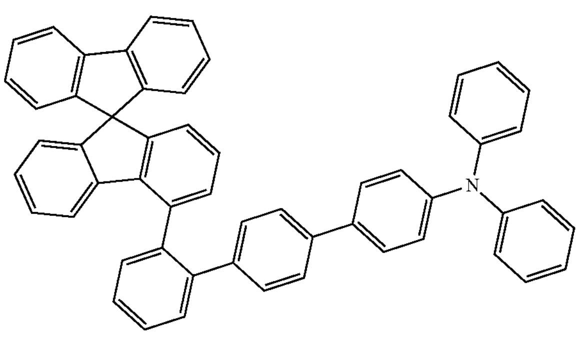
-continued
1-16
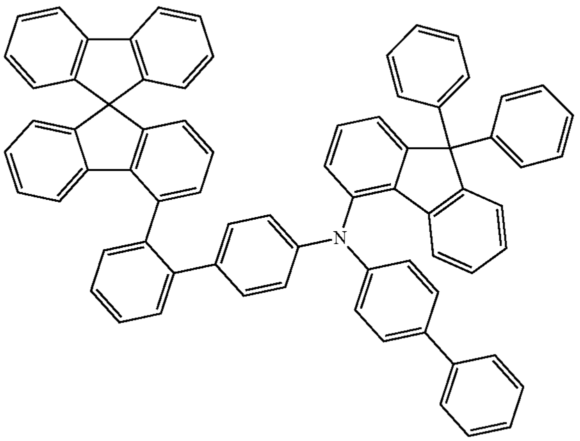
1-17
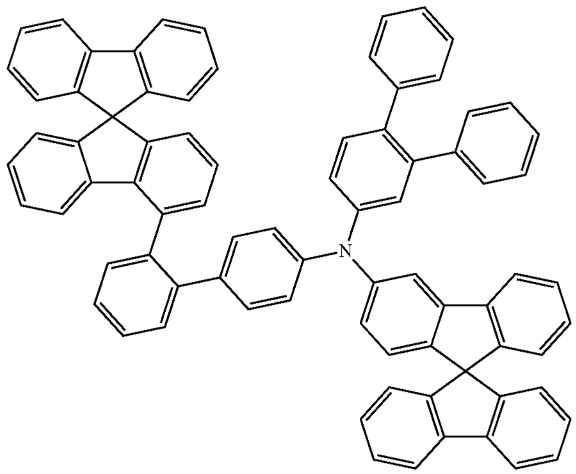
1-18
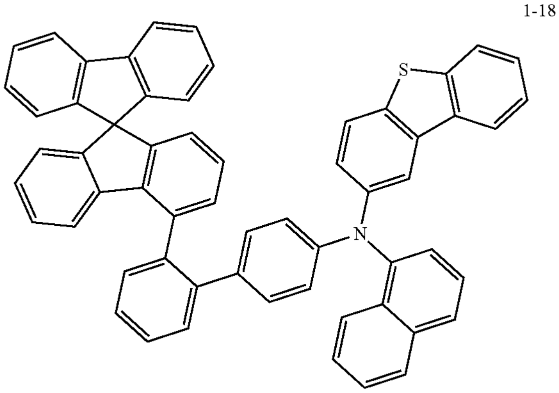

-continued
1-19
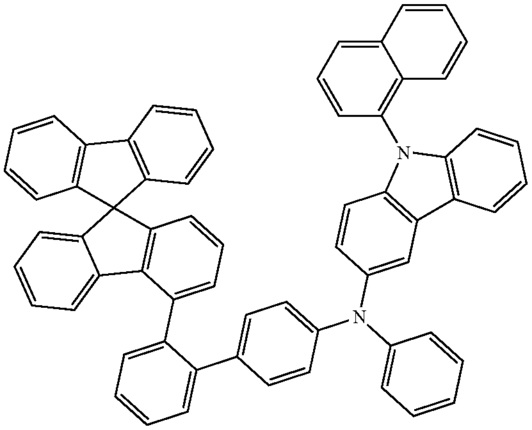
1-20
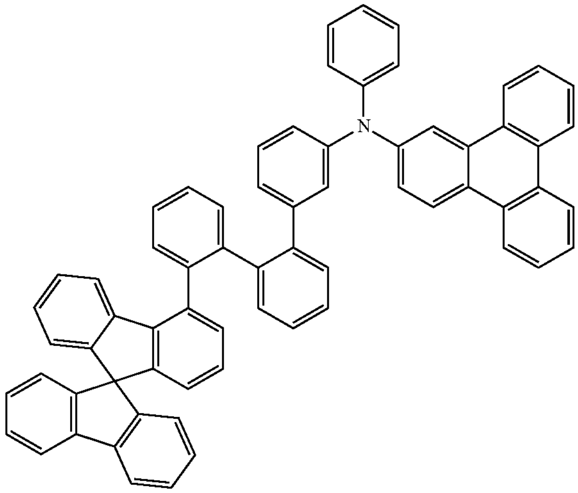
1-21
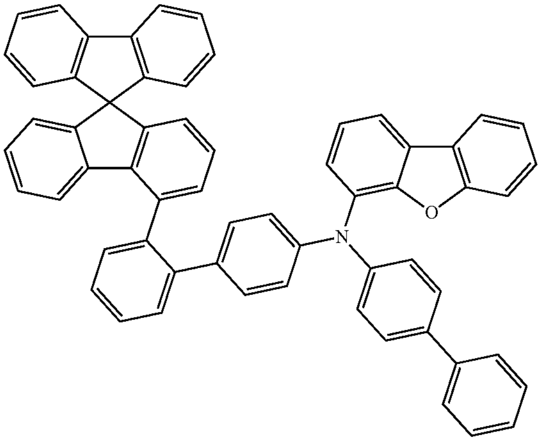
-continued
1-22
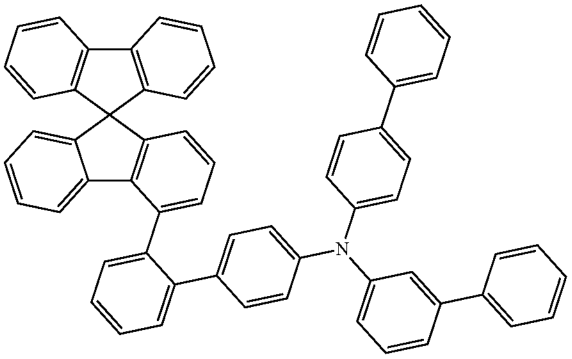
1-23
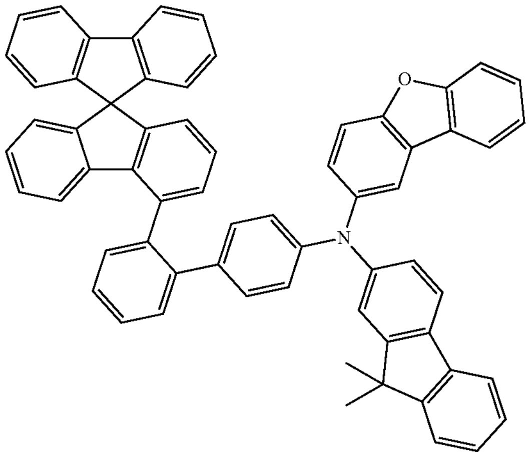
1-24
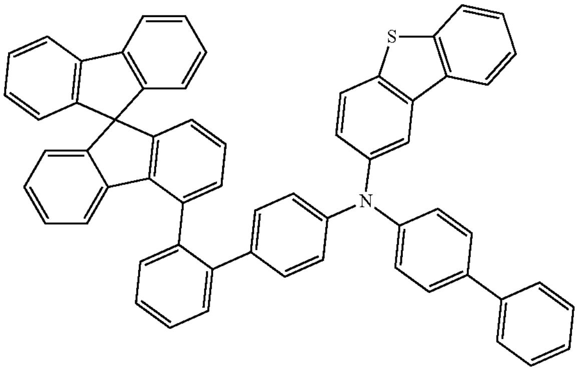

1-25
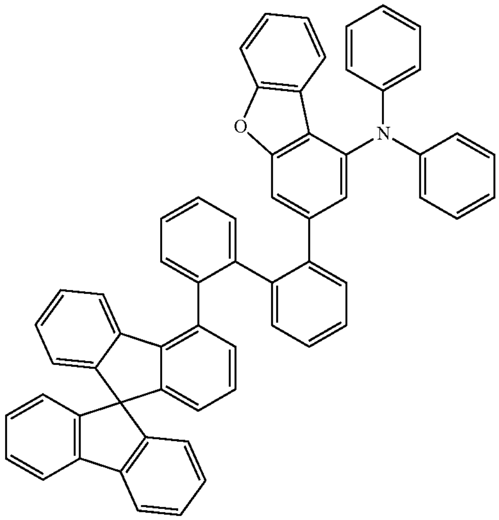
1-26
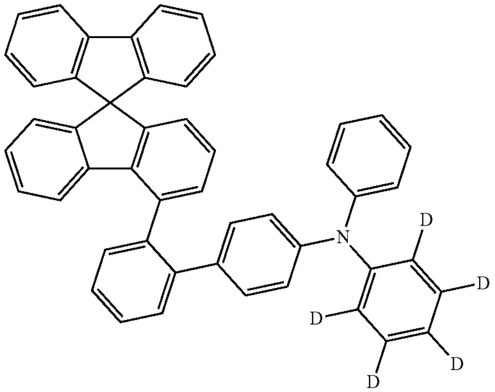
1-27
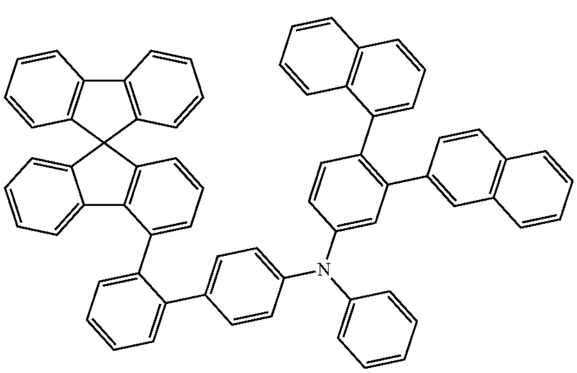
1-28
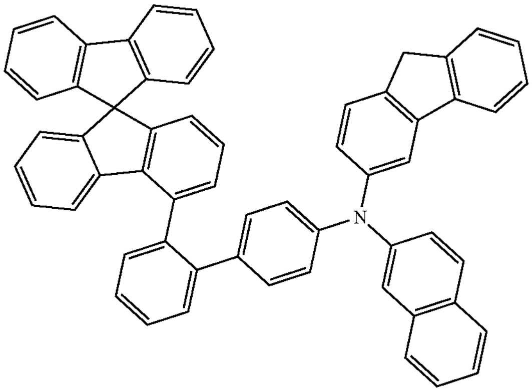
1-29
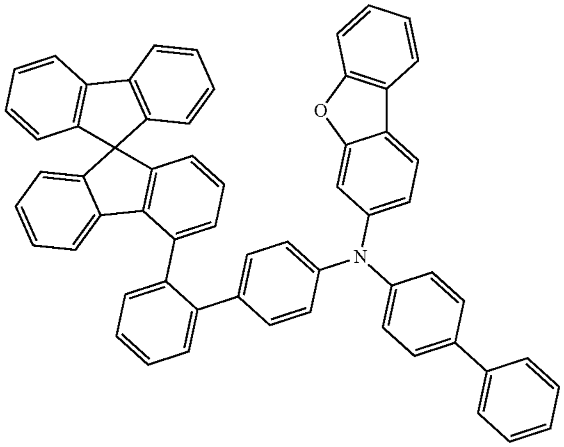
1-30
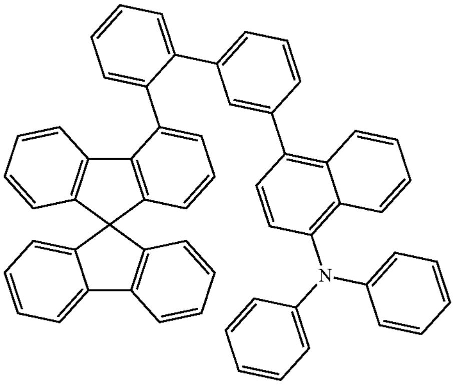

-continued
1-31
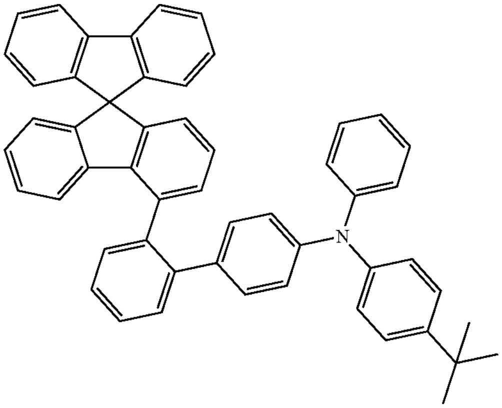
1-32
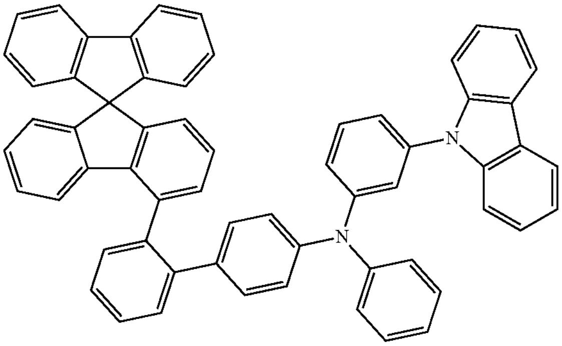
1-33
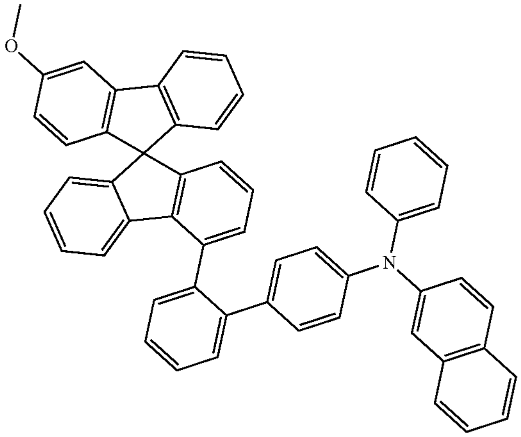
1-34
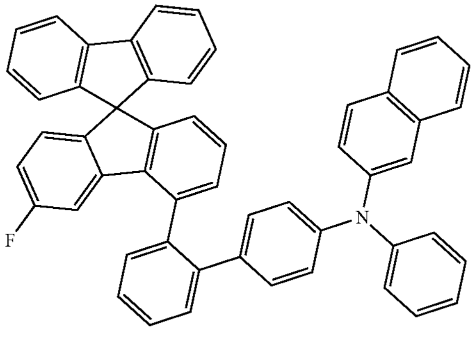
-continued
1-35
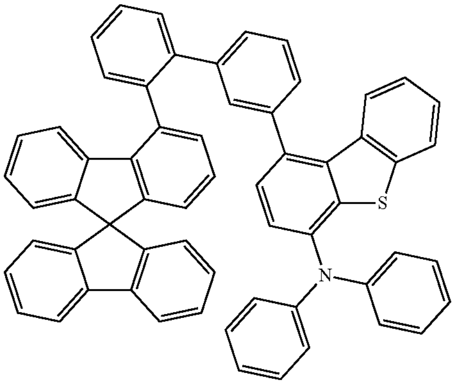
1-36
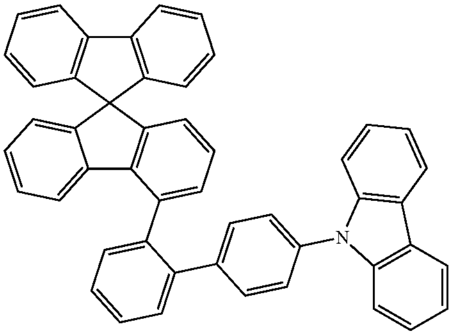
1-37
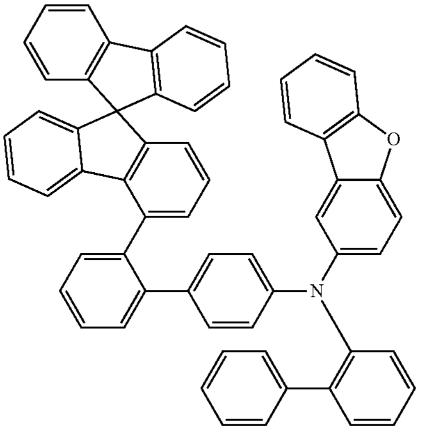
1-38
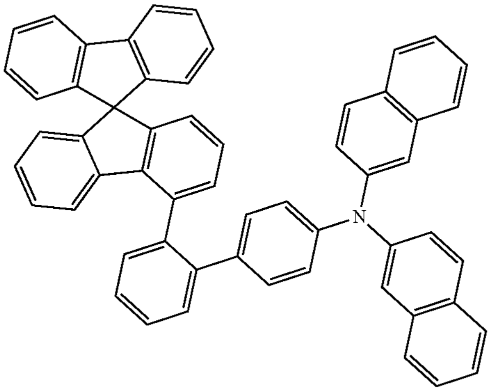

-continued
1-39
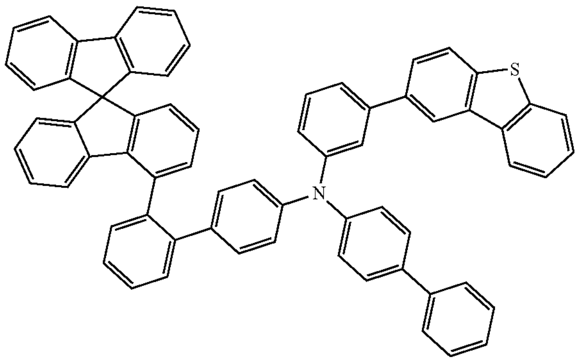
1-40
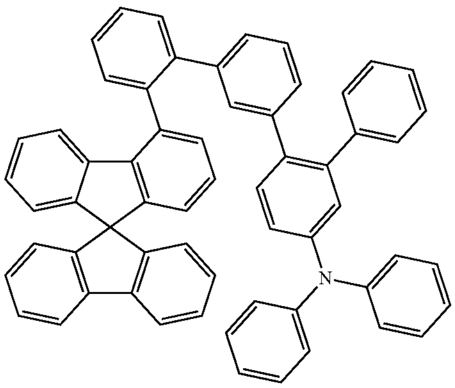
1-41
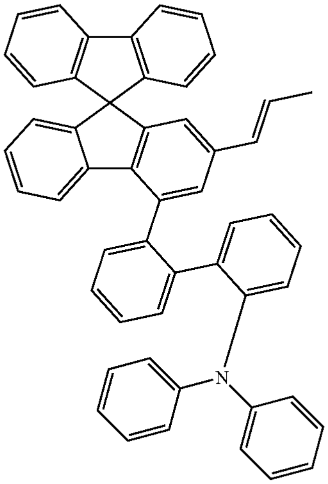
-continued
1-42
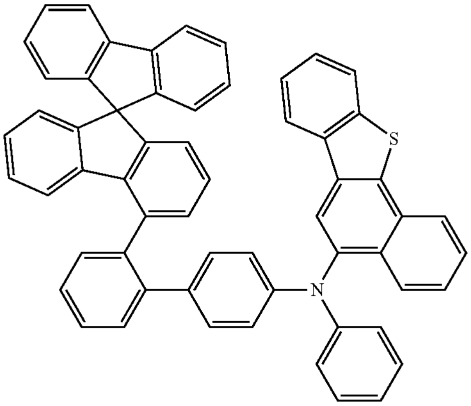
1-43
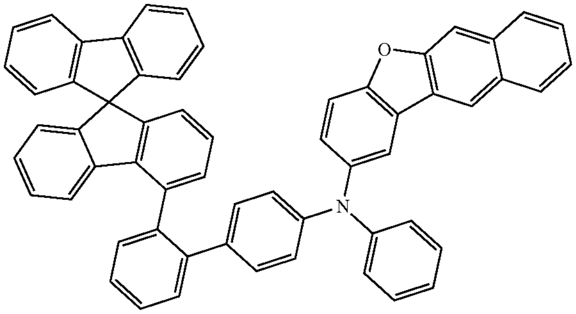
1-44
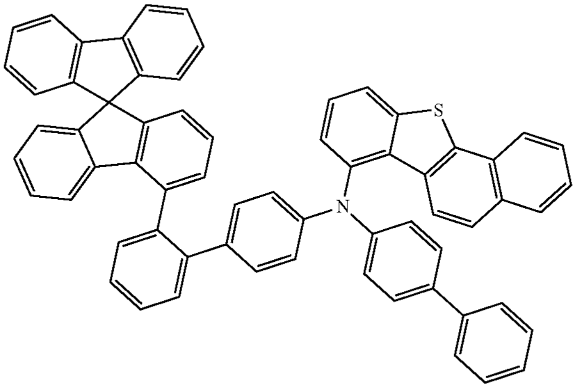
1-45
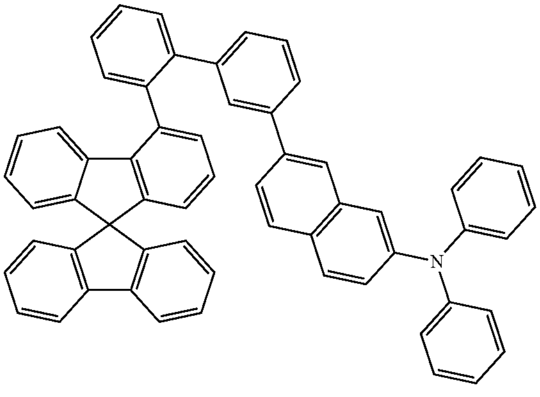

-continued
1-46
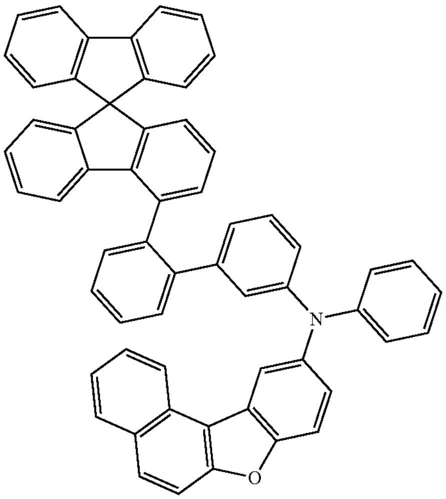
1-47
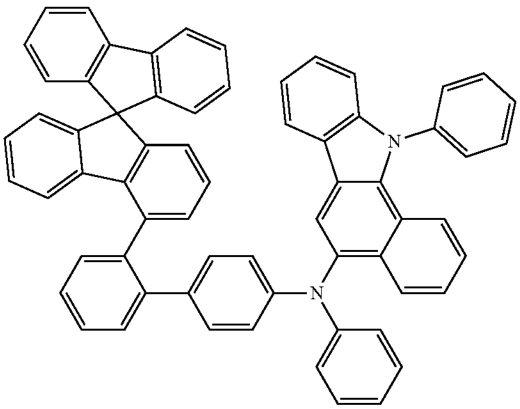
1-48
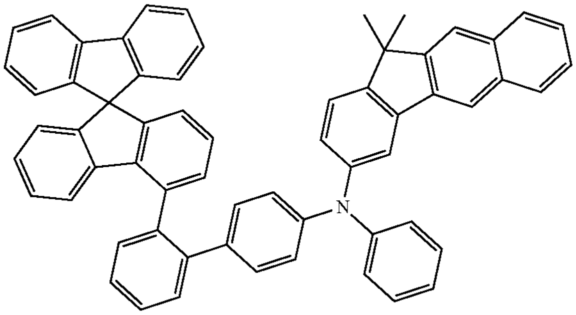
1-49
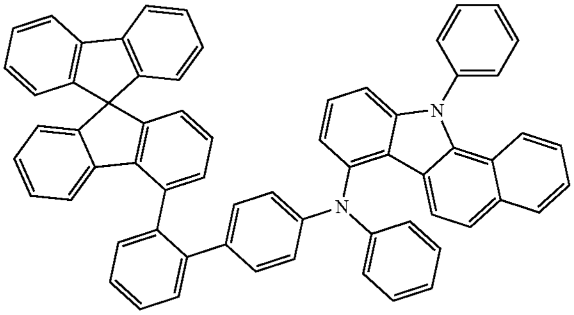
-continued
1-50
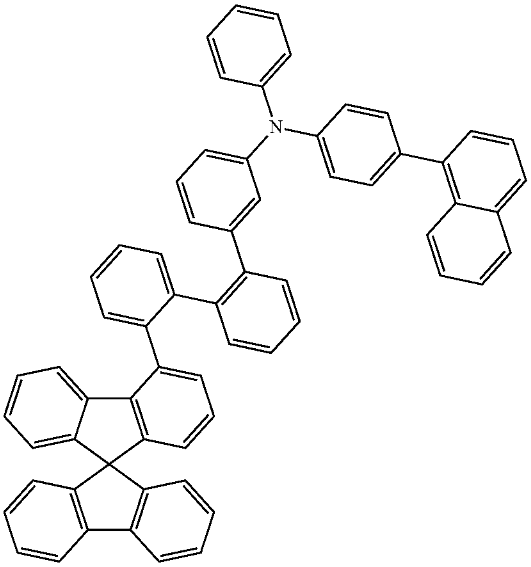
1-51
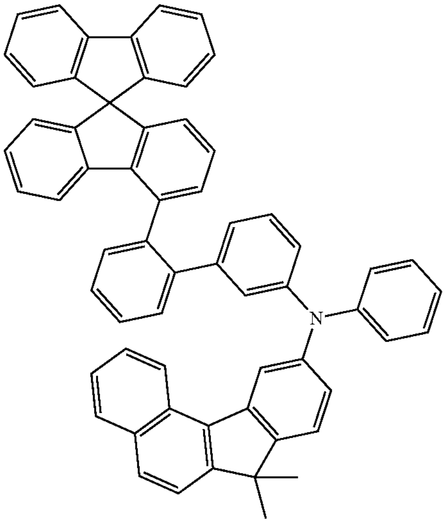
1-52
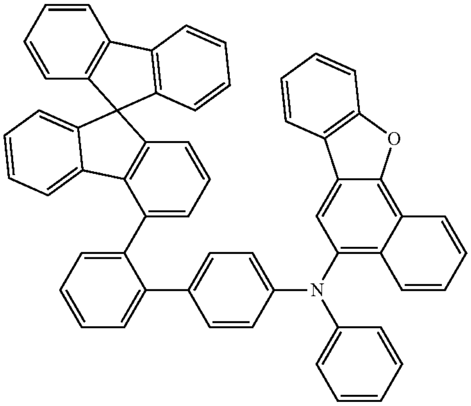

1-53
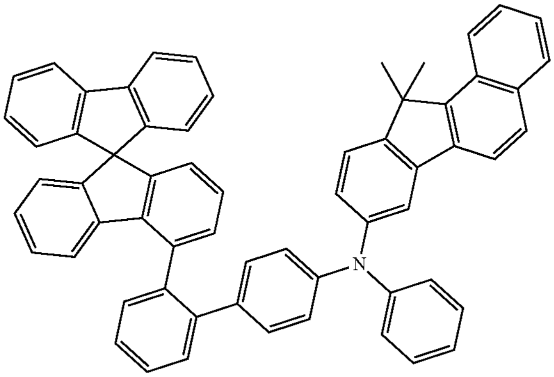
1-54
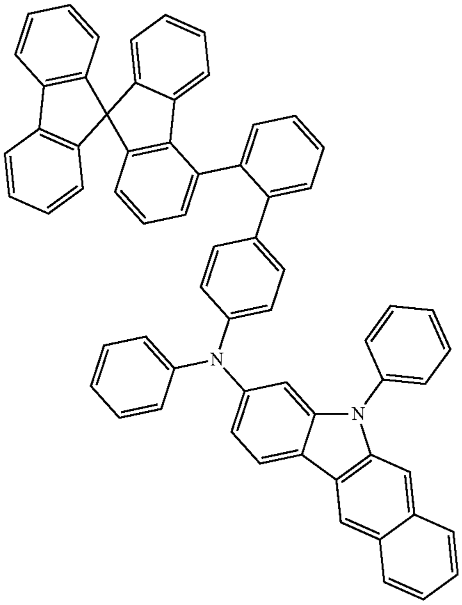
1-55
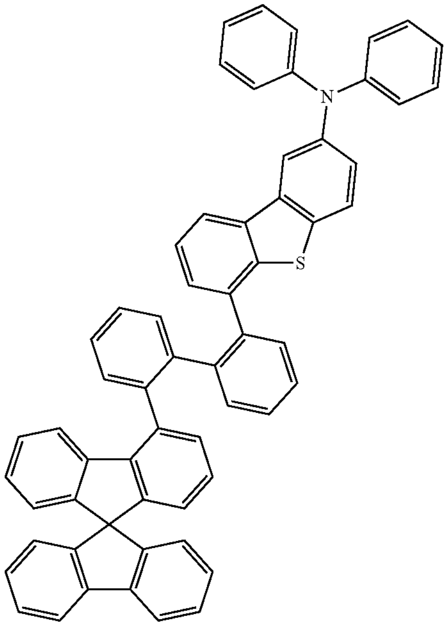
1-56
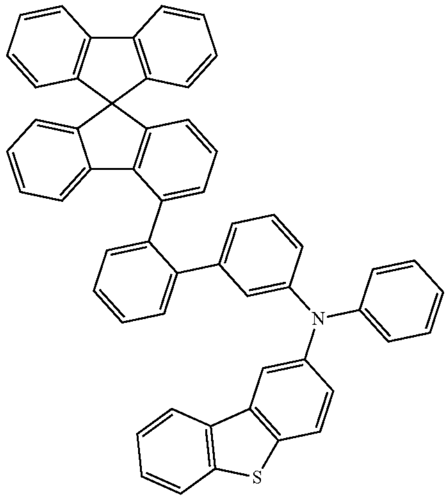
1-57
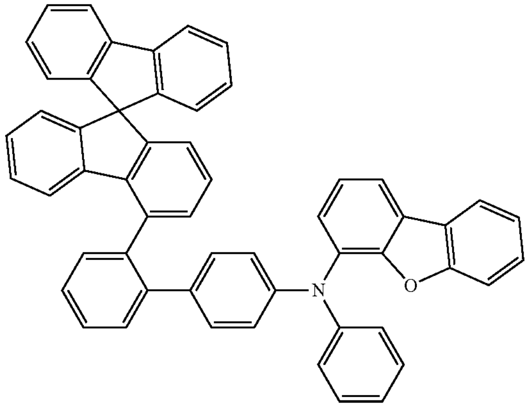
1-58
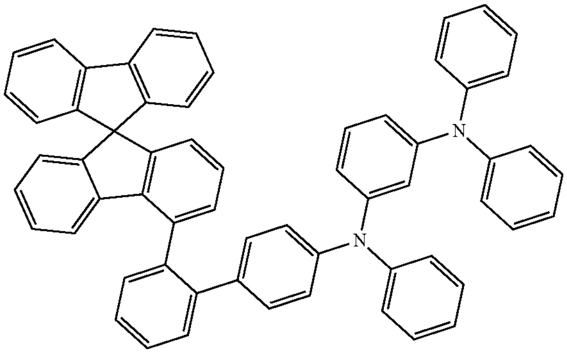

-continued
1-59
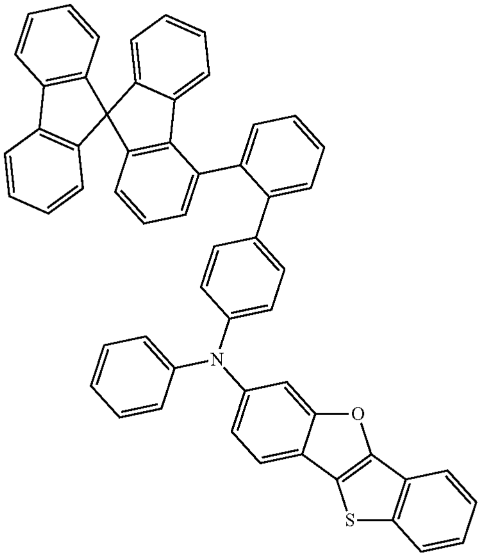
1-60
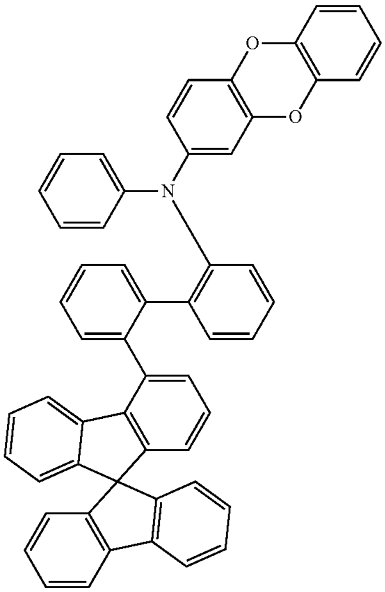
-continued
1-61
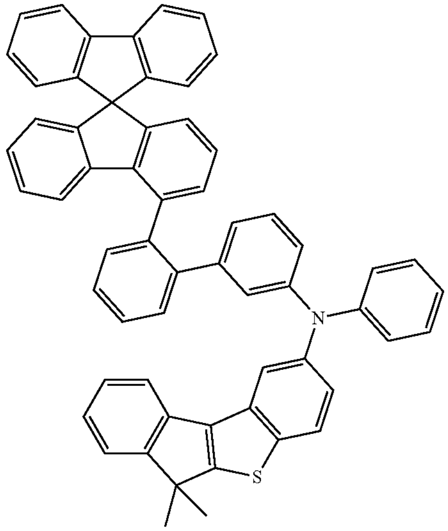
1-62
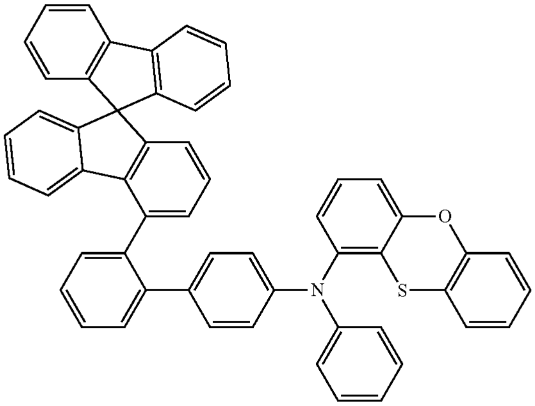
1-63
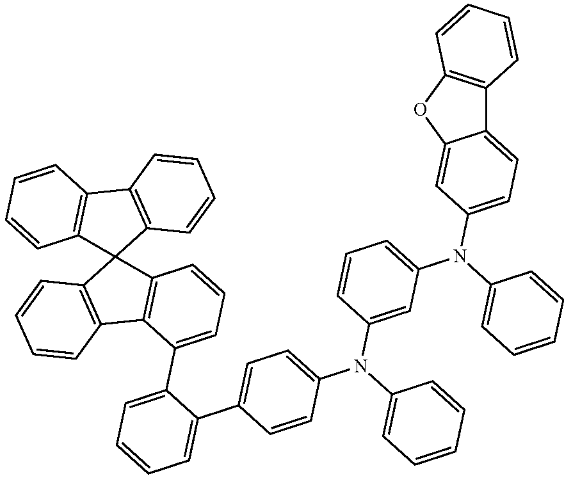

-continued
1-64
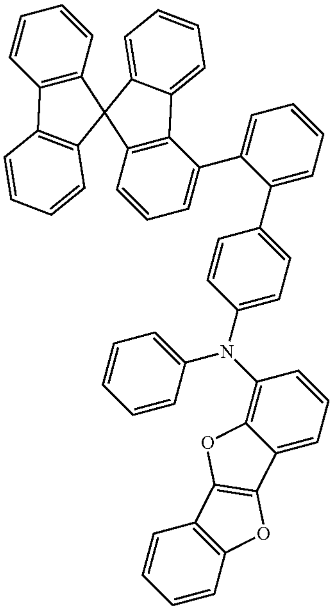
1-65
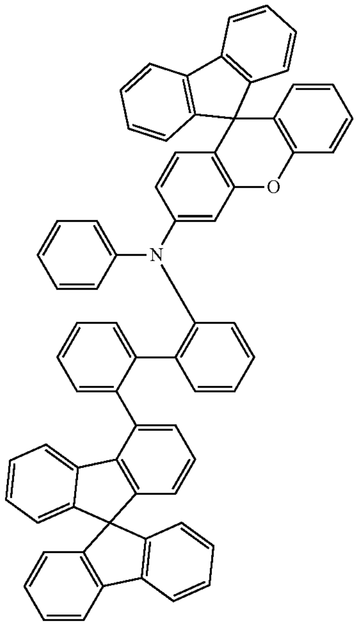
-continued
1-66
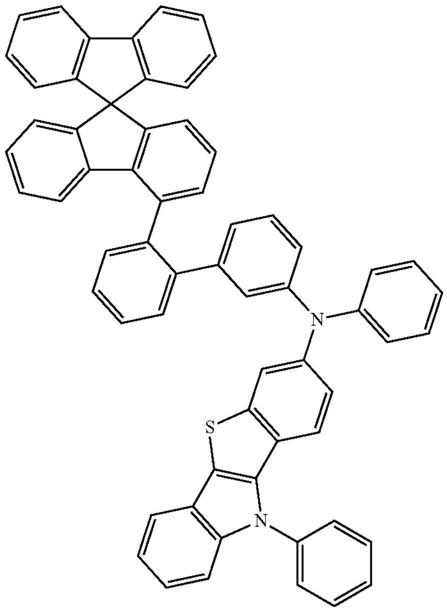
1-67
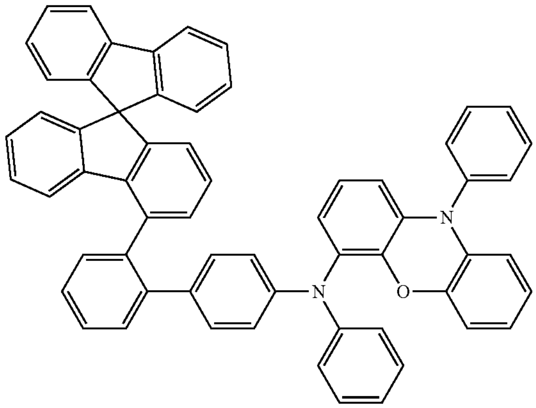
1-68
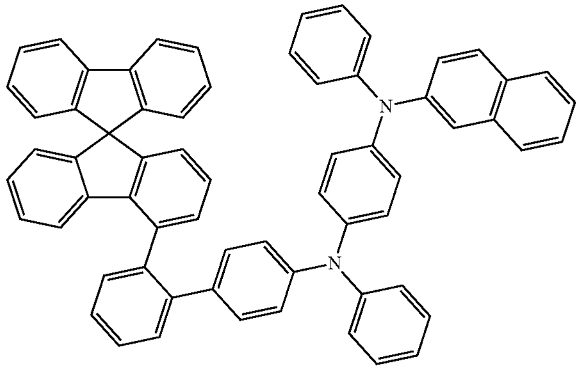

-continued
1-69
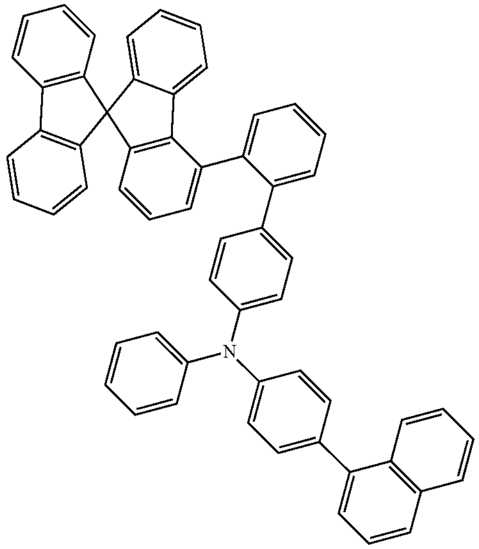
1-70
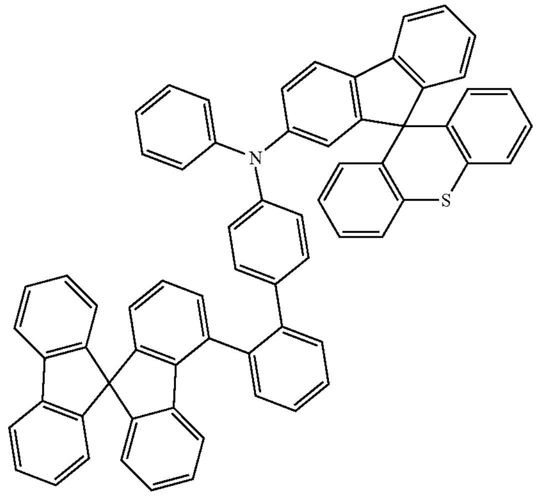
1-71
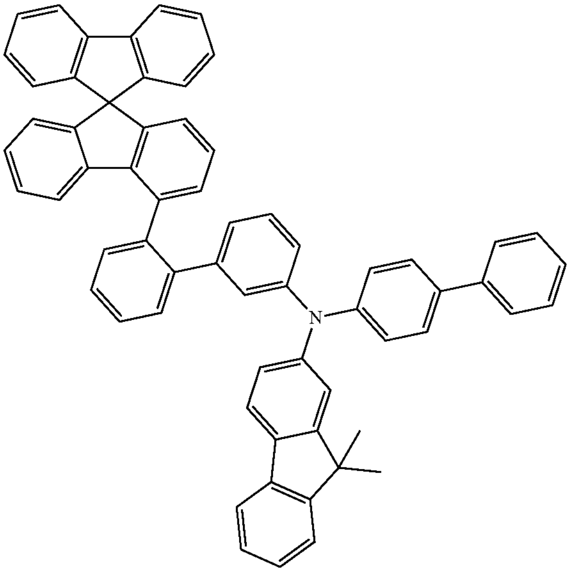
-continued
1-72
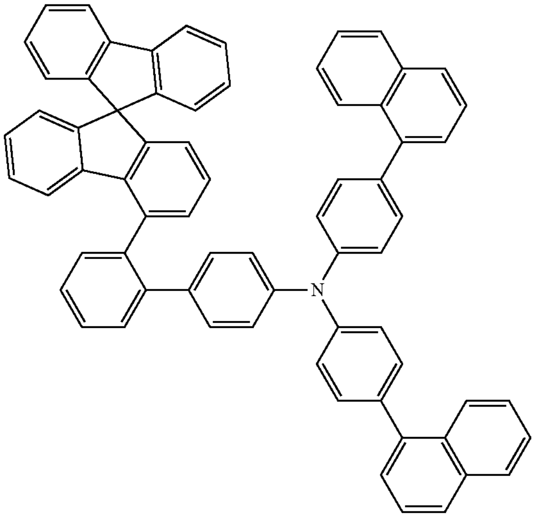
1-73
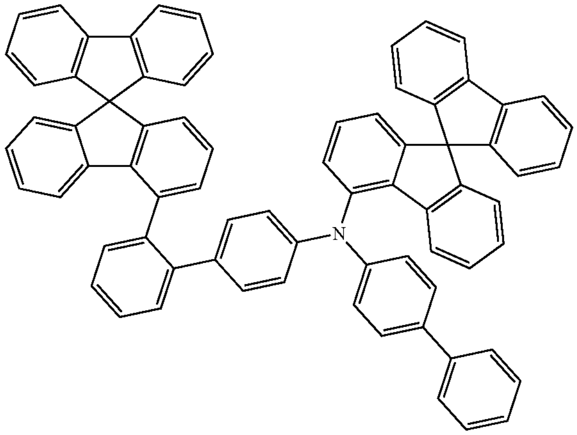
1-74
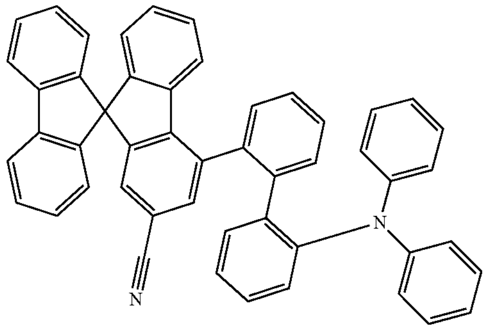

-continued
1-75
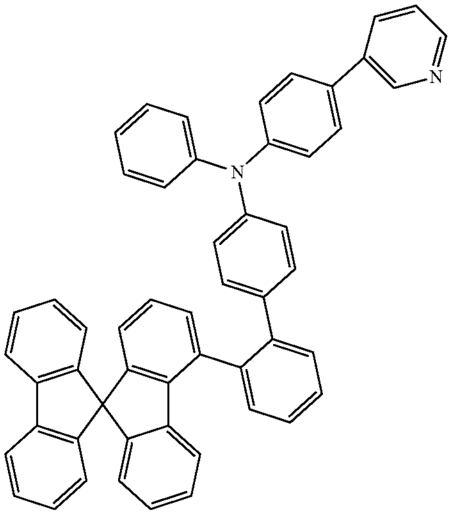
1-76
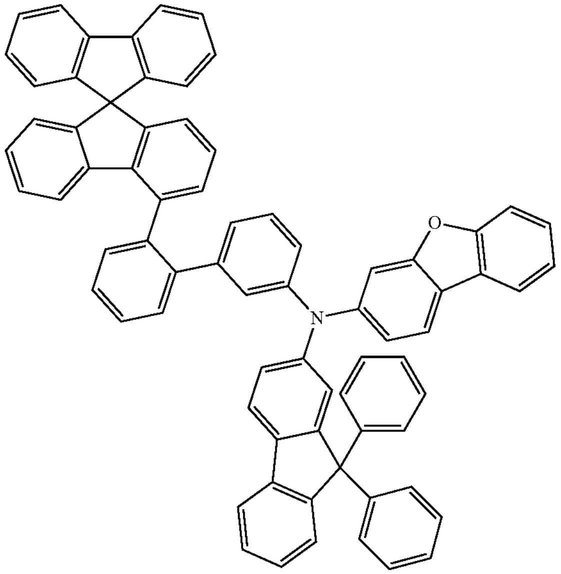
1-77
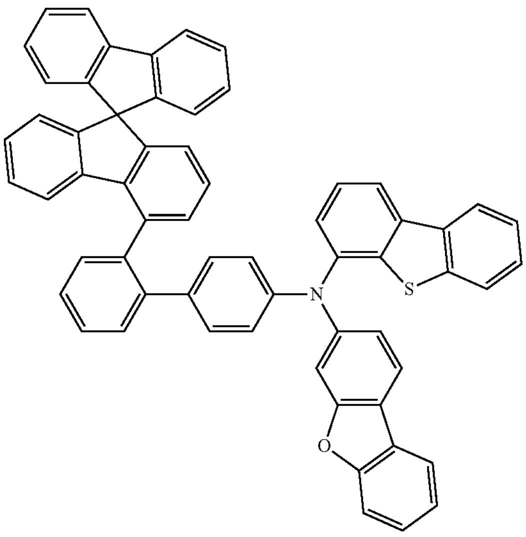
-continued
1-78
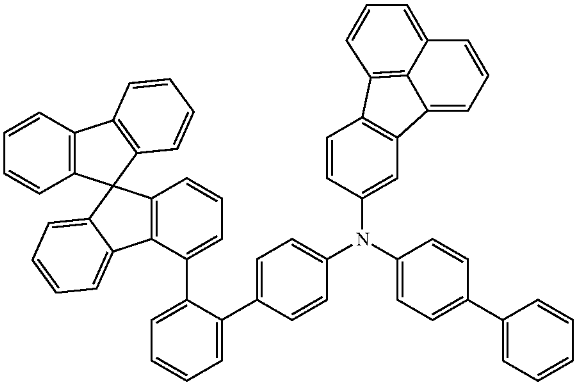
1-79
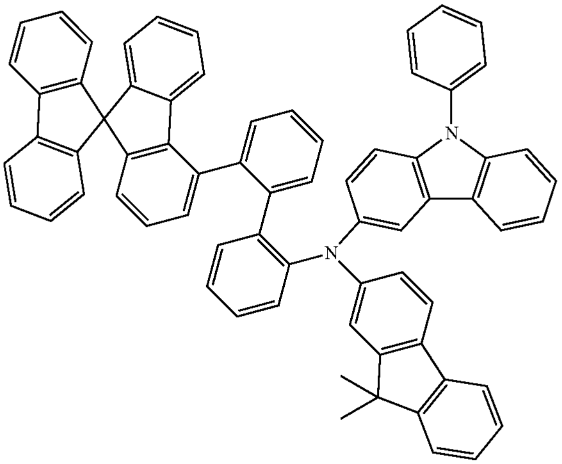
1-80
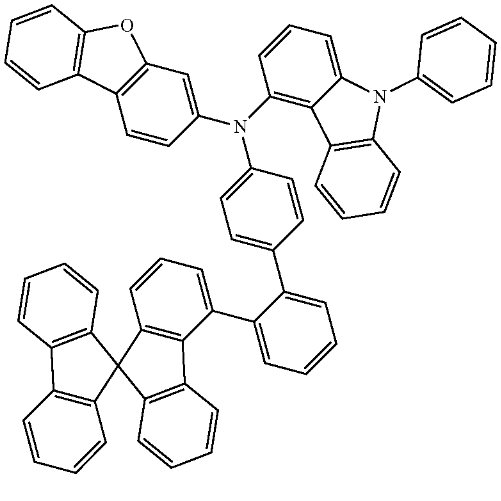

-continued
1-81
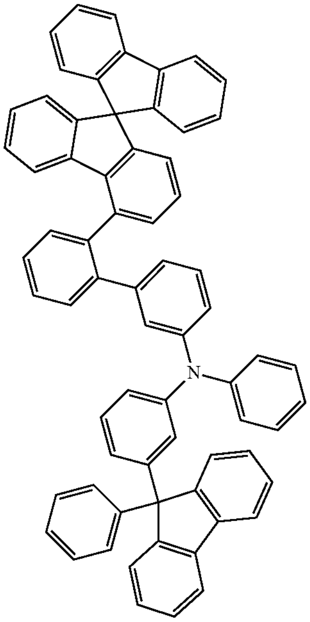
1-82
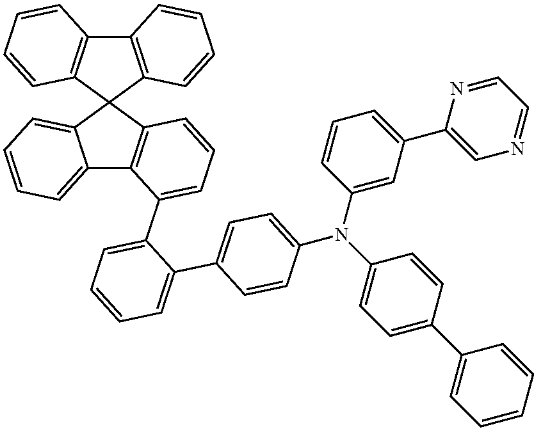
1-83
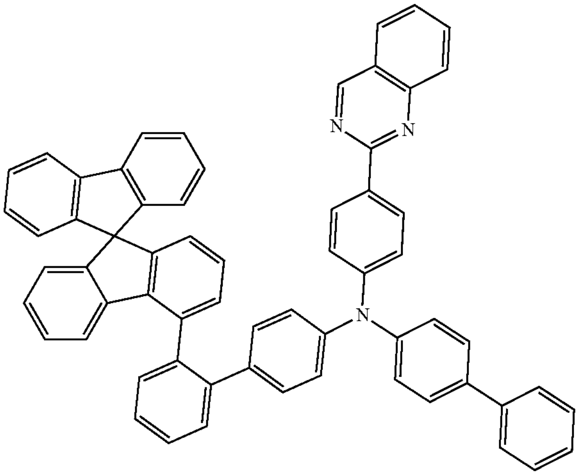
-continued
1-84
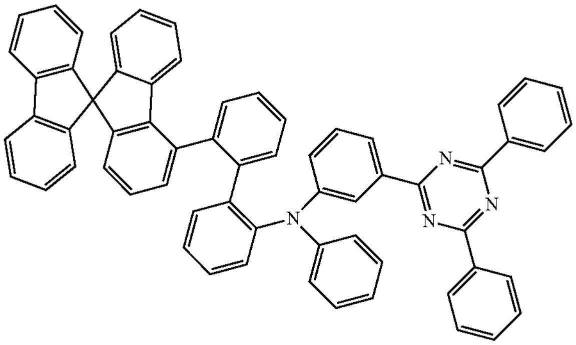
1-85
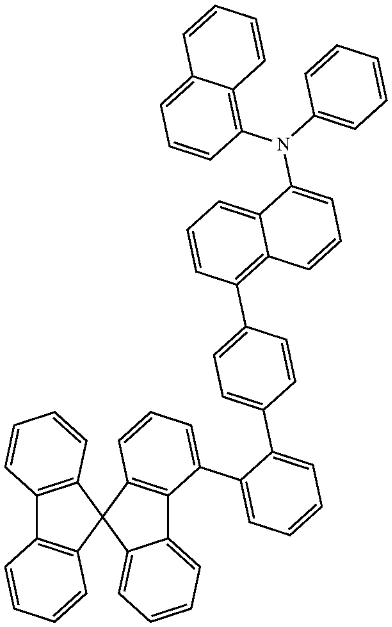
1-86
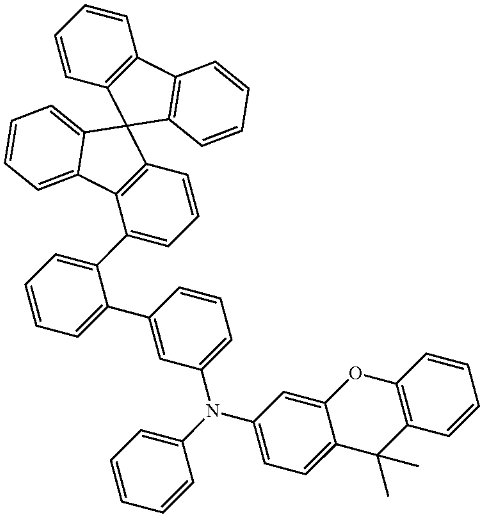

-continued
1-87
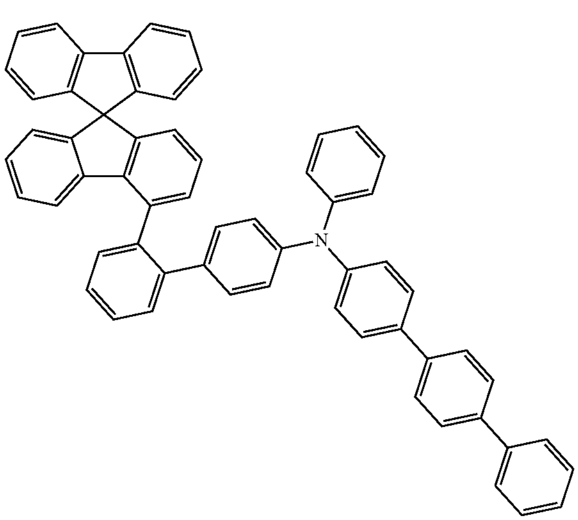
1-88
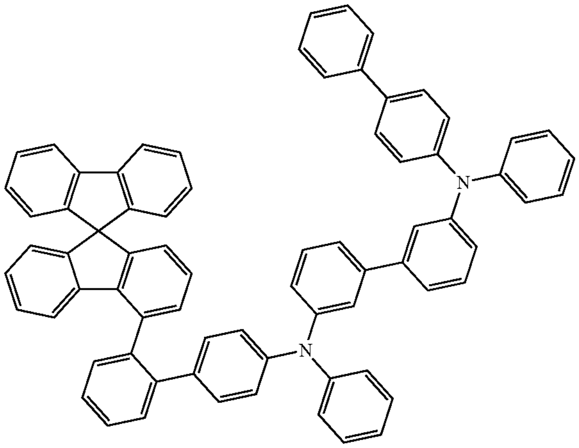
1-89
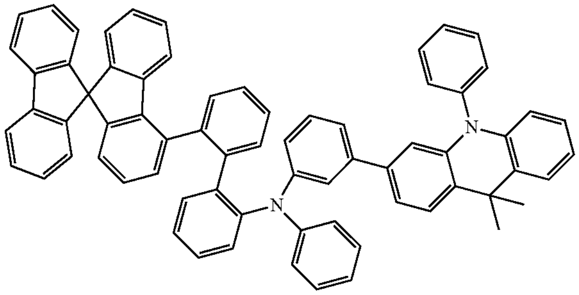
-continued
1-90
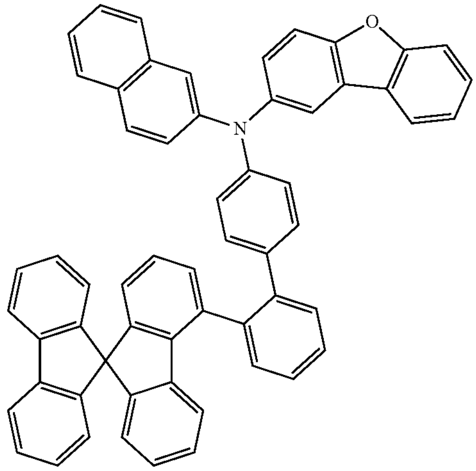
1-91
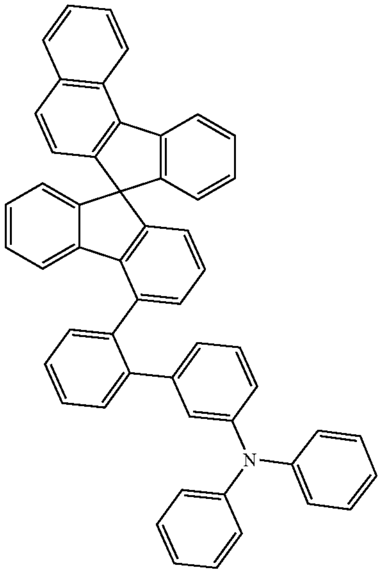
1-92
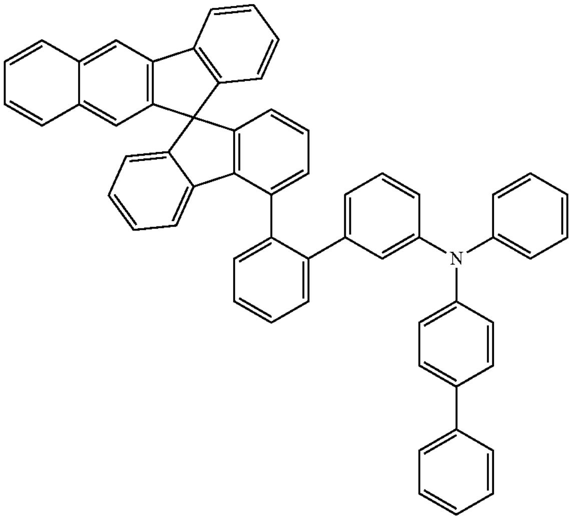

-continued
1-93
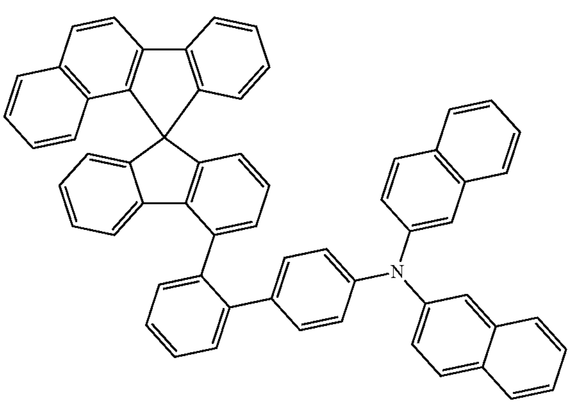
1-94
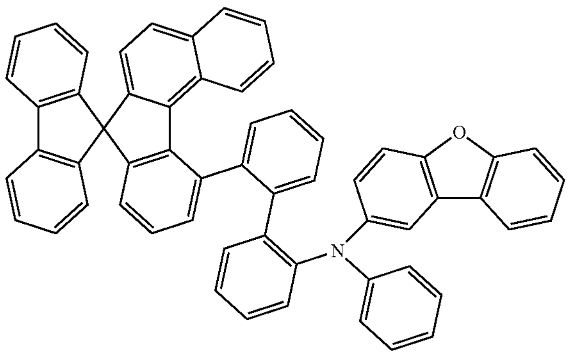
1-95
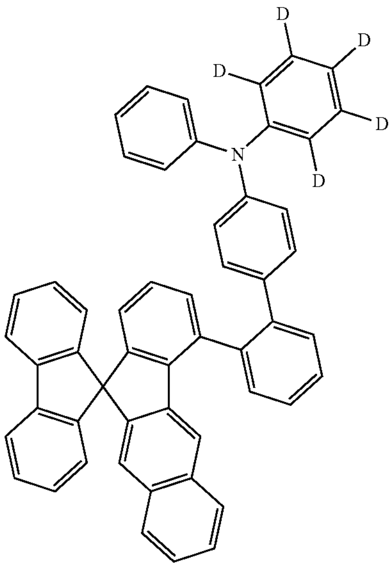
-continued
1-96
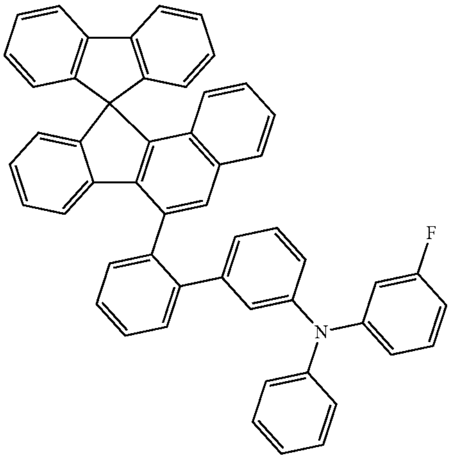
1-97
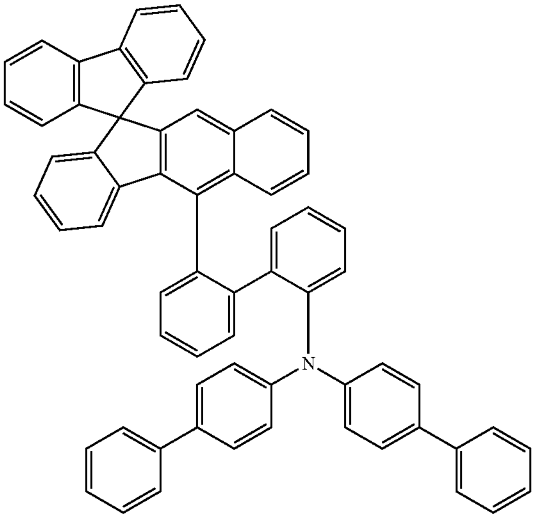
1-98
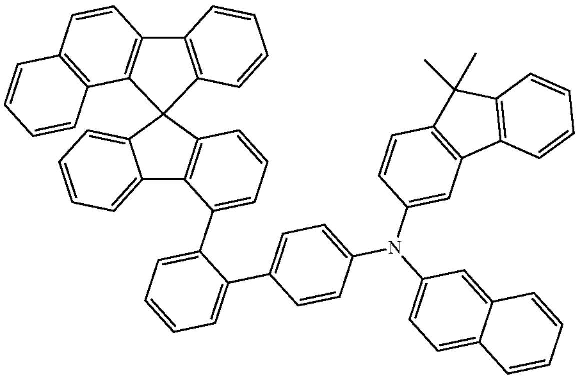

-continued
1-99
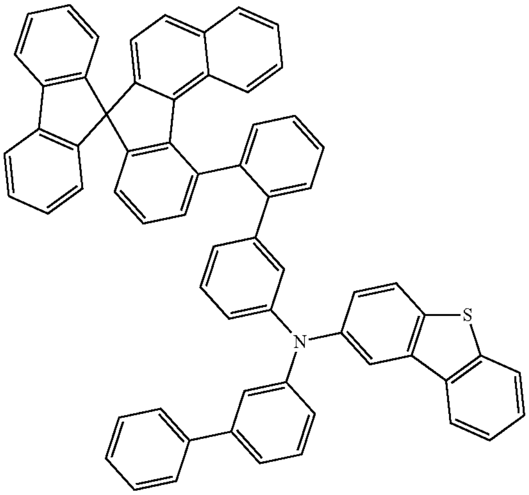
1-100
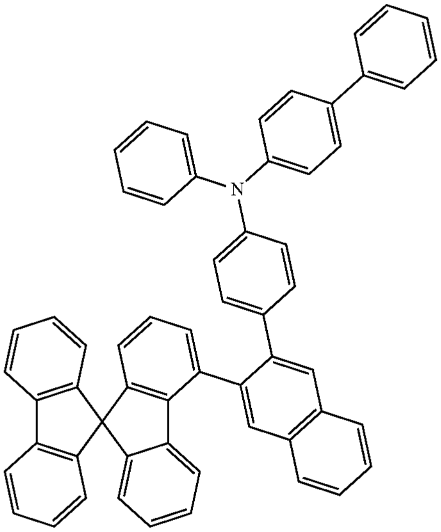
1-101
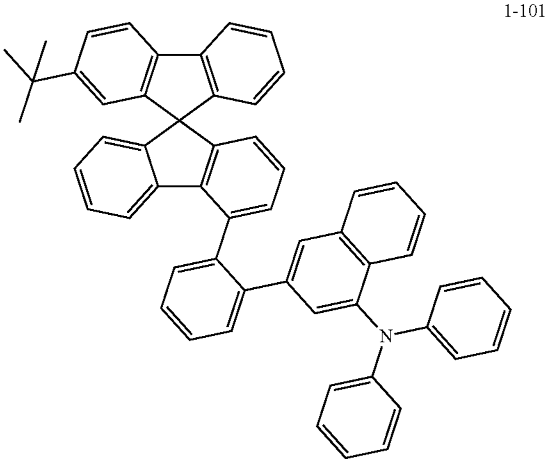
-continued
1-102
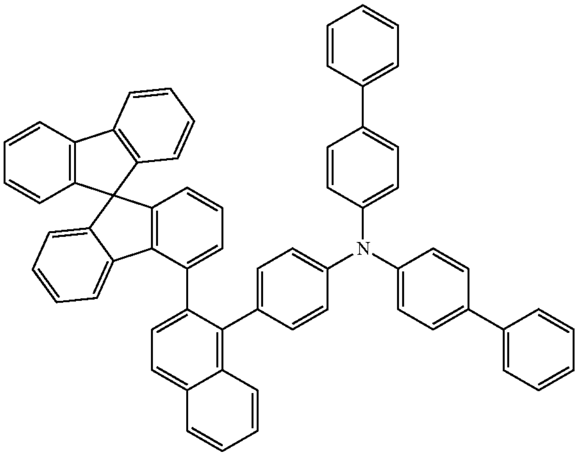
1-103
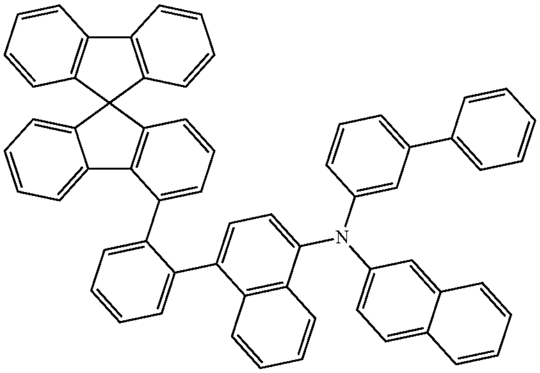
1-104
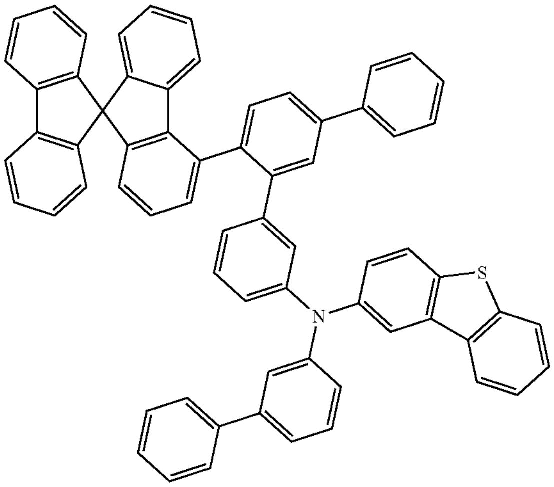

-continued
1-105
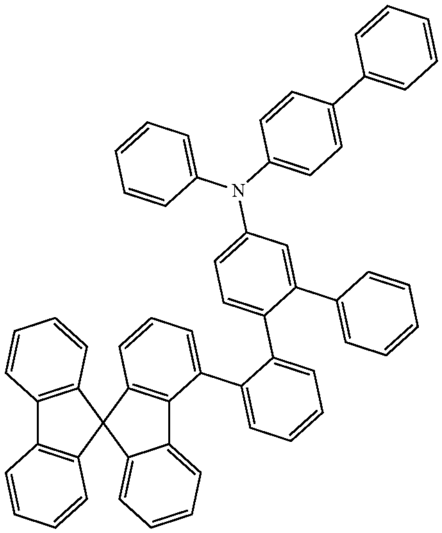
1-106
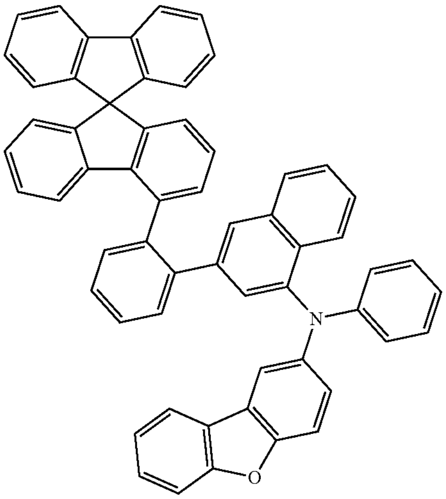
1-107
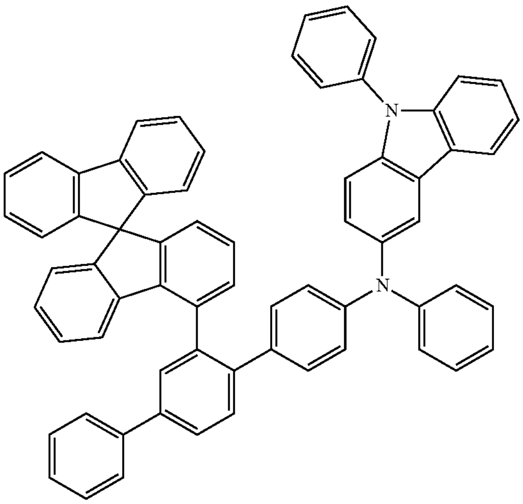
-continued
1-108
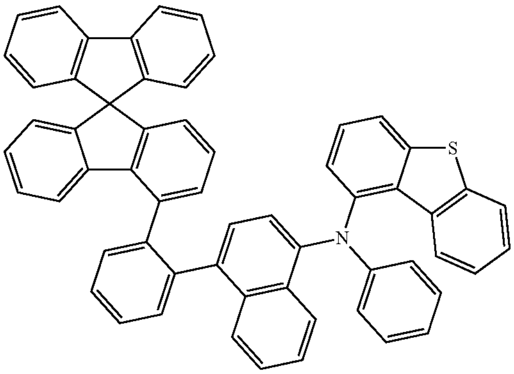
1-109
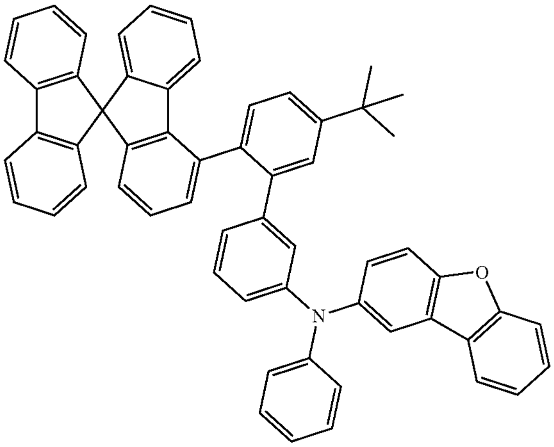
1-110
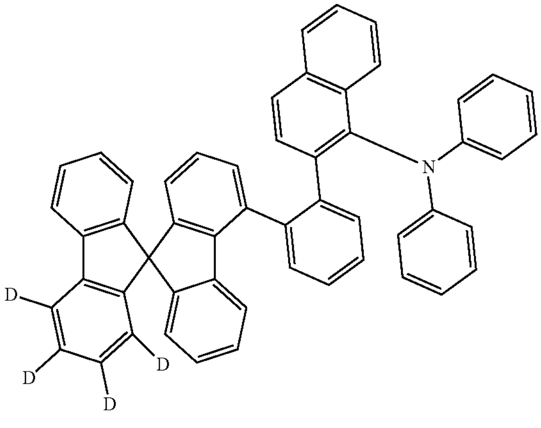

-continued 1-111

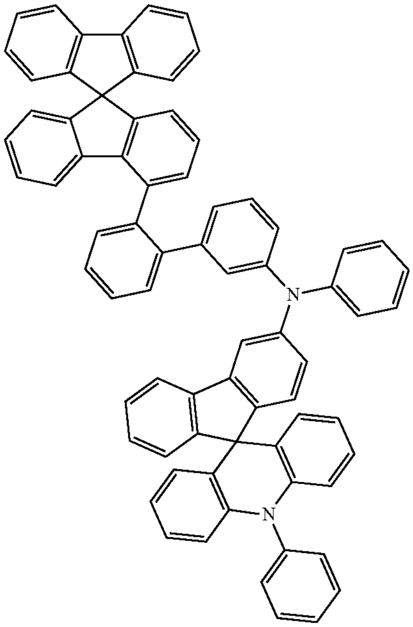

1-112

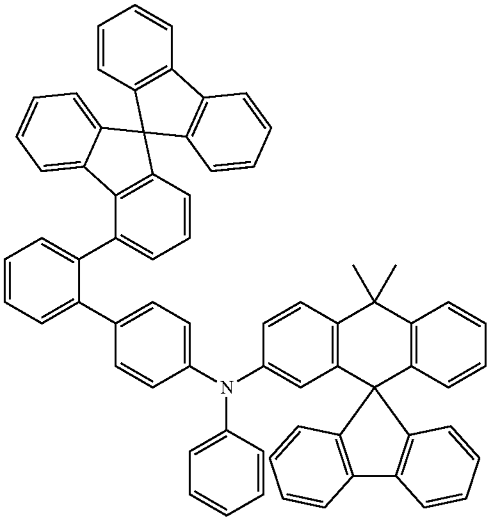

1-113

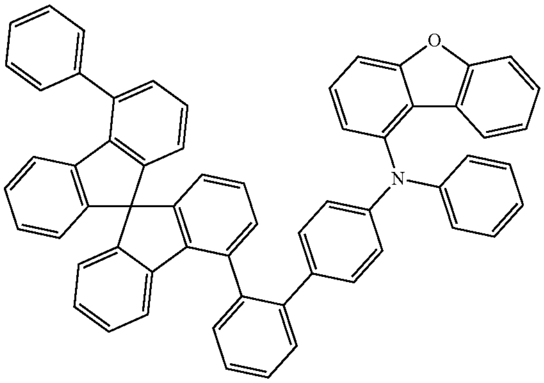

-continued 1-114

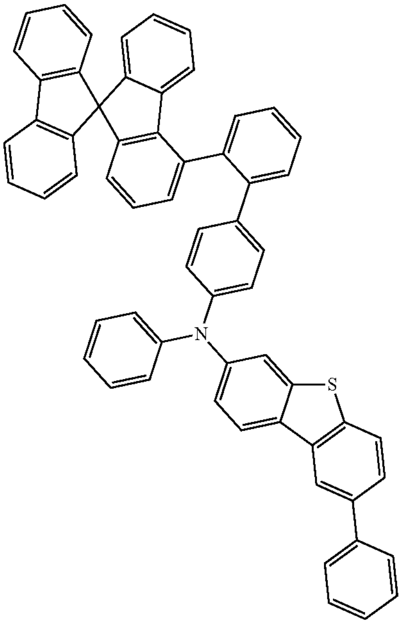

1-115

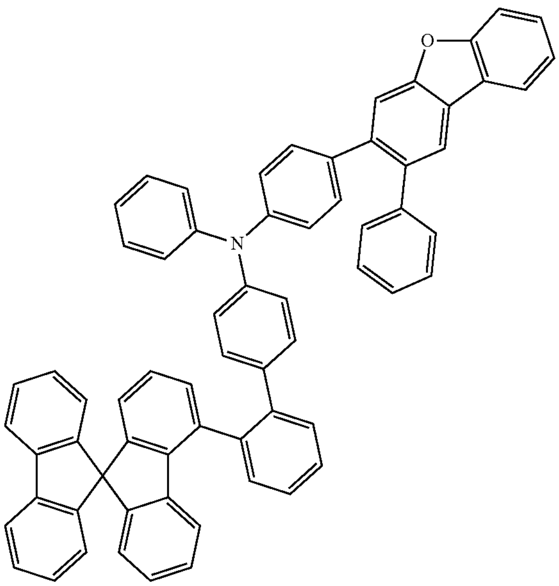

Referring to FIG. 1, the organic electronic element (100) according to the present invention includes a first electrode (110), a second electrode (170), an organic material layer comprising single compound represented by Formula (1) or 2 or more compounds between the first electrode (110) and the second electrode (170), Here, the first electrode (110) may be an anode or a positive electrode, and the second electrode (170) may be a cathode or a negative electrode. In the case of an inverted organic electronic element, the first electrode may be a cathode, and the second electrode may be an anode.

Figure 2:
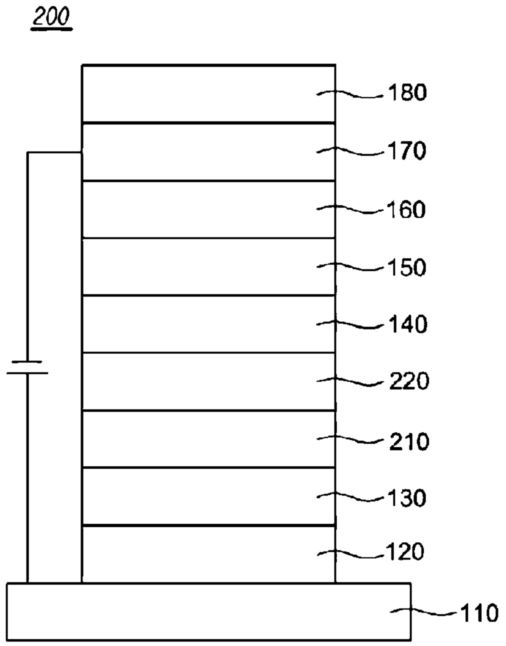

The organic material layer may sequentially include a hole injection layer (120), a hole transport layer (130), an emitting layer (140), an electron transport layer (150), and an electron injection layer (160) formed in sequence on the first electrode (110). Here, the remaining layers except the emitting layer (140) may not be formed. The organic material layer may further include a hole blocking layer, an electron blocking layer, an emitting-auxiliary layer (220), a buffer layer (210), etc., and the electron transport layer (150) and the like may serve as a hole blocking layer. (see FIG. 2)

Also, the organic electronic element according to an embodiment of the present invention may further include a protective layer or a light efficiency enhancing layer (180). The light efficiency enhancing layer may be formed on a surface not in contact with the organic material layer among both surfaces of the first electrode or on a surface not in contact with the organic material layer among both surfaces of the second electrode. The compound according to an embodiment of the present invention applied to the organic material layer may be used as a material for a hole injection layer (120), a hole transport layer (130), an emitting-auxiliary layer (220), an electron transport auxiliary layer, an electron transport layer (150), an electron injection layer (160), a host or dopant of an emitting layer (140) or the light efficiency enhancing layer. Preferably, for example, the compound according to Formula 1 of the present invention may be used as a material for the emitting-auxiliary layer.

Figure 3:
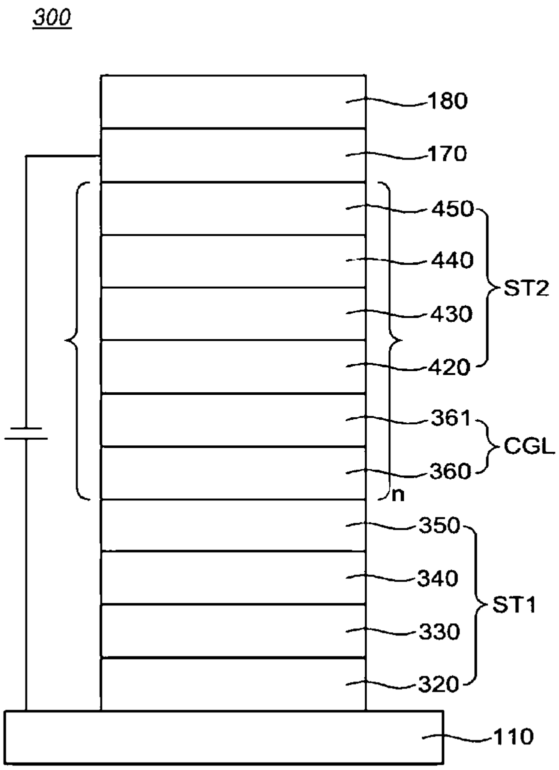
Figure 4:
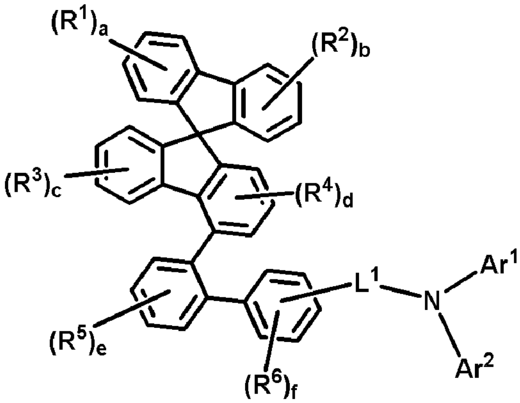
FIG. 4 shows the formula according to one aspect of the present invention.

The organic material layer may include 2 or more stacks including a hole transport layer, an emitting layer, and an electron transport layer sequentially formed on the anode, and may further include a charge generation layer formed between the 2 or more stacks (see FIG. 3).

Otherwise, even if the same core is used, the band gap, the electrical characteristics, the interface characteristics, and the like may vary depending on which substituent is bonded at which position, therefore the choice of core and the combination of sub-substituents associated therewith is also very important, and in particular, when the optimal combination of energy levels and T1 values and unique properties of materials (mobility, interfacial characteristics, etc.) of each organic material layer is achieved, a long life span and high efficiency can be achieved at the same time.

The organic electroluminescent device according to an embodiment of the present invention may be manufactured using a PVD (physical vapor deposition) method. For example, a metal or a metal oxide having conductivity or an alloy thereof is deposited on a substrate to form a cathode, and the organic material layer including the hole injection layer (120), the hole transport layer (130), the emitting layer (140), the electron transport layer (150), and the electron injection layer (160) is formed thereon, therefore can be prepared by depositing a material that can be used as a cathode thereon.

Also, the present invention provides the organic electronic element wherein the organic material layer is formed by one of a spin coating process, a nozzle printing process, an inkjet printing process, a slot coating process, a dip coating process or a roll-to-roll process, and the organic material layer provides an organic electronic element comprising the compound as an electron transport material.

As another specific example, the present invention provides an organic electronic element that is used by mixing the same or different compounds of the compound represented by Formula (1) to the organic material layer.

In another aspect, the present invention provides an emitting-auxiliary layer composition comprising a compound represented by Formula (1), and provides an organic electronic element comprising the emitting-auxiliary layer.

The present invention also provides an electronic device comprising a display device including the organic electronic element; and a control unit for driving the display device.

According to another aspect, the present invention provides an display device wherein the organic electronic element is at least one of an OLED, an organic solar cell, an organic photo conductor, an organic transistor (organic TFT) and an element for monochromic or white illumination. Here, the electronic device may be a wired/wireless communication terminal which is currently used or will be used in the future, and covers all kinds of electronic devices including a mobile communication terminal such as a cellular phone, a personal digital assistant (PDA), an electronic dictionary, a point-to-multipoint (PMP), a remote controller, a navigation unit, a game player, various kinds of TVs, and various kinds of computers.

Hereinafter, Synthesis Examples of the compound represented by Formula (1) of the present invention and preparation examples of the organic electronic element of the present invention will be described in detail by way of example, but are not limited to the following examples.

Synthesis Example 1

The compound (Final product) represented by Formula (1) according to the present invention may be prepared by reacting as in Reaction Scheme 1, but is not limited thereto.

<Reaction Scheme 1>

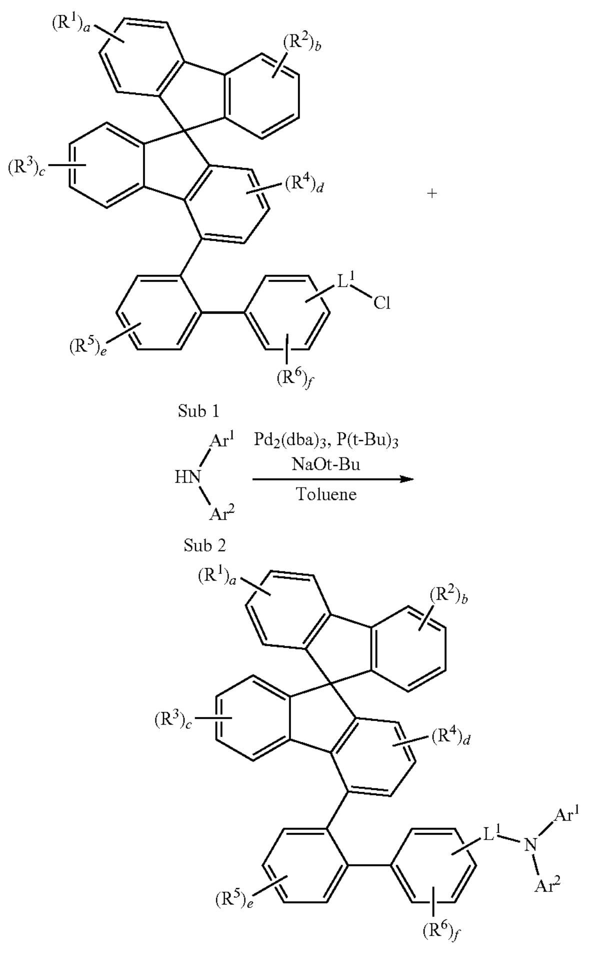

Synthesis Example of Sub 1

Sub 1 of Scheme 1 may be synthesized by the reaction route of Reaction Scheme 2, but is not limited thereto.

<Reaction Scheme 2>

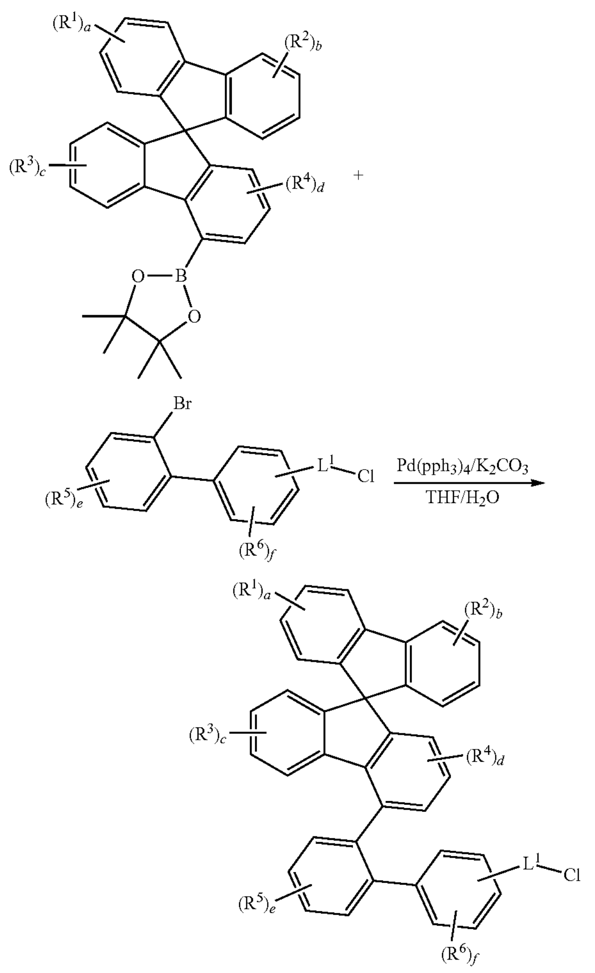

Sub 1

Synthesis examples of specific compounds belonging to Sub 1 are as follows.

1. Synthesis Example of Sub1-1

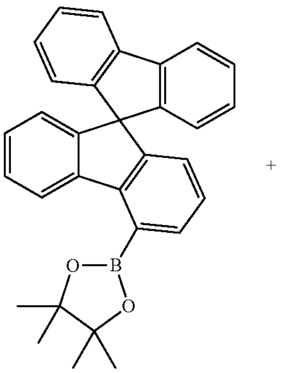

-continued

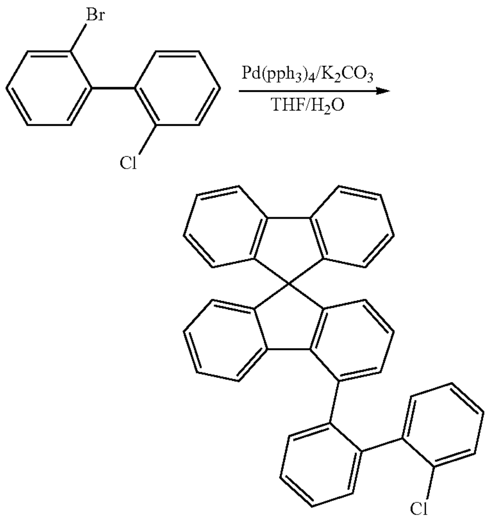

Sub 1-1

THF (550 ml) was added to 2-(9,9'-spirobi[fluoren]-4-yl)-4,4,5,5-tetramethyl-1,3,2-dioxaborolane (50 g, 113 mmol), 2-bromo-2'-chloro-1,1'-biphenyl (30.2 g, 113 mmol), $Pd(PPh_3)_4$ (7.84 g, 6.78 mmol), $K_2CO_3$ (46.9 g, 339.1 mmol) and dissolved, and then water (280 ml) was added, followed by stirring at 90° C. After that, when the reaction was completed, the temperature of the reactant was cooled to room temperature, extracted with MC, and washed with water. The organic layer was dried over $MgSO_4$ and concentrated, and the resulting organic material was separated through a silica gel filter to obtain 45.5 g (yield: 80%) of the product Sub 1-1.

2. Synthesis Example of Sub1-3

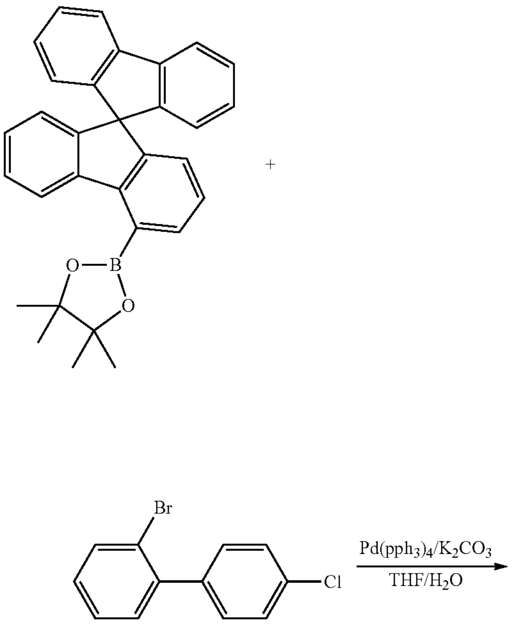

-continued

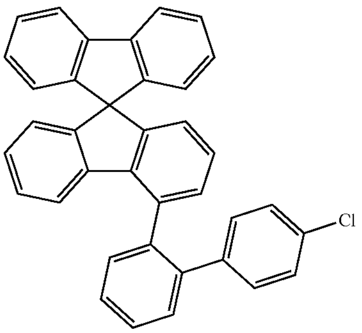

Sub 1-3

-continued

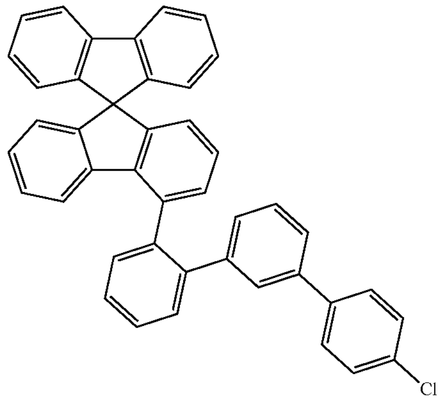

Sub 1-4

THF (550 ml) was added to 2-(9,9'-spirobi[fluoren]-4-yl)-4,4,5,5-tetramethyl-1,3,2-dioxaborolane (50 g, 113 mmol), 2-bromo-4'-chloro-1,1'-biphenyl (30.2 g, 113 mmol), $Pd(PPh_3)_4$ (7.84 g, 6.78 mmol), $K_2CO_3$ (46.9 g, 339.1 mmol) and dissolved, and then water (550 ml) was added, followed by stirring at 90° C. After that, when the reaction was completed, the temperature of the reactant was cooled to room temperature, extracted with MC, and washed with water. The organic layer was dried over $MgSO_4$ and concentrated, and the resulting organic material was separated through a silica gel filter to obtain 46.1 g (yield: 81%) of the product Sub 1-3.

3. Synthesis Example of Sub1-4

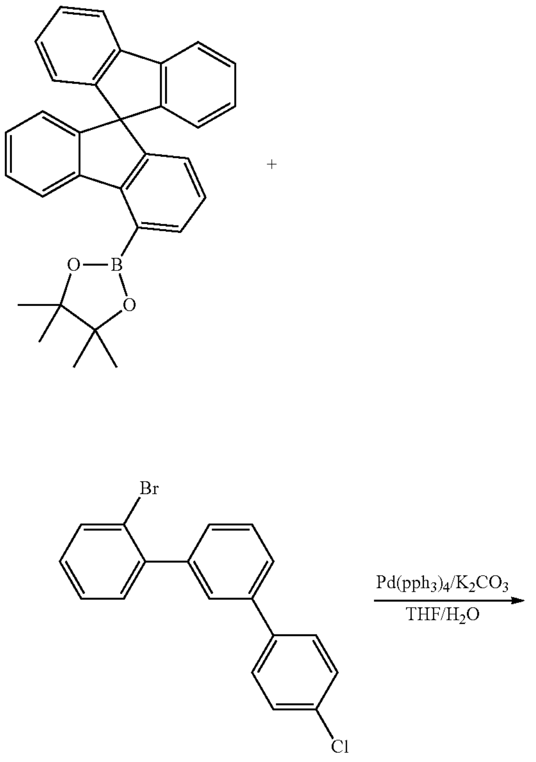

THF (550 ml) was added to 2-(9,9'-spirobi[fluoren]-4-yl)-4,4,5,5-tetramethyl-1,3,2-dioxaborolane (50 g, 113 mmol), 2-bromo-4"-chloro-1,1':3',1"-terphenyl (38.8 g, 113 mmol), $Pd(PPh_3)_4$ (7.84 g, 6.78 mmol), $K_2CO_3$ (46.9 g, 339.1 mmol) and dissolved, and then water (280 ml) was added, followed by stirring at 90° C. After that, when the reaction was completed, the temperature of the reactant was cooled to room temperature, extracted with MC, and washed with water. The organic layer was dried over $MgSO_4$ and concentrated, and the resulting organic material was separated through a silica gel filter to obtain 51.7 g (yield: 79%) of the product Sub 1-4.

4. Synthesis Example of Sub1-16

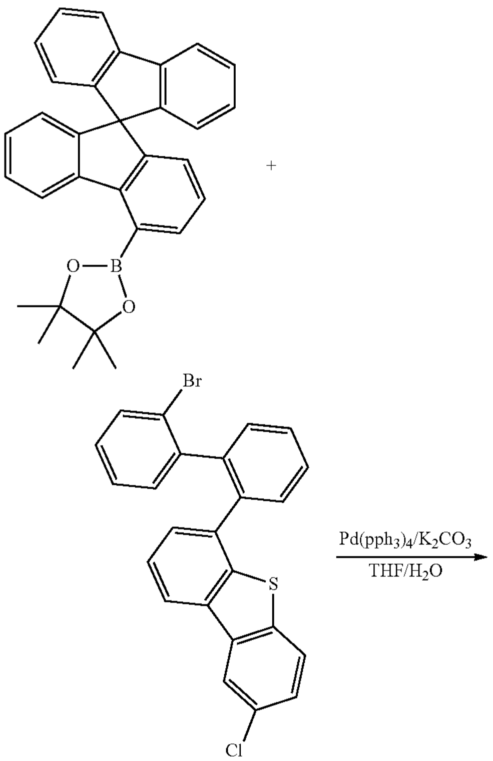

-continued

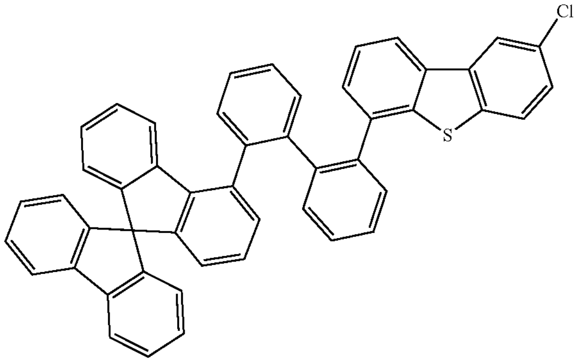

Sub 1-16

THF (550 ml) was added to 2-(9,9'-spirobi[fluoren]-4-yl)-4,4,5,5-tetramethyl-1,3,2-dioxaborolane (50 g, 113 mmol), 6-(2'-bromo-[1,1'-biphenyl]-2-yl)-2-chlorodibenzo[b,d] thiophene (50.8 g, 113 mmol), $Pd(PPh_3)_4$ (7.84 g, 6.78 mmol), $K_2CO_3$ (46.9 g, 339.1 mmol) and dissolved, and then water (280 ml) was added, followed by stirring at 90° C. After that, when the reaction was completed, the temperature of the reactant was cooled to room temperature, extracted with MC, and washed with water. The organic layer was dried over $MgSO_4$ and concentrated, and the resulting organic material was separated through a silica gel filter to obtain 59.6 g (yield: 77%) of the product Sub 1-16.

5. Synthesis Example of Sub1-18

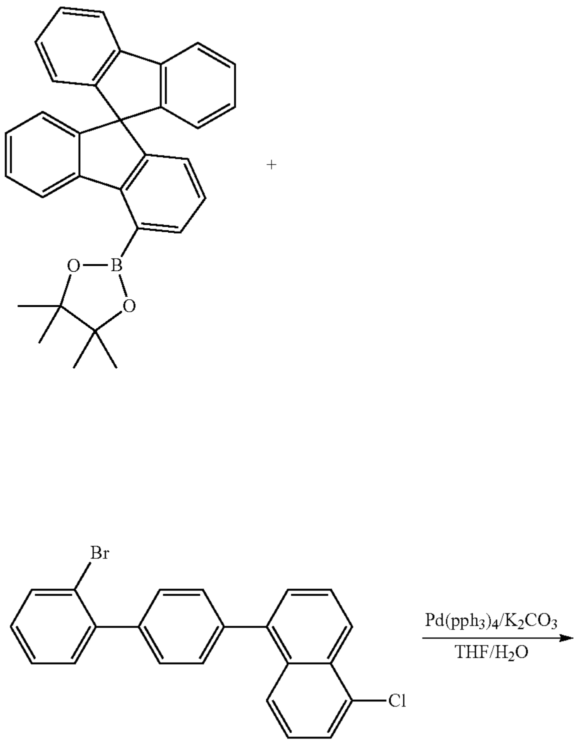

-continued

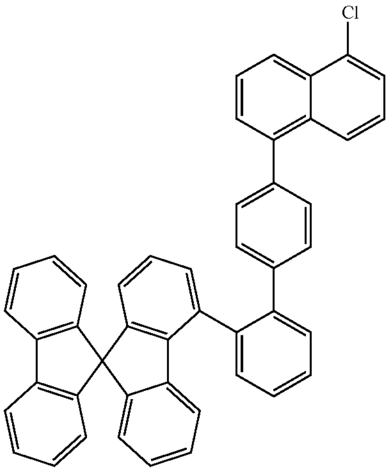

Sub 1-18

THF (550 ml) was added to 2-(9,9'-spirobi[fluoren]-4-yl)-4,4,5,5-tetramethyl-1,3,2-dioxaborolane (50 g, 113 mmol), 1-(2'-bromo-[1,1'-biphenyl]-4-yl)-5-chloronaphthalene (44.5 g, 113 mmol), $Pd(PPh_3)_4$ (7.84 g, 6.78 mmol), $K_2CO_3$ (46.9 g, 339.1 mmol) and dissolved, and then water (280 ml) was added, followed by stirring at 90° C. After that, when the reaction was completed, the temperature of the reactant was cooled to room temperature, extracted with MC, and washed with water. The organic layer was dried over $MgSO_4$ and concentrated, and the resulting organic material was separated through a silica gel filter to obtain 56.2 g (yield: 79%) of the product Sub 1-18.

6. Synthesis Example of Sub1-23

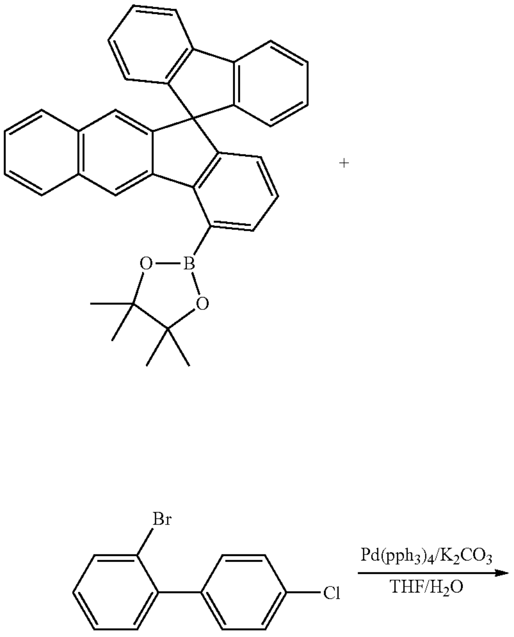

-continued

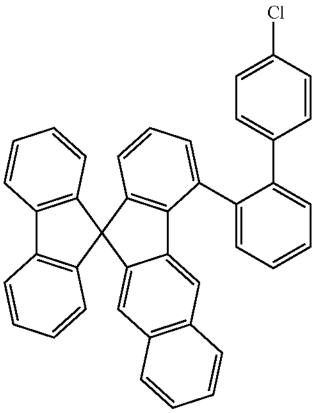

Sub 1-23

THF (500 ml) was added to 4,4,5,5-tetramethyl-2-(spiro[benzo[b]fluorene-11,9'-fluoren]-4-yl)-1,3,2-dioxaborolane (50 g, 101.5 mmol), 2-bromo-4'-chloro-1,1'-biphenyl (27.2 g, 101.5 mmol), $Pd(PPh_3)_4$ (7.04 g, 6.09 mmol), $K_2CO_3$ (42.1 g, 304.6 mmol) and dissolved, and then water (250 ml) was added, followed by stirring at 90° C. After that, when the reaction was completed, the temperature of the reactant was cooled to room temperature, extracted with MC, and washed with water. The organic layer was dried over $MgSO_4$ and concentrated, and the resulting organic material was separated through a silica gel filter to obtain 45.5 g (yield: 81%) of the product Sub 1-23.

7. Synthesis Example of Sub1-30

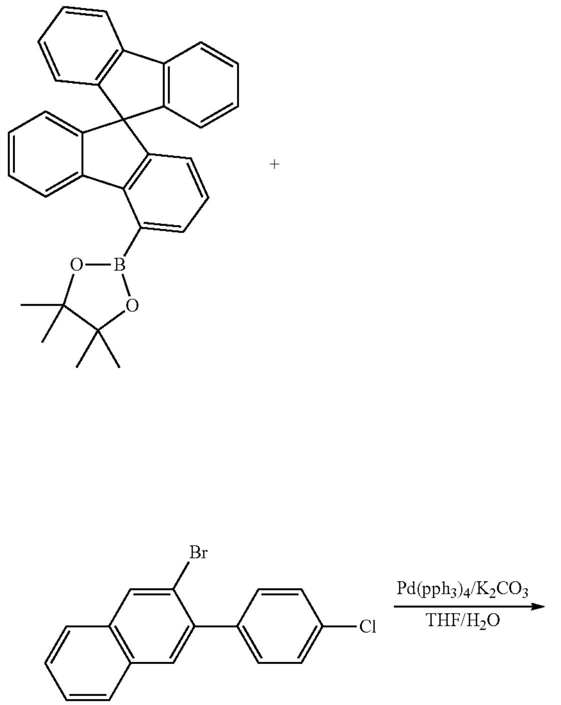

-continued

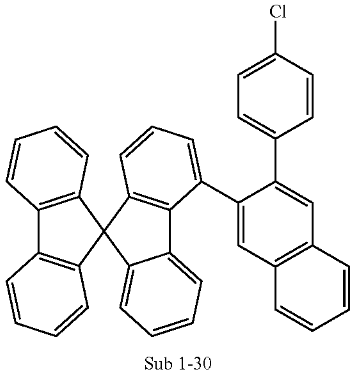

Sub 1-30

THF (550 ml) was added to 2-(9,9'-spirobi[fluoren]-4-yl)-4,4,5,5-tetramethyl-1,3,2-dioxaborolane (50 g, 113 mmol), 2-bromo-3-(4-chlorophenyl)naphthalene (35.9 g, 113 mmol), $Pd(PPh_3)_4$ (7.84 g, 6.78 mmol), $K_2CO_3$ (46.9 g, 339.1 mmol) and dissolved, and then water (280 ml) was added, followed by stirring at 90° C. After that, when the reaction was completed, the temperature of the reactant was cooled to room temperature, extracted with MC, and washed with water. The organic layer was dried over $MgSO_4$ and concentrated, and the resulting organic material was separated through a silica gel filter to obtain 50 g (yield: 80%) of the product Sub 1-30.

8. Synthesis Example of Sub1-36

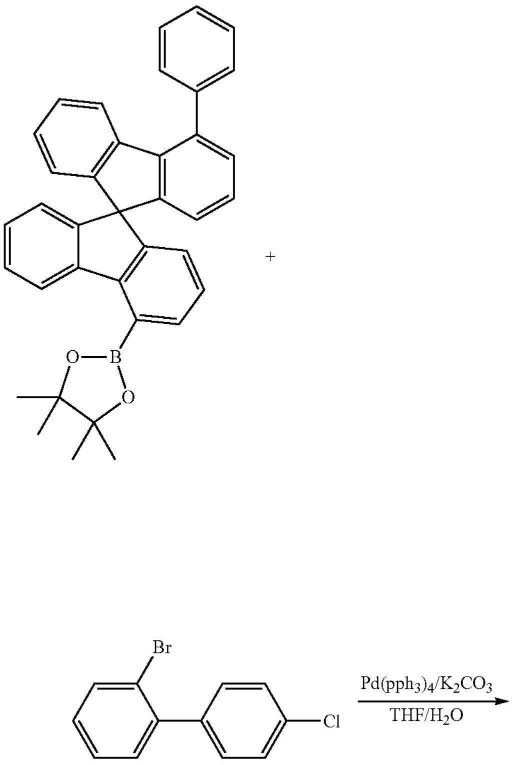

-continued

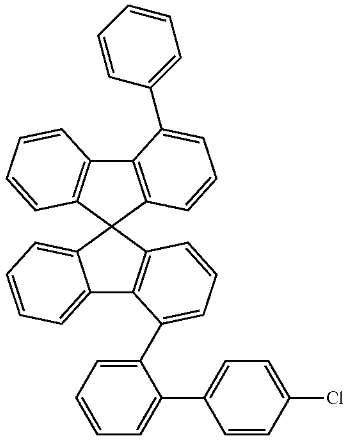

Sub 1-36

THF (480 ml) was added to 4,4,5,5-tetramethyl-2-(4'-phenyl-9,9'-spirobi[fluoren]-4-yl)-1,3,2-dioxaborolane (50 g, 96.4 mmol), 2-bromo-4'-chloro-1,1'-biphenyl (25.8 g, 96.4 mmol), $Pd(PPh_3)_4$ (6.69 g, 5.79 mmol), $K_2CO_3$ (40 g, 289.3 mmol) and dissolved, and then water (240 ml) was added, followed by stirring at 90° C. After that, when the reaction was completed, the temperature of the reactant was cooled to room temperature, extracted with MC, and washed with water. The organic layer was dried over $MgSO_4$ and concentrated, and the resulting organic material was separated through a silica gel filter to obtain 45.2 g (yield: 81%) of the product Sub 1-36.

Examples of Sub 1 are as follows, but are not limited thereto, and Table 1 shows Field Desorption-Mass Spectrometry (FD-MS) values of compounds belonging to Sub 1.

Sub 1-1

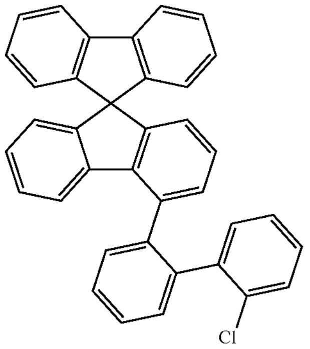

Sub 1-2

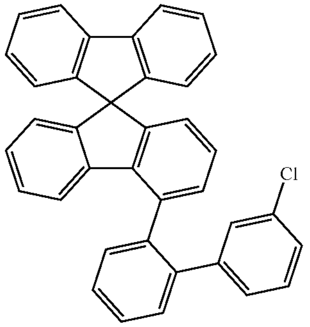

-continued

Sub 1-3

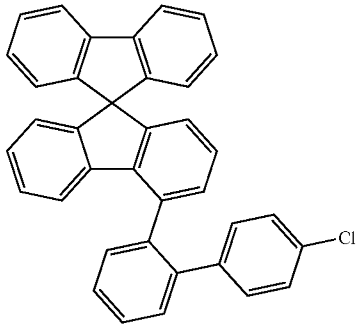

Sub 1-4

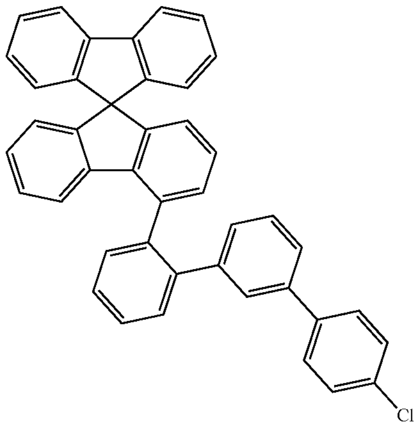

Sub 1-5

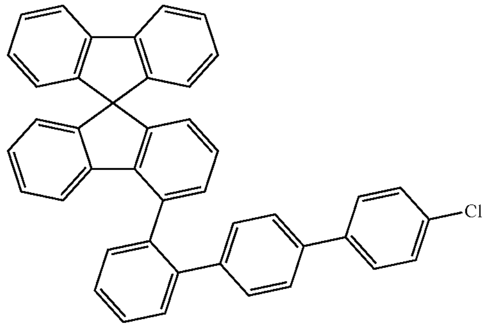

Sub 1-6

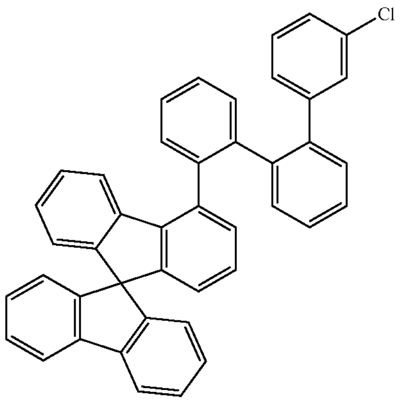

-continued
Sub 1-7
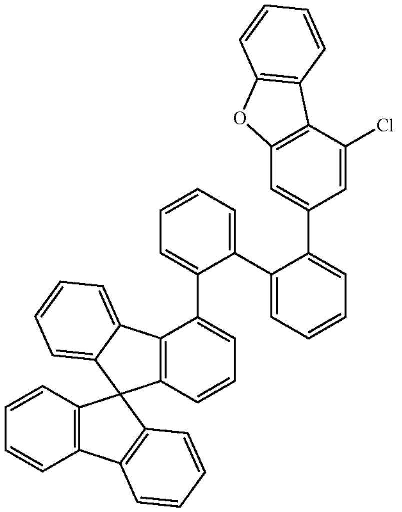
Sub 1-8
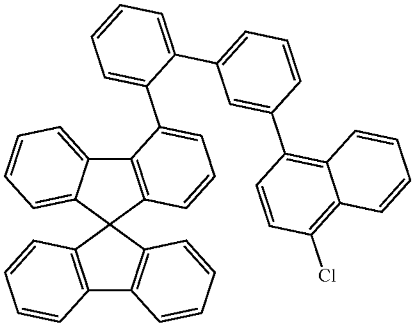
Sub 1-9
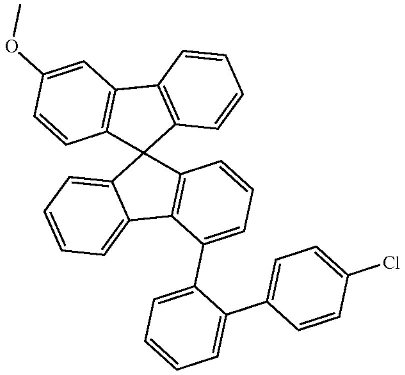
Sub 1-10
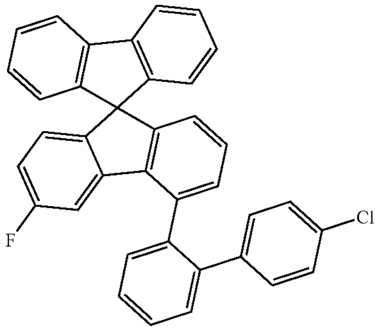
-continued
Sub 1-11
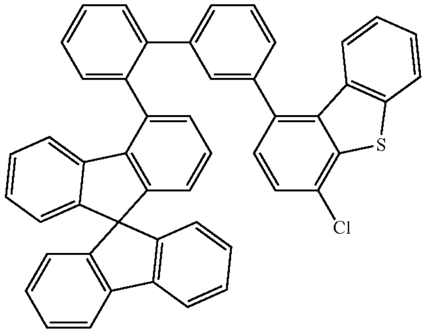
Sub 1-12
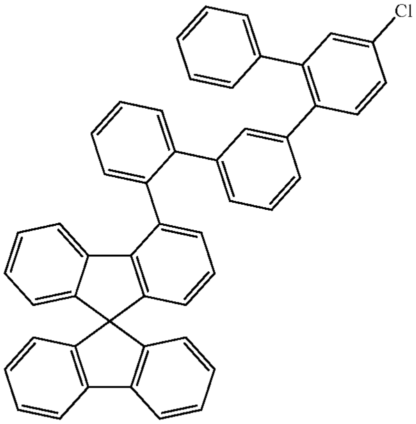
Sub 1-13
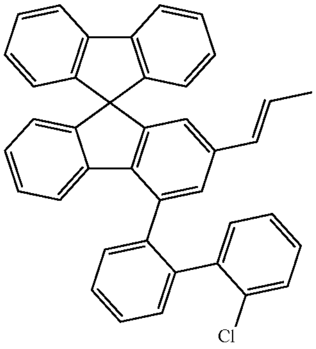
Sub 1-14
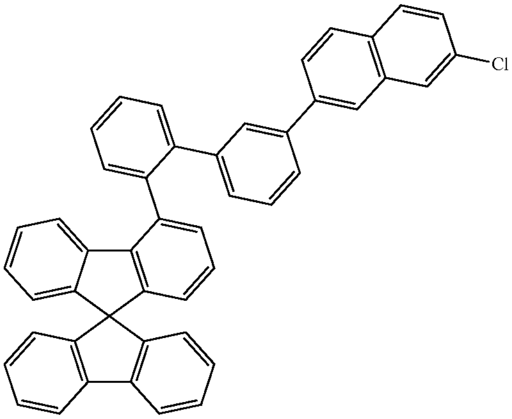

Sub 1-15
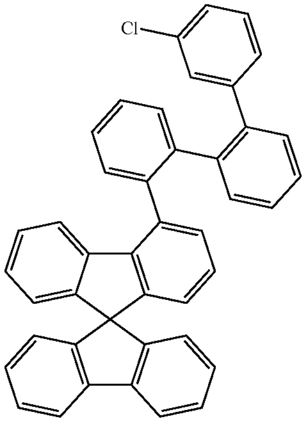
Sub 1-16
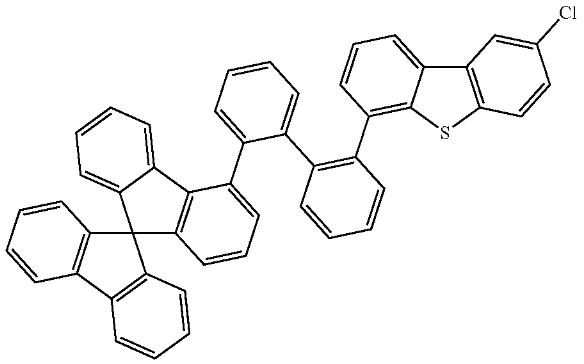
Sub 1-17
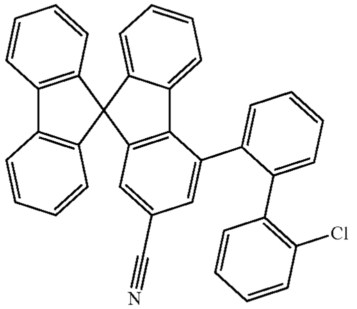
Sub 1-18
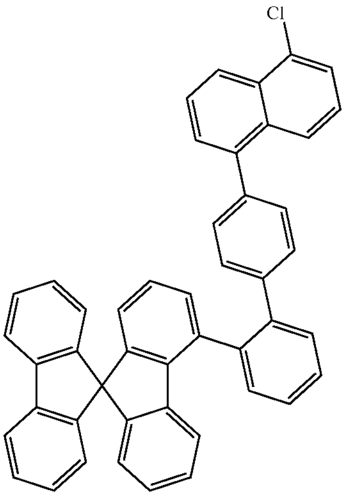
Sub 1-19
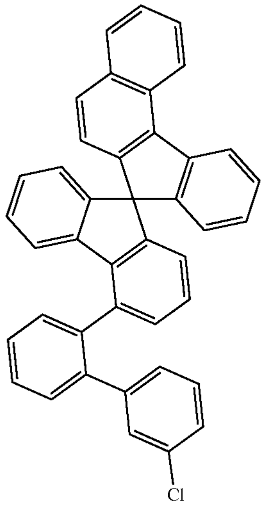
Sub 1-20
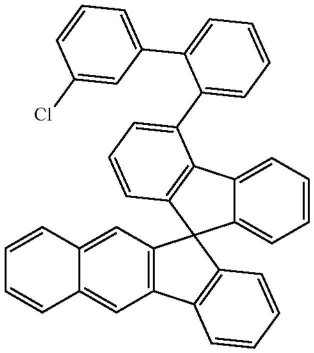
Sub 1-21
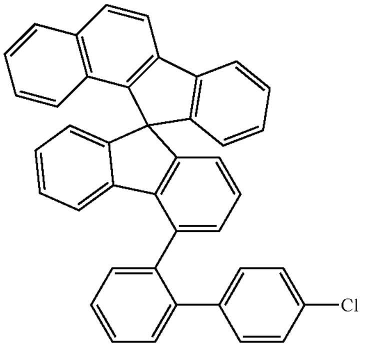
Sub 1-22
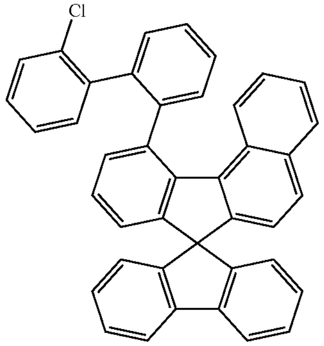

-continued
Sub 1-23
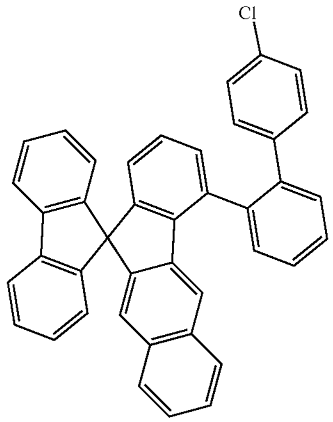
Sub 1-24
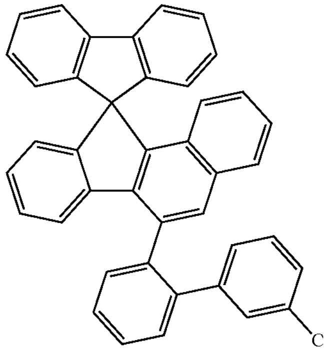
Sub 1-25
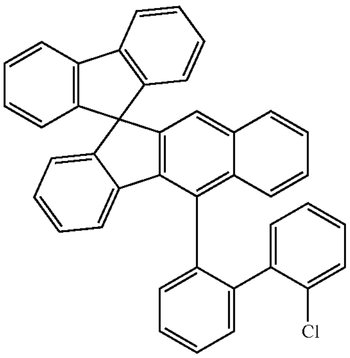
Sub 1-26
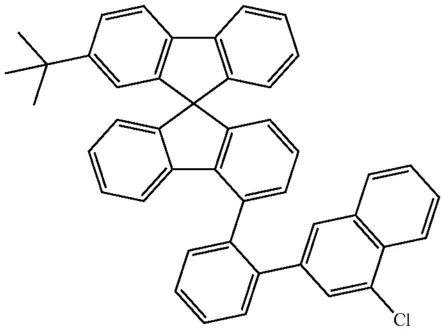
-continued
Sub 1-27
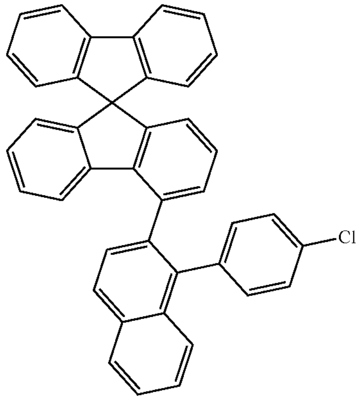
Sub 1-28
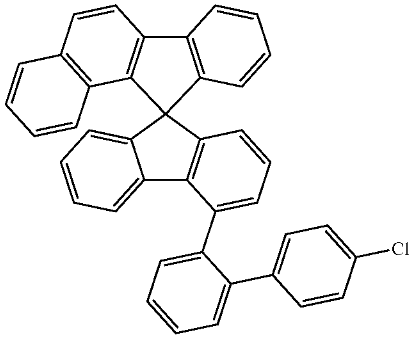
Sub 1-29
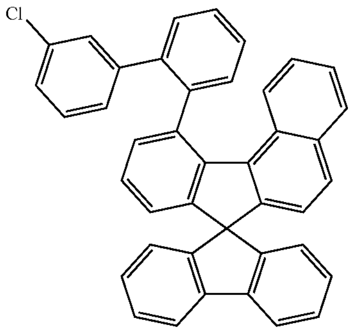
Sub 1-30
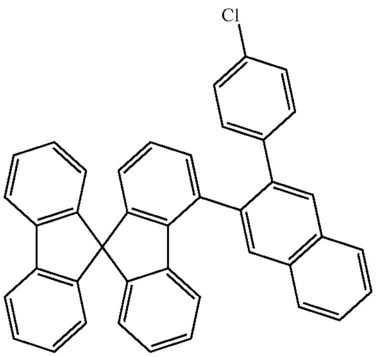

Sub 1-31
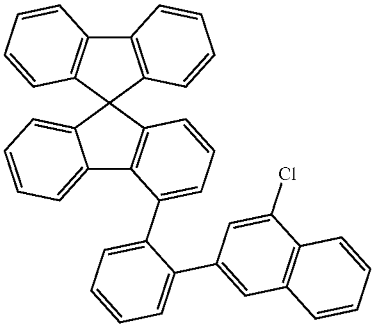
Sub 1-32
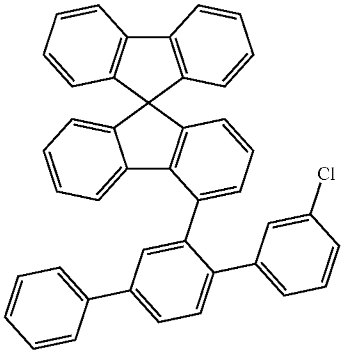
Sub 1-33
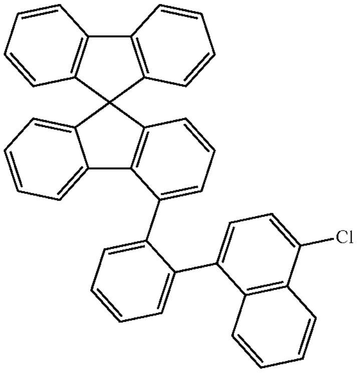
Sub 1-34
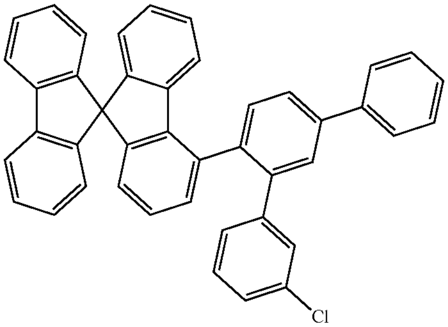
Sub 1-35
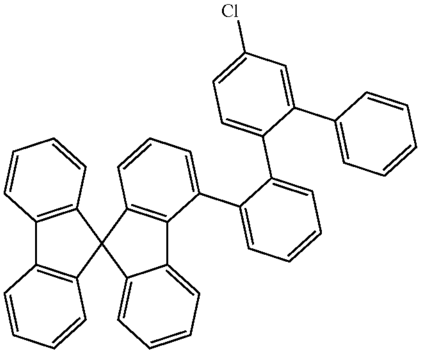
Sub 1-36
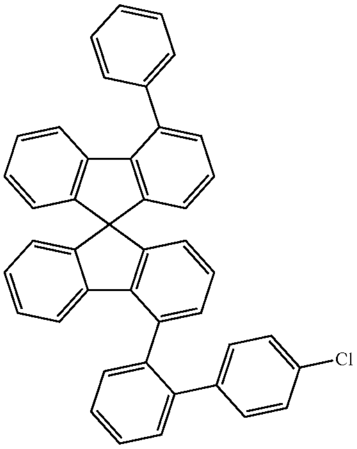
Sub 1-37
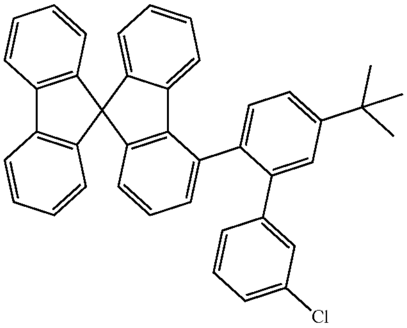
Sub 1-38
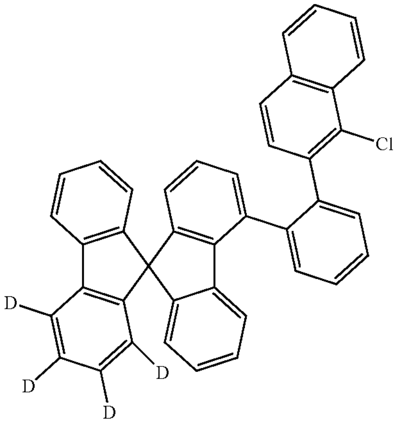

TABLE 1

| Cpd. | FD-MS | Cpd. | FD-MS |
|---|---|---|---|
| Sub 1-1 | m/z = 502.15($C_{37}H_{23}Cl$ = 503.04) | Sub 1-2 | m/z = 502.15($C_{37}H_{23}Cl$ = 503.04) |
| Sub 1-3 | m/z = 502.15($C_{37}H_{23}Cl$ = 503.04) | Sub 1-4 | m/z = 578.18($C_{43}H_{27}Cl$ = 579.14) |
| Sub 1-5 | m/z = 578.18($C_{43}H_{27}Cl$ = 579. 14) | Sub 1-6 | m/z = 578.18($C_{43}H_{27}Cl$ = 579.14) |
| Sub 1-7 | m/z = 668.19($C_{49}H_{29}ClO$ = 669.22) | Sub 1-8 | m/z = 628.2($C_{47}H_{29}Cl$ = 629.2) |
| Sub 1-9 | m/z = 532.16($C_{38}H_{25}ClO$ = 533.07) | Sub 1-10 | m/z = 520.14($C_{37}H_{22}ClF$ = 521.03) |
| Sub 1-11 | m/z = 684.17($C_{49}H_{29}ClS$ = 685.28) | Sub 1-12 | m/z = 654.21($C_{49}H_{31}Cl$ = 655.24) |
| Sub 1-13 | m/z = 542.18($C_{40}H_{27}Cl$ = 543.11) | Sub 1-14 | m/z = 628.2($C_{47}H_{29}Cl$ = 629.2) |
| Sub 1-15 | m/z = 578.18($C_{43}H_{27}Cl$ = 579.14) | Sub 1-16 | m/z = 684.17($C_{49}H_{29}ClS$ = 685.28) |
| Sub 1-17 | m/z = 527.14($C_{38}H_{22}ClN$ = 528.05) | Sub 1-18 | m/z = 628.2($C_{47}H_{29}Cl$ = 629.2) |
| Sub 1-19 | m/z = 552.16($C_{41}H_{25}Cl$ = 553.1) | Sub 1-20 | m/z = 552.16($C_{41}H_{25}Cl$ = 553.1) |
| Sub 1-21 | m/z = 552.16($C_{41}H_{25}Cl$ = 553.1) | Sub 1-22 | m/z = 552.16($C_{41}H_{25}Cl$ = 553.1) |
| Sub 1-23 | m/z = 552.16($C_{41}H_{25}Cl$ = 553.1) | Sub 1-24 | m/z = 552.16($C_{41}H_{25}Cl$ = 553.1) |
| Sub 1-25 | m/z = 552.16($C_{41}H_{25}Cl$ = 553.1) | Sub 1-26 | m/z = 608.23($C_{45}H_{33}Cl$ = 609.21) |
| Sub 1-27 | m/z = 552.16($C_{41}H_{25}Cl$ = 553.1) | Sub 1-28 | m/z = 552.16($C_{41}H_{25}Cl$ = 553.1) |
| Sub 1-29 | m/z = 552.16($C_{41}H_{25}Cl$ = 553.1) | Sub 1-30 | m/z = 552.16($C_{41}H_{25}Cl$ = 553.1) |
| Sub 1-31 | m/z = 552.16($C_{41}H_{25}Cl$ = 553.1) | Sub 1-32 | m/z = 578.18($C_{43}H_{27}Cl$ = 579.14) |
| Sub 1-33 | m/z = 552.16($C_{41}H_{25}Cl$ = 553.1) | Sub 1-34 | m/z = 578.18($C_{43}H_{27}Cl$ = 579.14) |
| Sub 1-35 | m/z = 578.18($C_{43}H_{27}Cl$ = 579.14) | Sub 1-36 | m/z = 578.18($C_{43}H_{27}Cl$ = 579.14) |
| Sub 1-37 | m/z = 558.21($C_{41}H_{31}Cl$ = 559.15) | Sub 1-38 | m/z = 556.19($C_{41}H_{21}D_4Cl$ = 557.13) |

Synthesis Example of Sub 2

Sub 2 of Reaction Scheme 1 may be synthesized by the reaction route of Reaction Scheme 3, but is not limited thereto.

<Reaction Scheme 3>

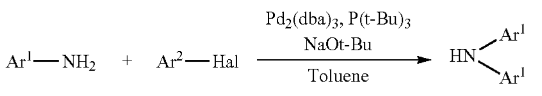

Sub 2

Hal = Br, I, Cl

Synthesis examples of specific compounds belonging to Sub 2 are as follows.

1. Synthesis Example of Sub 2-1

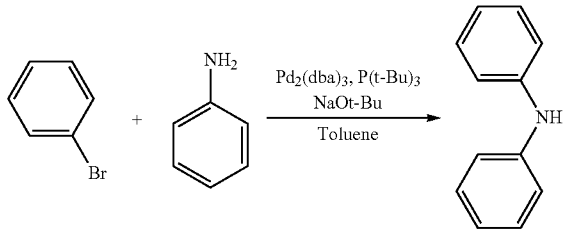

Sub 2-1 aniline (29.65 g, 318.45 mmol), $Pd_2(dba)_3$ (8.74 g, 9.55 mmol), $P(t\text{-}Bu)_3$ (6.44 g, 31.84 mmol), NaOt-Bu (61.20 g, 636.9 mmol), Toluene (900 mL) were added to Bromobenzene (50 g, 318.45 mmol) and reacted for 2 hours. After the reaction was completed, the organic layer was extracted with water, dried over $MgSO_4$, concentrated, and the resulting compound was recrystallized using silicagel column to obtain a product Sub 2-1 (40.41 g, yield: 75%).

2. Synthesis Example of Sub 2-5

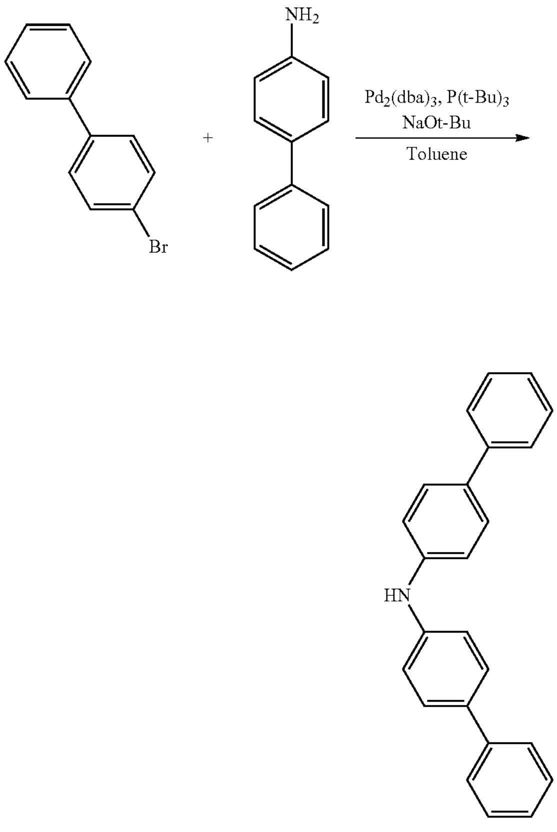

Sub 2-5

[1,1'-biphenyl]-4-amine (36.3 g, 214.5 mmol), $Pd_2(dba)_3$ (5.89 g, 6.43 mmol), $P(t\text{-}Bu)_3$ (2.6 g, 12.87 mmol), NaOt-Bu (41.2 g, 429 mmol), Toluene (1000 mL) were added to 4-bromo-1,1'-biphenyl (50 g, 214.5 mmol) and reacted for 2 hours. After the reaction was completed, the organic layer was extracted with water, dried over $MgSO_4$, concentrated, and the resulting compound was recrystallized using silicagel column to obtain a product Sub 2-5 (48.3 g, yield: 70%).

3. Synthesis Example of Sub 2-6

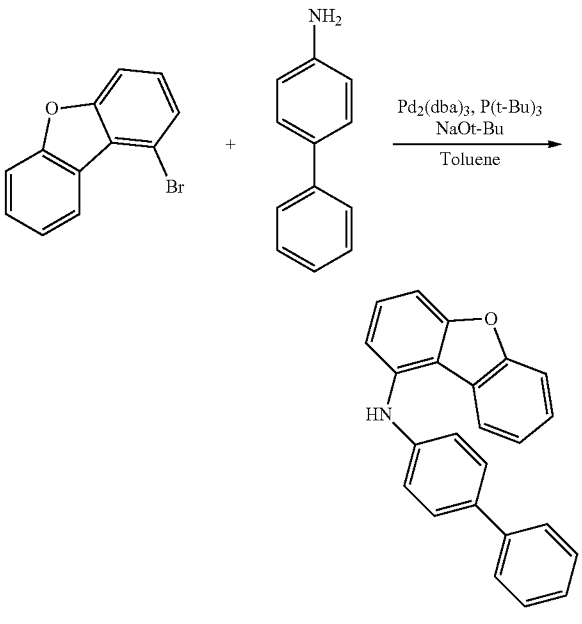

Sub 2-6

[1,1'-biphenyl]-4-amine (34.2 g, 202.4 mmol), $Pd_2(dba)_3$ (5.56 g, 6.07 mmol), $P(t-Bu)_3$ (2.46 g, 12.14 mmol), NaOt-Bu (38.9 g, 404.7 mmol), Toluene (1000 mL) were added to 1-bromodibenzo[b,d]furan (50 g, 202.4 mmol) and reacted for 2 hours. After the reaction was completed, the organic layer was extracted with water, dried over $MgSO_4$, concentrated, and the resulting compound was recrystallized using silicagel column to obtain a product Sub 2-6 (48.9 g, yield: 72%).

4. Synthesis Example of Sub 2-14

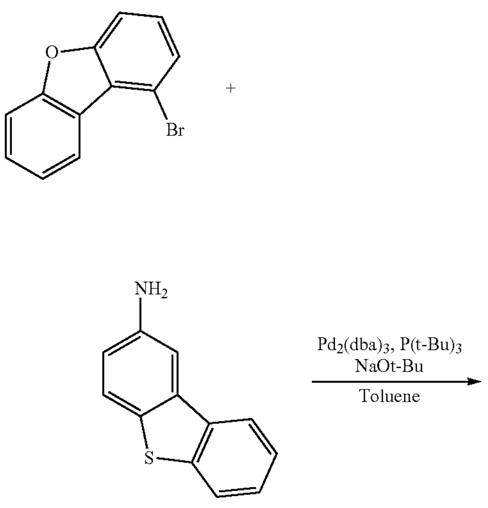

-continued

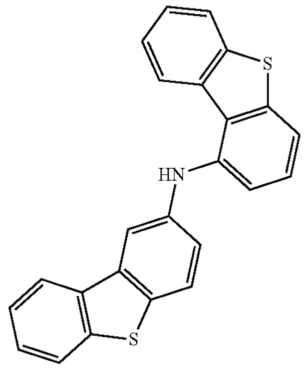

Sub 2-14 dibenzo[b,d]thiophen-2-amine (37.9 g, 190 mmol), $Pd_2(dba)_3$ (5.22 g, 5.7 mmol), $P(t-Bu)_3$ (2.31 g, 11.4 mmol), NaOt-Bu (36.5 g, 380 mmol), Toluene (950 mL) were added to 1-bromodibenzo[b,d]thiophene (50 g, 190 mmol) and reacted for 2 hours. After the reaction was completed, the organic layer was extracted with water, dried over $MgSO_4$, concentrated, and the resulting compound was recrystallized using silicagel column to obtain a product Sub 2-14 (51.5 g, yield: 71%).

5. Synthesis Example of Sub 2-32

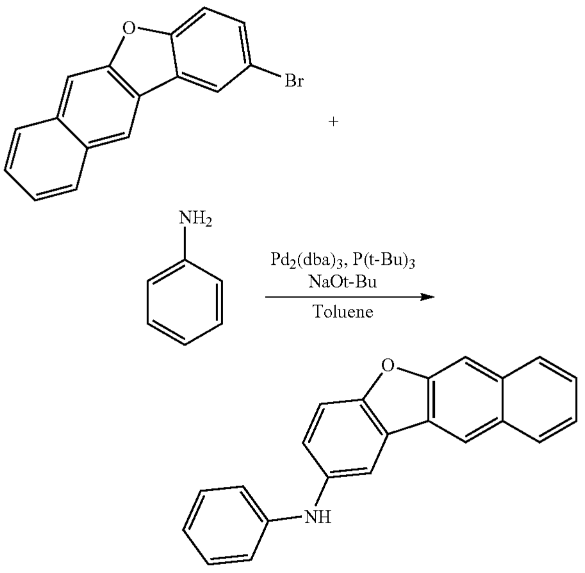

Sub 2-32 aniline (15.7 g, 168.3 mmol), $Pd_2(dba)_3$ (4.62 g, 5.05 mmol), $P(t-Bu)_3$ (2.04 g, 10.1 mmol), NaOt-Bu (32.3 g, 336.5 mmol), Toluene (850 mL) were added to 2-bromonaphtho[2,3-b]benzofuran (50 g, 168.3 mmol) and reacted for 2 hours. After the reaction was completed, the organic layer was extracted with water, dried over $MgSO_4$, concentrated, and the resulting compound was recrystallized using silicagel column to obtain a product Sub 2-32 (38 g, yield: 73%).

6. Synthesis Example of Sub 2-50

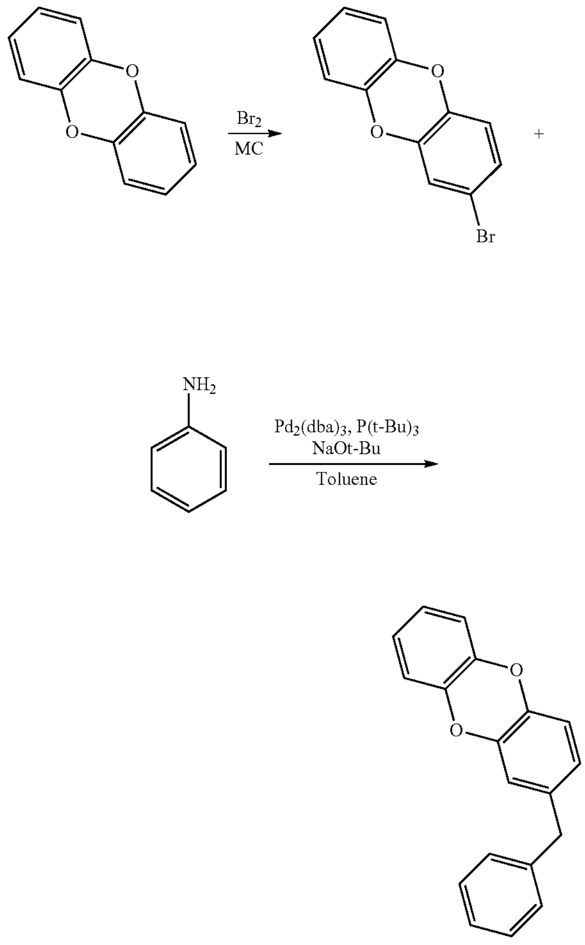

Sub 2-50

(1) Synthesis of Sub 2-50a

After dissolving dibenzo[b,e][1,4]dioxine (50 g, 271.45 mmol) in 500 ml of dichloromethane, the mixture was stirred at 0° C. for 30 minutes. After $Br_2$ (43.16 g, 271.45 mmol) was slowly added dropwise, the reaction solution was stirred at room temperature for 6 hours. After the reaction was completed, the organic layer was extracted with water, dried over $MgSO_4$, concentrated, and the resulting compound was recrystallized using silicagel column to obtain a product Sub 2-50a (64.27 g, yield: 90%).

(2) Synthesis of Sub 2-50 aniline (17.69 g, 190.04 mmol), $Pd_2(dba)_3$ (5.22 g, 5.70 mmol), $P(t\text{-}Bu)_3$ (3.84 g, 19.00 mmol), NaOt-Bu (36.52 g, 380.08 mmol), Toluene (600 mL) were added to Sub 2-50a (50 g, 190.04 mmol) and reacted for 2 hours. After the reaction was completed, the organic layer was extracted with water, dried over $MgSO_4$, concentrated, and the resulting compound was recrystallized using silicagel column to obtain a product Sub 2-50 (41.33 g, yield: 79%).

7. Synthesis Example of Sub 2-59

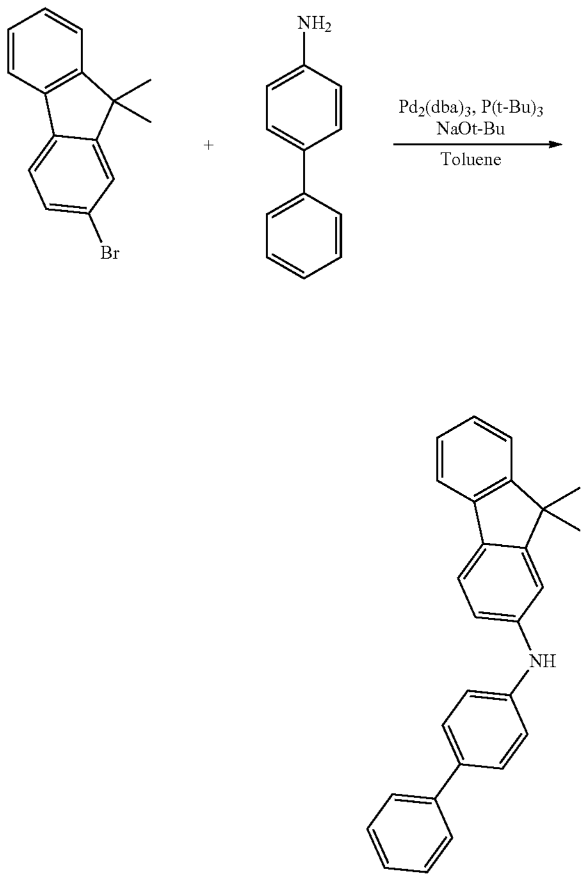

Sub 2-59

[1,1'-biphenyl]-4-amine (37.17 g, 219.63 mmol), $Pd_2(dba)_3$ (5.02 g, 5.49 mmol), $P(t\text{-}Bu)_3$ (3.70 g, 18.30 mmol), NaOt-Bu (35.18 g, 366.06 mmol), Toluene (500 mL) were added to 2-bromo-9,9-dimethyl-9H-fluorene (50 g, 183.03 mmol) and reacted for 2 hours. After the reaction was completed, the organic layer was extracted with water, dried over $MgSO_4$, concentrated, and the resulting compound was recrystallized using silicagel column to obtain a product Sub 2-59 (49.62 g, yield: 75%).

8. Synthesis Example of Sub 2-76

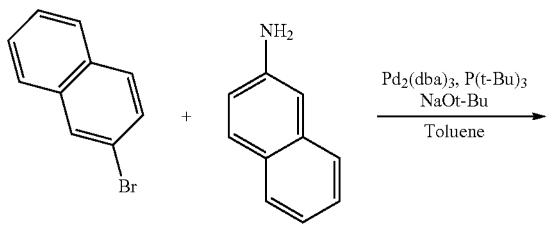

-continued

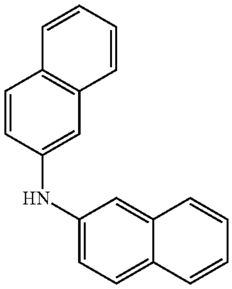

Sub 2-76 naphthalen-2-amine (34.6 g, 241.5 mmol), $Pd_2(dba)_3$ (6.63 g, 7.24 mmol), $P(t\text{-}Bu)_3$ (2.93 g, 14.49 mmol), NaOt-Bu (46.4 g, 482.9 mmol), Toluene (1200 mL) were added to 2-bromonaphthalene (50 g, 241.5 mmol) and reacted for 2 hours. After the reaction was completed, the organic layer was extracted with water, dried over $MgSO_4$, concentrated, and the resulting compound was recrystallized using silica-gel column to obtain a product Sub 2-76 (48.1 g, yield: 74%).

Examples of Sub 2 are as follows, but are not limited thereto, and Table 2 shows FD-MS (Field Desorption-Mass Spectrometry) values of compounds belonging to Sub 2.

Sub 2-1

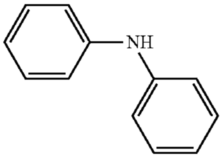

Sub 2-2

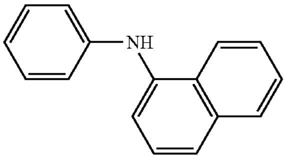

Sub 2-3

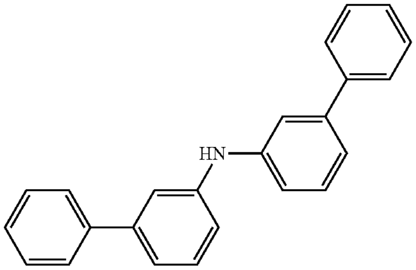

-continued

Sub 2-4

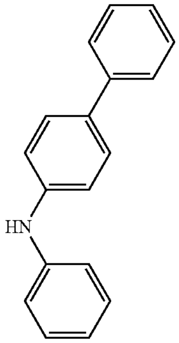

Sub 2-5

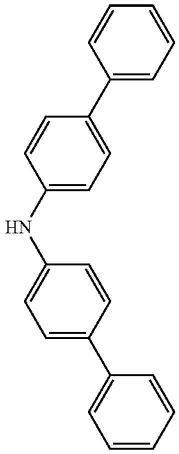

Sub 2-6

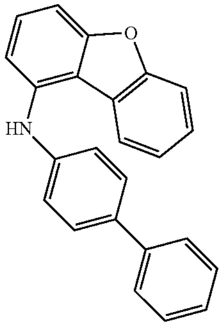

Sub 2-7

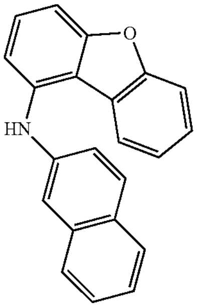

-continued
Sub 2-8
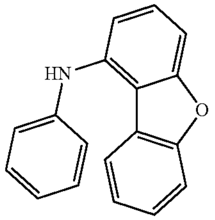
Sub 2-9
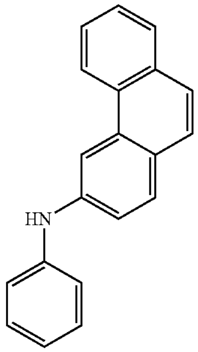
Sub 2-10
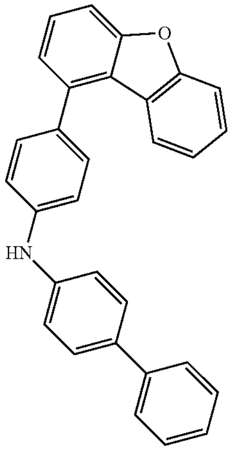
Sub 2-11
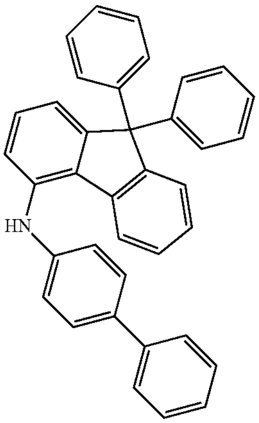
-continued
Sub 2-12
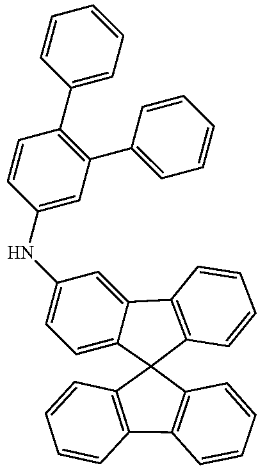
Sub 2-13
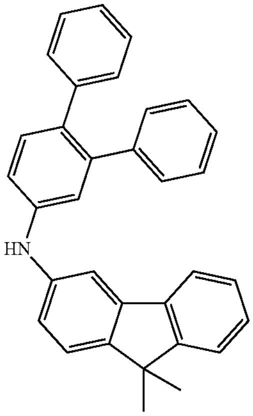
Sub 2-14
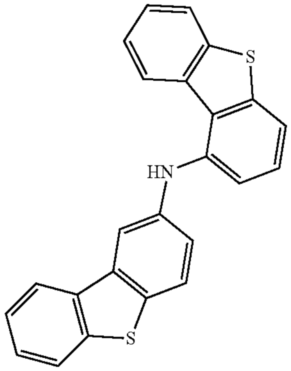

-continued
Sub 2-15
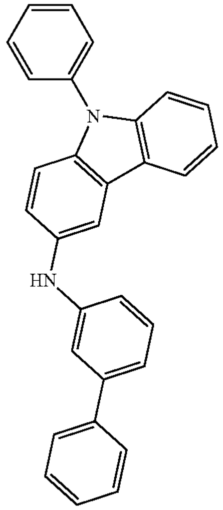
Sub 2-16
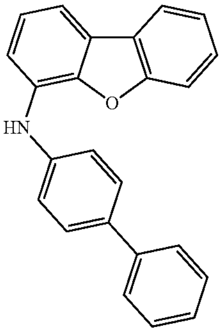
Sub 2-17
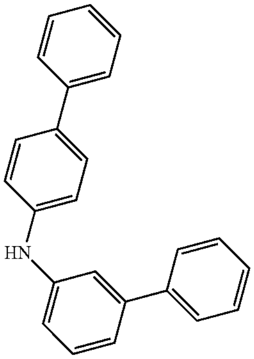
Sub 2-18
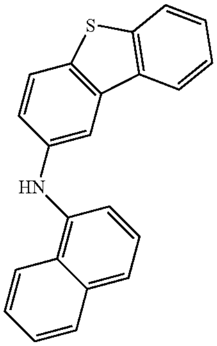
-continued
Sub 2-19
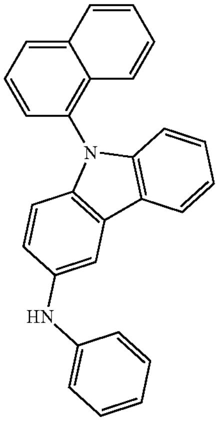
Sub 2-20
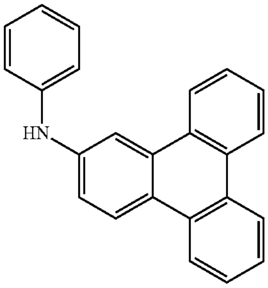
Sub 2-21
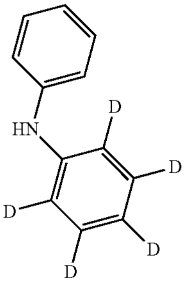
Sub 2-22
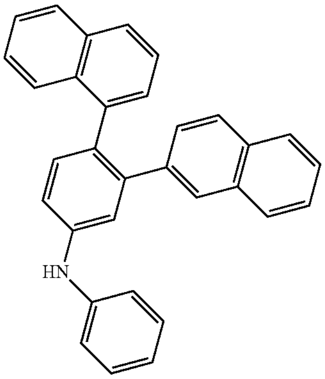

-continued
Sub 2-23
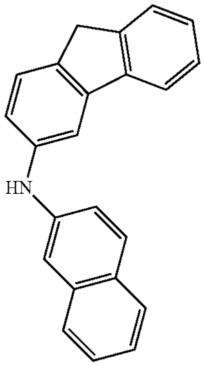
Sub 2-24
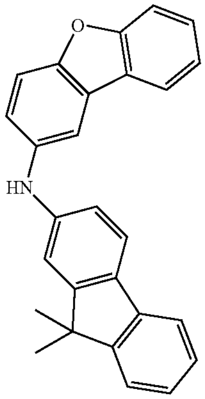
Sub 2-25
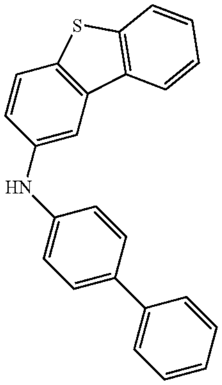
Sub 2-26
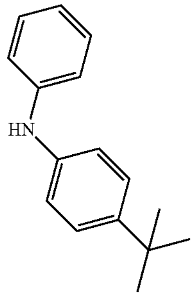
-continued
Sub 2-27
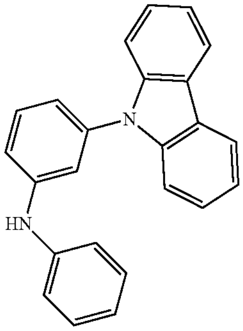
Sub 2-28
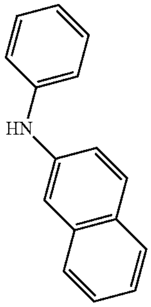
Sub 2-29
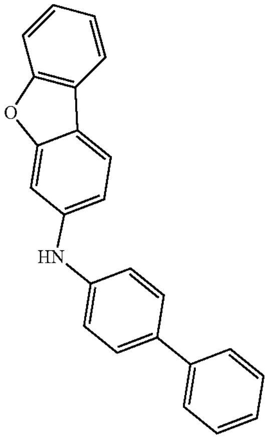
Sub 2-30
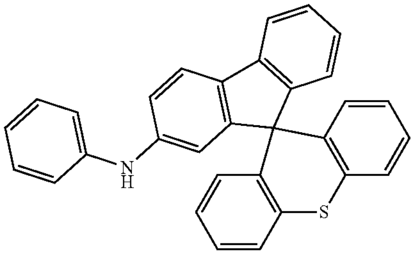
Sub 2-31
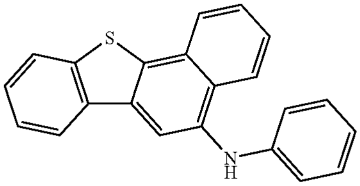

-continued
Sub 2-32
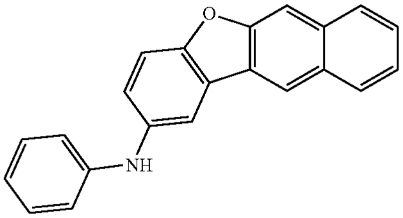
Sub 2-33
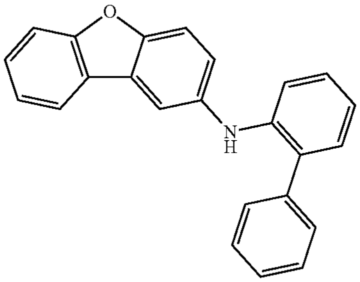
Sub 2-34
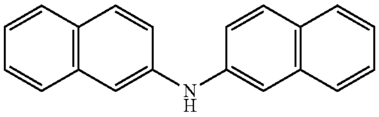
Sub 2-35
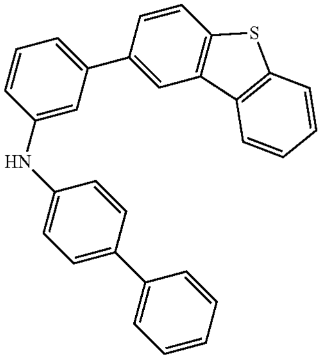
Sub 2-36
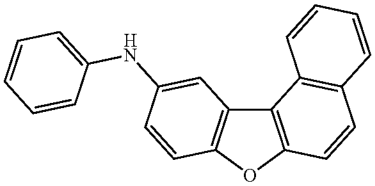
Sub 2-37
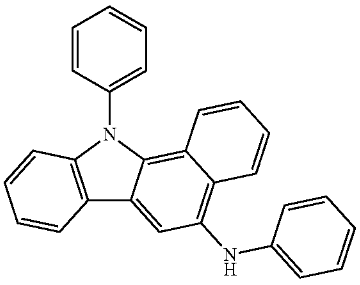
-continued
Sub 2-38
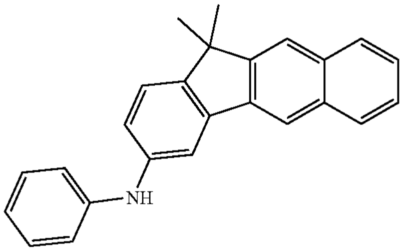
Sub 2-39
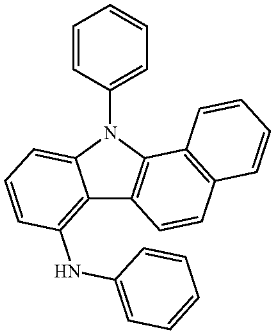
Sub 2-40
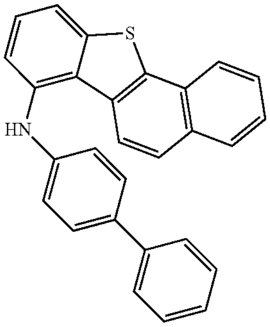
Sub 2-41
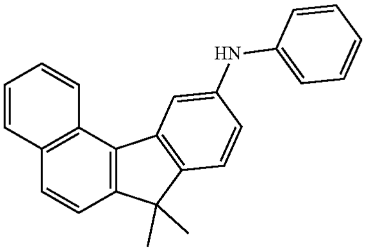
Sub 2-42
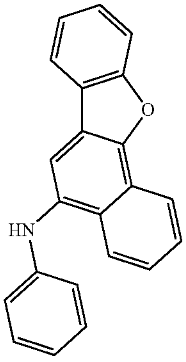

-continued
Sub 2-43
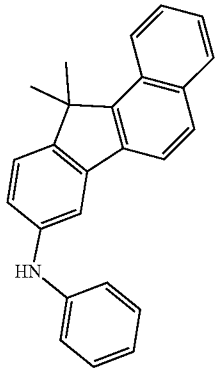
Sub 2-44
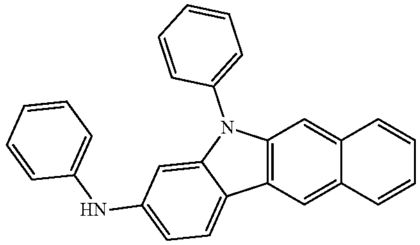
Sub 2-45
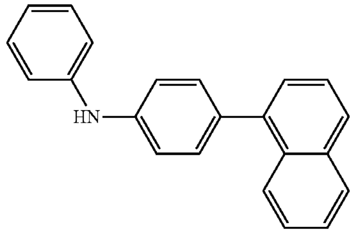
Sub 2-46
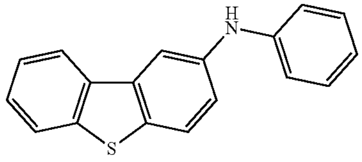
Sub 2-47
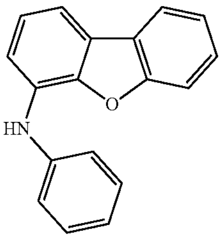
Sub 2-48
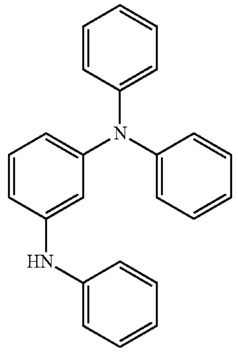
-continued
Sub 2-49
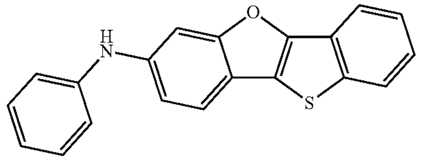
Sub 2-50
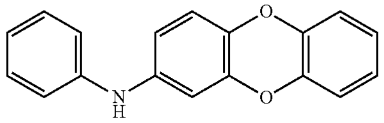
Sub 2-51
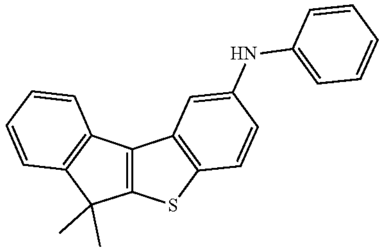
Sub 2-52
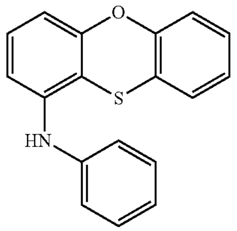
Sub 2-53
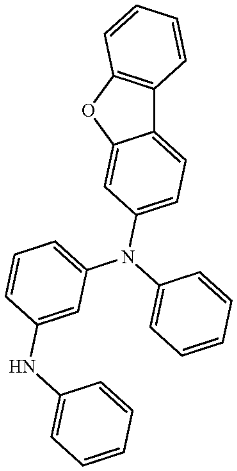
Sub 2-54
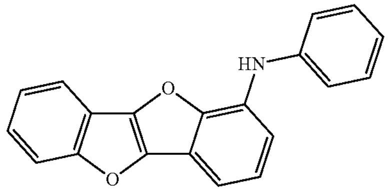

-continued
Sub 2-55
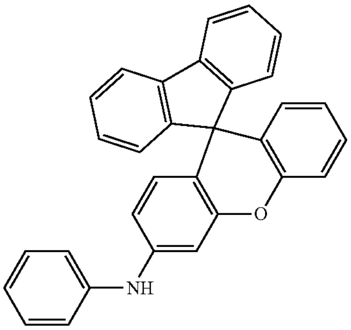
Sub 2-56
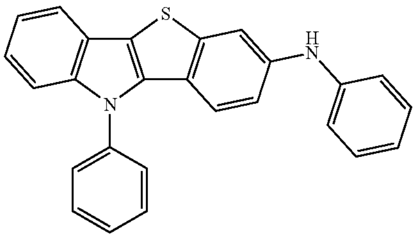
Sub 2-57
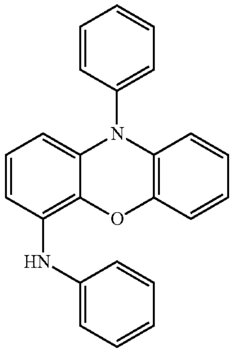
Sub 2-58
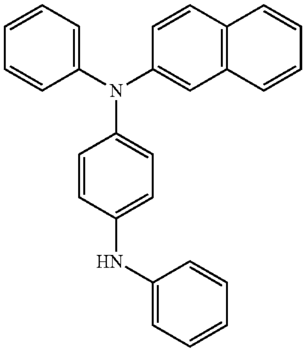
-continued
Sub 2-59
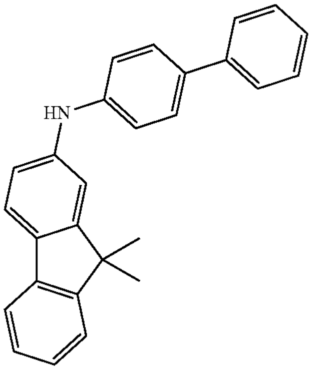
Sub 2-60
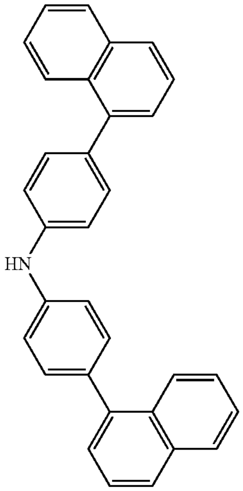
Sub 2-61
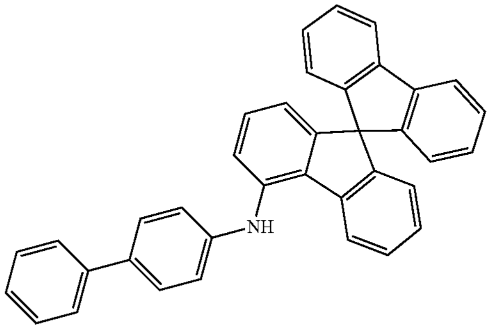
Sub 2-62
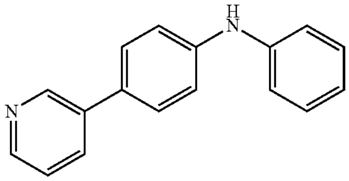

-continued
Sub 2-63
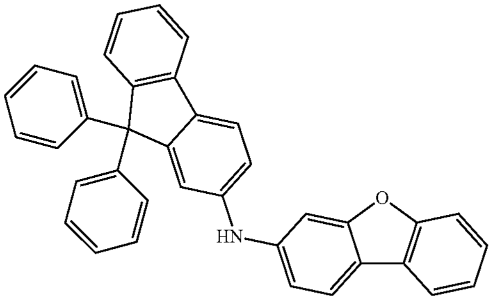
Sub 2-64
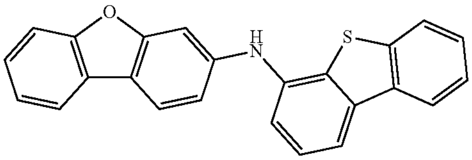
Sub 2-65
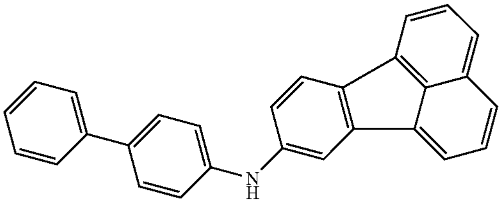
Sub 2-66
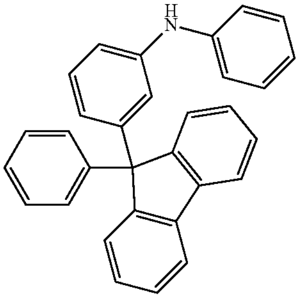
Sub 2-67
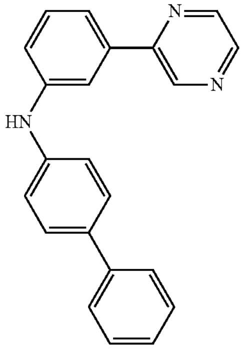
-continued
Sub 2-68
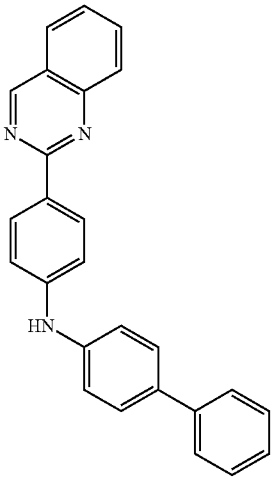
Sub 2-69
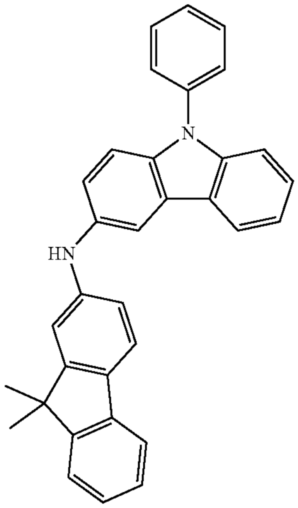
Sub 2-70
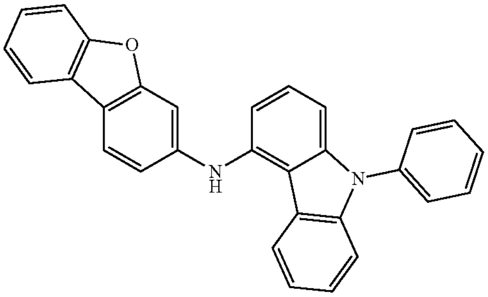
Sub 2-71
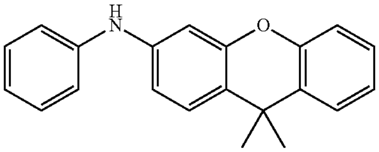

-continued
Sub 2-72
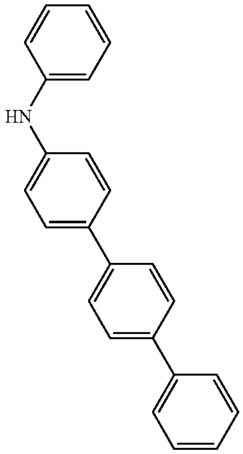
Sub 2-73
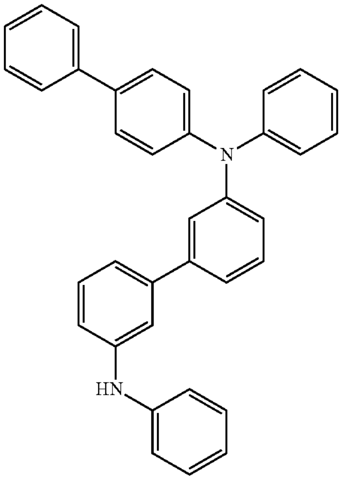
Sub 2-74
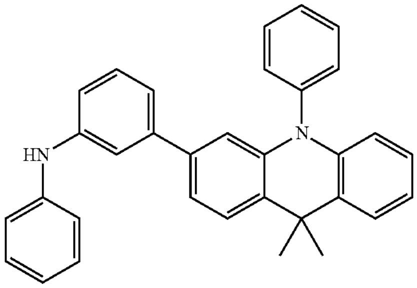
Sub 2-75
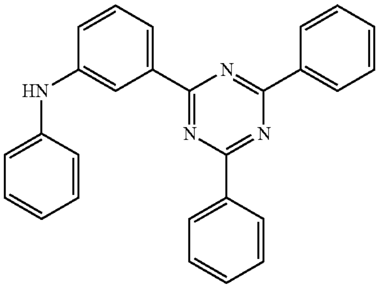
-continued
Sub 2-76
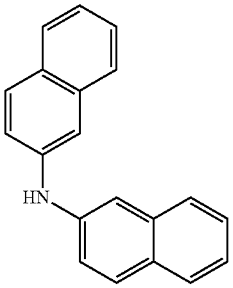
Sub 2-77
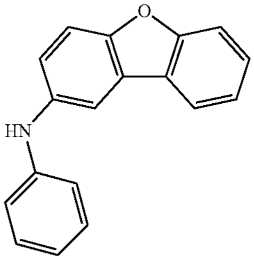
Sub 2-78
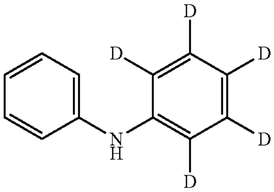
Sub 2-79
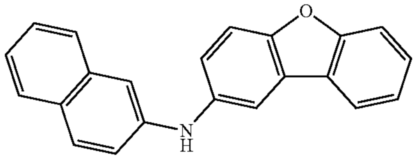
Sub 2-80
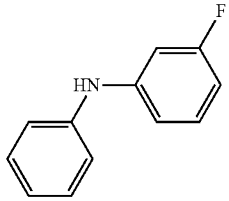
Sub 2-81
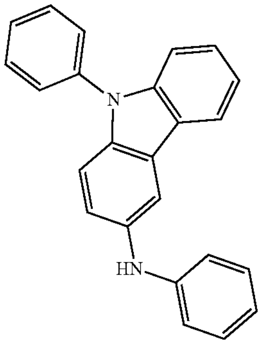

-continued
Sub 2-82
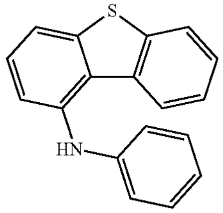
Sub 2-83
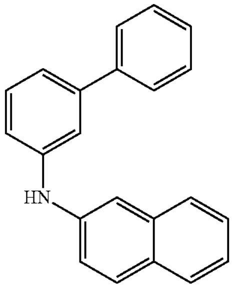
Sub 2-84
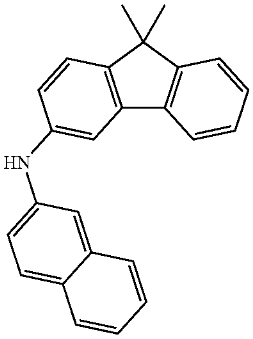
Sub 2-85
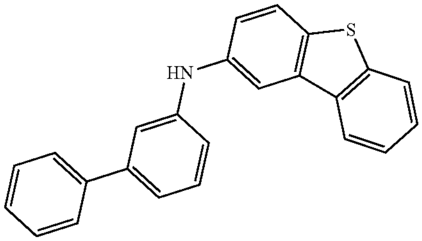
-continued
Sub 2-86
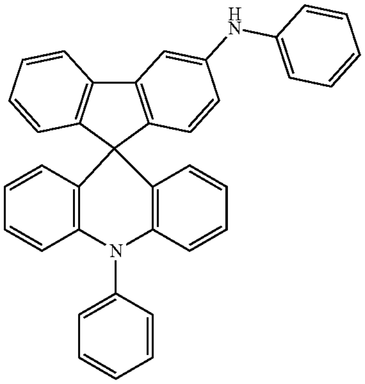
Sub 2-87
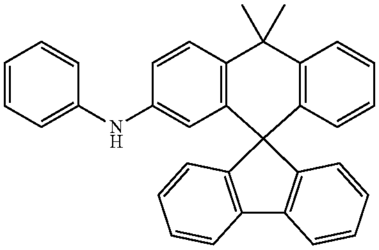
Sub 2-88
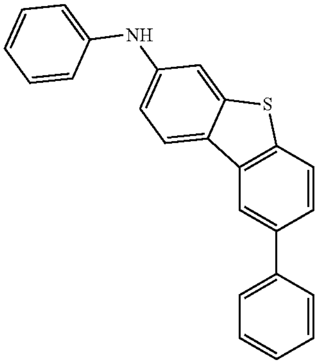
Sub 2-89
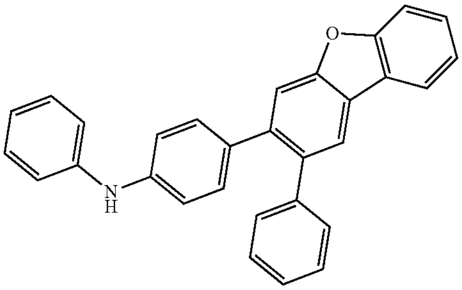
TABLE 2
| compound | FD-MS | compound | FD-MS |
|---|---|---|---|
| Sub 2-1 | m/z = 169.09($C_{12}H_{11}N$ = 169.23) | Sub 2-2 | m/z = 219.1($C_{16}H_{13}N$ = 219.29) |
| Sub 2-3 | m/z = 321.15($C_{24}H_{19}N$ = 321.42) | Sub 2-4 | m/z = 245.12($C_{18}H_{15}N$ = 245.33) |
| Sub 2-5 | m/z = 321.15($C_{24}H_{19}N$ = 321.42) | Sub 2-6 | m/z = 335.13($C_{24}H_{17}NO$ = 335.41) |
| Sub 2-7 | m/z = 309.12($C_{22}H_{15}NO$ = 309.37) | Sub 2-8 | m/z = 259.1($C_{18}H_{13}NO$ = 259.31) |
| Sub 2-9 | m/z = 269.12($C_{20}H_{15}N$ = 269.35) | Sub 2-10 | m/z = 411.16($C_{30}H_{21}NO$ = 411.5) |
| Sub 2-11 | m/z = 485.21($C_{37}H_{27}N$ = 485.63) | Sub 2-12 | m/z = 559.23($C_{43}H_{29}N$ = 559.71) |
| Sub 2-13 | m/z = 437.21($C_{33}H_{27}N$ = 437.59) | Sub 2-14 | m/z = 381.06($C_{24}H_{15}NS_2$ = 381.51) |
| Sub 2-15 | m/z = 410.18($C_{30}H_{22}N_2$ = 410.52) | Sub 2-16 | m/z = 335.13($C_{24}H_{17}NO$ = 335.41) |

TABLE 2-continued

| compound | FD-MS | compound | FD-MS |
|---|---|---|---|
| Sub 2-17 | m/z = 321.15($C_{24}H_{19}N$ = 321.42) | Sub 2-18 | m/z = 325.09($C_{22}H_{15}NS$ = 325.43) |
| Sub 2-19 | m/z = 384.16($C_{28}H_{20}N_2$ = 384.48) | Sub 2-20 | m/z = 319.14($C_{24}H_{17}N$ = 319.41) |
| Sub 2-21 | m/z = 174.12($C_{12}H_6D_5N$ = 174.26) | Sub 2-22 | m/z = 421.18($C_{32}H_{23}N$ = 421.54) |
| Sub 2-23 | m/z = 307.14($C_{23}H_{17}N$ = 307.4) | Sub 2-24 | m/z = 375.16($C_{27}H_{21}NO$ = 375.47) |
| Sub 2-25 | m/z = 351.11($C_{24}H_{17}NS$ = 351.47) | Sub 2-26 | m/z = 225.15($C_{16}H_{19}N$ = 225.34) |
| Sub 2-27 | m/z = 334.15($C_{24}H_{18}N_2$ = 334.42) | Sub 2-28 | m/z = 219.1($C_{16}H_{13}N$ = 219.29) |
| Sub 2-29 | m/z = 335.13($C_{24}H_{17}NO$ = 335.41) | Sub 2-30 | m/z = 439.14($C_{31}H_{21}NS$ = 439.58) |
| Sub 2-31 | m/z = 325.09($C_{22}H_{15}NS$ = 325.43) | Sub 2-32 | m/z = 309.12($C_{22}H_{15}NO$ = 309.37) |
| Sub 2-33 | m/z = 335.13($C_{24}H_{17}NO$ = 335.41) | Sub 2-34 | m/z = 269.12($C_{20}H_{15}N$ = 269.35) |
| Sub 2-35 | m/z = 427.14($C_{30}H_{21}NS$ = 427.57) | Sub 2-36 | m/z = 309.12($C_{22}H_{15}NO$ = 309.37) |
| Sub 2-37 | m/z = 384.16($C_{28}H_{20}N_2$ = 384.48) | Sub 2-38 | m/z = 335.17($C_{25}H_{21}N$ = 335.45) |
| Sub 2-39 | m/z = 384.16($C_{28}H_{20}N_2$ = 384.48) | Sub 2-40 | m/z = 401.12($C_{28}H_{19}NS$ = 401.53) |
| Sub 2-41 | m/z = 335.17($C_{25}H_{21}N$ = 335.45) | Sub 2-42 | m/z = 309.12($C_{22}H_{15}NO$ = 309.37) |
| Sub 2-43 | m/z = 335.17($C_{25}H_{21}N$ = 335.45) | Sub 2-44 | m/z = 384.16($C_{28}H_{20}N_2$ = 384.48) |
| Sub 2-45 | m/z = 295.14($C_{22}H_{17}N$ = 295.39) | Sub 2-46 | m/z = 275.08($C_{18}H_{13}NS$ = 275.37) |
| Sub 2-47 | m/z = 259.1($C_{18}H_{13}NO$ = 259.31) | Sub 2-48 | m/z = 336.16($C_{24}H_{20}N_2$ = 336.44) |
| Sub 2-49 | m/z = 315.07($C_{20}H_{13}NOS$ = 315.39) | Sub 2-50 | m/z = 275.09($C_{18}H_{13}NO_2$ = 275.31) |
| Sub 2-51 | m/z = 341.12($C_{23}H_{19}NS$ = 341.47) | Sub 2-52 | m/z = 291.07($C_{18}H_{13}NOS$ = 291.37) |
| Sub 2-53 | m/z = 426.17($C_{30}H_{22}N_2O$ = 426.52) | Sub 2-54 | m/z = 299.09($C_{20}H_{13}NO_2$ = 299.33) |
| Sub 2-55 | m/z = 423.16($C_{31}H_{21}NO$ = 423.52) | Sub 2-56 | m/z = 390.12($C_{26}H_{18}N_2S$ = 390.5) |
| Sub 2-57 | m/z = 350.14($C_{24}H_{18}N_2O$ = 350.42) | Sub 2-58 | m/z = 386.18($C_{28}H_{22}N_2$ = 386.5) |
| Sub 2-59 | m/z = 361.18($C_{27}H_{23}N$ = 361.49) | Sub 2-60 | m/z = 421.18($C_{32}H_{23}N$ = 421.54) |
| Sub 2-61 | m/z = 483.2($C_{37}H_{25}N$ = 483.61) | Sub 2-62 | m/z = 246.12($C_{17}H_{14}N_2$ = 246.31) |
| Sub 2-63 | m/z = 499.19($C_{37}H_{25}NO$ = 499.61) | Sub 2-64 | m/z = 365.09($C_{24}H_{15}NOS$ = 365.45) |
| Sub 2-65 | m/z = 369.15($C_{28}H_{19}N$ = 369.47) | Sub 2-66 | m/z = 409.18($C_{31}H_{23}N$ = 409.53) |
| Sub 2-67 | m/z = 323.14($C_{22}H_{17}N_3$ = 323.4) | Sub 2-68 | m/z = 373.16($C_{26}H_{19}N_3$ = 373.46) |
| Sub 2-69 | m/z = 450.21($C_{33}H_{26}N_2$ = 450.59) | Sub 2-70 | m/z = 424.16($C_{30}H_{20}N_2O$ = 424.5) |
| Sub 2-71 | m/z = 301.15($C_{21}H_{19}NO$ = 301.39) | Sub 2-72 | m/z = 321.15($C_{24}H_{19}N$ = 321.42) |
| Sub 2-73 | m/z = 488.23($C_{36}H_{28}N_2$ = 488.63) | Sub 2-74 | m/z = 452.23($C_{33}H_{28}N_2$ = 452.6) |
| Sub 2-75 | m/z = 400.17($C_{27}H_{20}N_4$ = 400.49) | Sub 2-76 | m/z = 269.12($C_{20}H_{15}N$ = 269.35) |
| Sub 2-77 | m/z = 259.1($C_{18}H_{13}NO$ = 259.31) | Sub 2-78 | m/z = 174.12($C_{12}H_6D_5N$ = 174.26) |
| Sub 2-79 | m/z = 309.12($C_{22}H_{15}NO$ = 309.37) | Sub 2-80 | m/z = 187.08($C_{12}H_{10}FN$ = 187.22) |
| Sub 2-81 | m/z = 334.15($C_{24}H_{18}N_2$ = 334.42) | Sub 2-82 | m/z = 275.08($C_{18}H_{13}NS$ = 275.37) |
| Sub 2-83 | m/z = 295.14($C_{22}H_{17}N$ = 295.39) | Sub 2-84 | m/z = 335.17($C_{25}H_{21}N$ = 335.45) |
| Sub 2-85 | m/z = 351.11($C_{24}H_{17}NS$ = 351.47) | Sub 2-86 | m/z = 498.21($C_{37}H_{26}N_2$ = 498.63) |
| Sub 2-87 | m/z = 449.21($C_{34}H_{27}N$ = 449.6) | Sub 2-88 | m/z = 351.11($C_{24}H_{17}NS$ = 351.47) |
| Sub 2-89 | m/z = 411.16($C_{30}H_{21}NO$ = 411.5) | | |

Synthesis Example of Final Products

1. Synthesis Example of 1-5

-continued

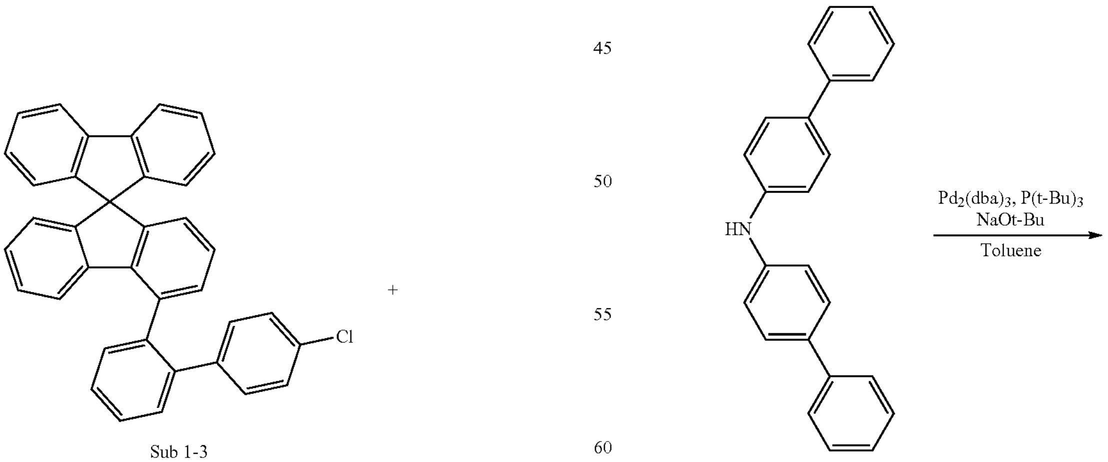

Sub 1-3

-continued

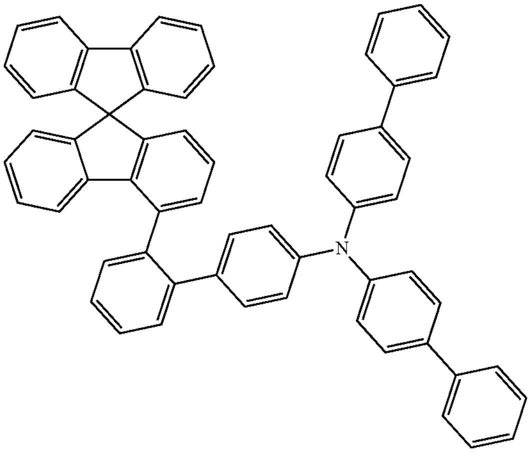

1-5

Sub 2-5 (12.8 g, 39.8 mmol), $Pd_2(dba)_3$ (1.09 g, 1.19 mmol), $P(t-Bu)_3$ (0.48 g, 2.39 mmol), NaOt-Bu (7.6 g, 79.5 mmol), Toluene (200 mL) were added to Sub 1-3 (20 g, 39.8 mmol) and reacted for 2 hours. After the reaction was completed, the organic layer was extracted with water, dried over $MgSO_4$, concentrated, and the resulting compound was recrystallized using silicagel column to obtain a product 1-5 (21.9 g, yield: 70%).

2. Synthesis Example of 1-6

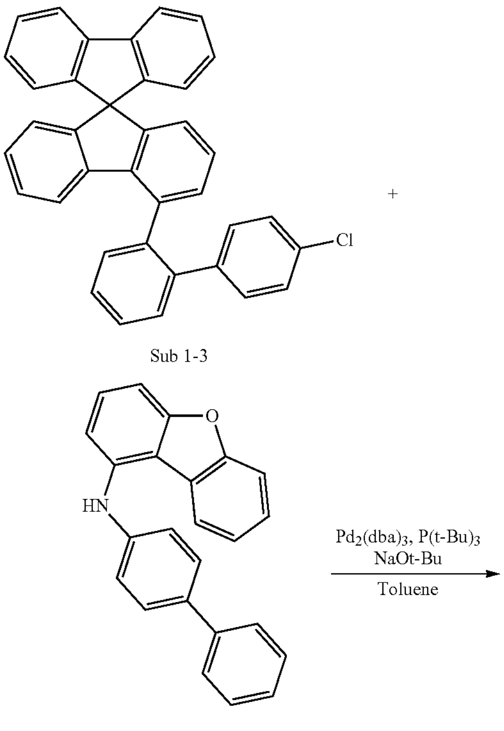

Sub 1-3

Sub 2-6

-continued

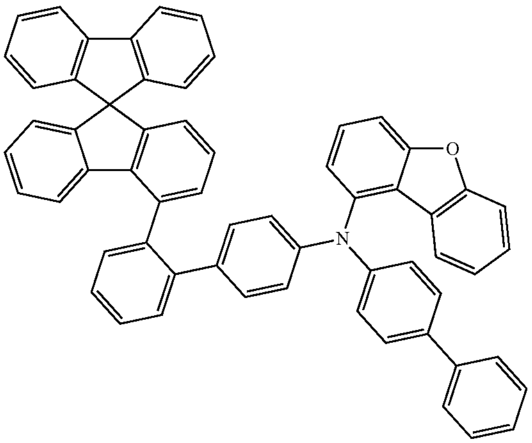

1-6

Sub 2-6 (13.3 g, 39.8 mmol), $Pd_2(dba)_3$ (1.09 g, 1.19 mmol), $P(t-Bu)_3$ (0.48 g, 2.39 mmol), NaOt-Bu (7.6 g, 79.5 mmol), Toluene (200 mL) were added to Sub 1-3 (20 g, 39.8 mmol) and reacted for 2 hours. After the reaction was completed, the organic layer was extracted with water, dried over $MgSO_4$, concentrated, and the resulting compound was recrystallized using silicagel column to obtain a product 1-6 (22 g, yield: 69%).

3. Synthesis Example of 1-13

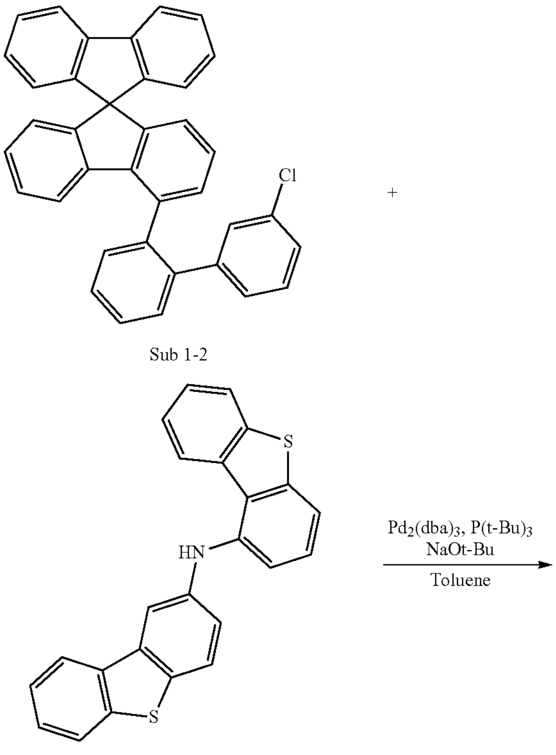

Sub 1-2

Sub 2-14

-continued

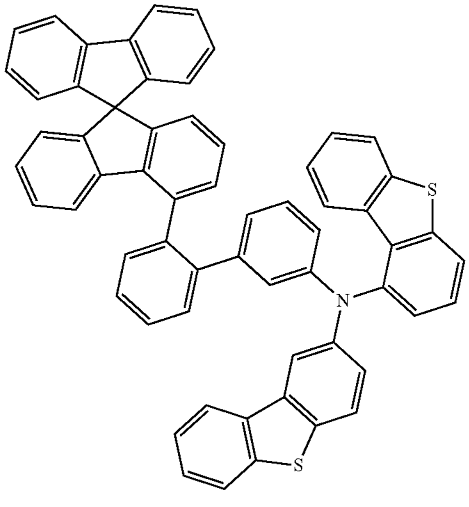

1-13

Sub 2-14 (15.2 g, 39.8 mmol), $Pd_2(dba)_3$ (1.09 g, 1.19 mmol), $P(t-Bu)_3$ (0.48 g, 2.39 mmol), NaOt-Bu (7.6 g, 79.5 mmol), Toluene (200 mL) were added to Sub 1-2 (20 g, 39.8 mmol) and reacted for 2 hours. After the reaction was completed, the organic layer was extracted with water, dried over $MgSO_4$, concentrated, and the resulting compound was recrystallized using silicagel column to obtain a product 1-13 (22.6 g, yield: 67%).

4. Synthesis Example of 1-25

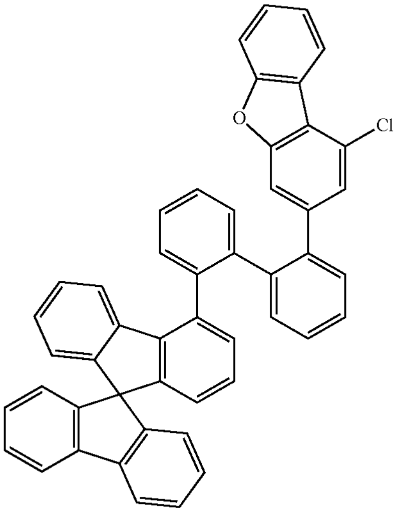

Sub 1-7

+

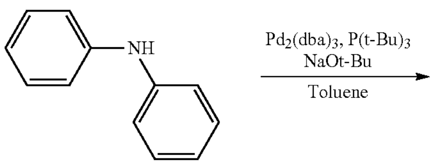

Sub 2-1

-continued

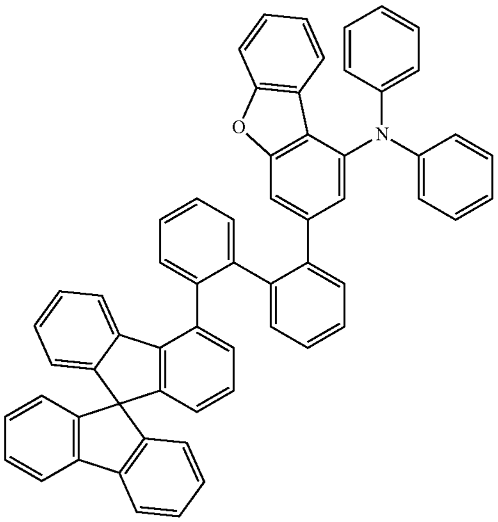

1-25

Sub 2-1 (5.1 g, 29.9 mmol), $Pd_2(dba)_3$ (0.82 g, 0.9 mmol), $P(t-Bu)_3$ (0.36 g, 1.79 mmol), NaOt-Bu (5.7 g, 59.8 mmol), Toluene (150 mL) were added to Sub 1-7 (20 g, 29.9 mmol) and reacted for 2 hours. After the reaction was completed, the organic layer was extracted with water, dried over $MgSO_4$, concentrated, and the resulting compound was recrystallized using silicagel column to obtain a product 1-25 (22.6 g, yield: 67%).

5. Synthesis Example of 1-60

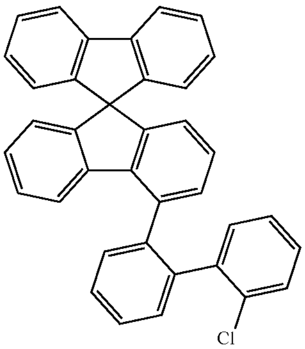

Sub 1-1

+

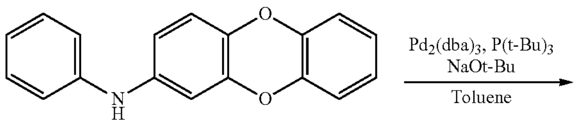

Sub 2-50

-continued

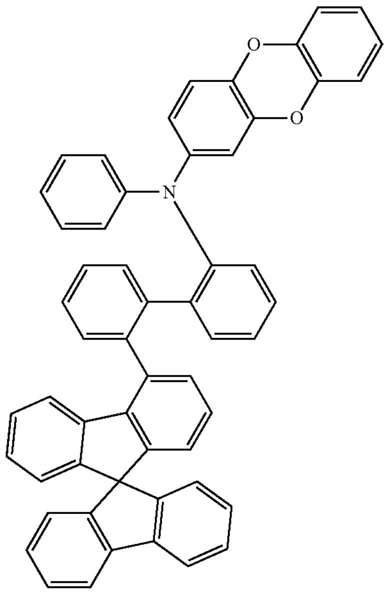

1-60

-continued

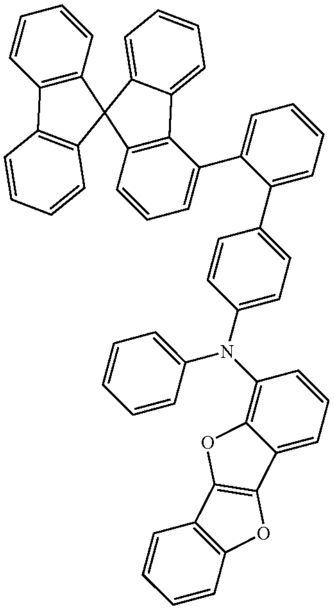

1-64

Sub 2-50 (10.9 g, 39.8 mmol), $Pd_2(dba)_3$ (1.09 g, 1.19 mmol), $P(t-Bu)_3$ (0.48 g, 2.39 mmol), NaOt-Bu (7.6 g, 79.5 mmol), Toluene (200 mL) were added to Sub 1-1 (20 g, 39.8 mmol) and reacted for 2 hours. After the reaction was completed, the organic layer was extracted with water, dried over $MgSO_4$, concentrated, and the resulting compound was recrystallized using silicagel column to obtain a product 1-60 (20.1 g, yield: 68%).

6. Synthesis Example of 1-64

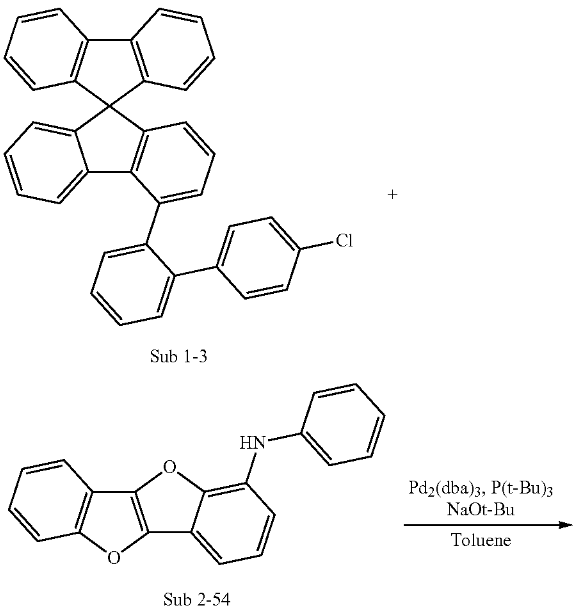

Sub 1-3

Sub 2-54

Sub 2-54 (11.9 g, 39.8 mmol), $Pd_2(dba)_3$ (1.09 g, 1.19 mmol), $P(t-Bu)_3$ (0.48 g, 2.39 mmol), NaOt-Bu (7.6 g, 79.5 mmol), Toluene (200 mL) were added to Sub 1-3 (20 g, 39.8 mmol) and reacted for 2 hours. After the reaction was completed, the organic layer was extracted with water, dried over $MgSO_4$, concentrated, and the resulting compound was recrystallized using silicagel column to obtain a product 1-64 (21.6 g, yield: 71%).

7. Synthesis Example of 1-91

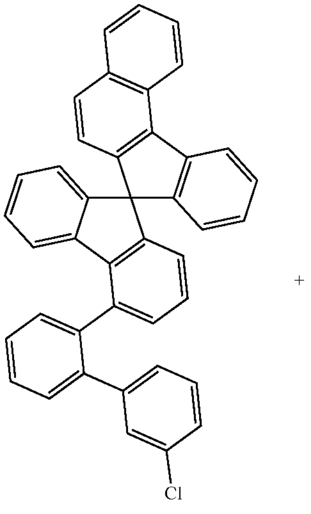

Sub 1-19

-continued

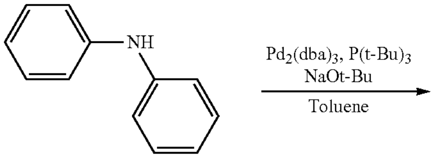

Sub 2-1

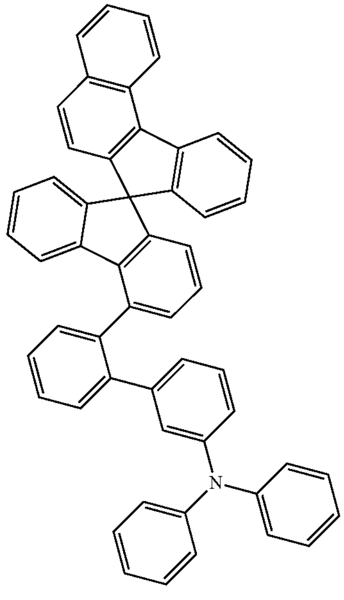

1-91

Sub 2-1 (6.1 g, 36.2 mmol), $Pd_2(dba)_3$ (0.99 g, 1.08 mmol), $P(t\text{-}Bu)_3$ (0.44 g, 2.17 mmol), NaOt-Bu (7 g, 72.3 mmol), Toluene (180 mL) were added to Sub 1-19 (20 g, 36.2 mmol) and reacted for 2 hours. After the reaction was completed, the organic layer was extracted with water, dried over $MgSO_4$, concentrated, and the resulting compound was recrystallized using silicagel column to obtain a product 1-91 (17.4 g, yield: 70%).

8. Synthesis Example of 1-100

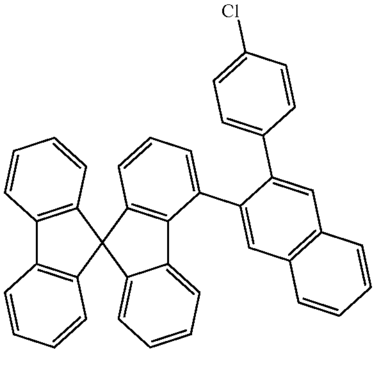

Sub 1-30

+

-continued

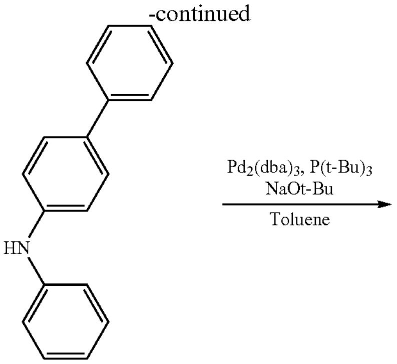

Sub 2-4

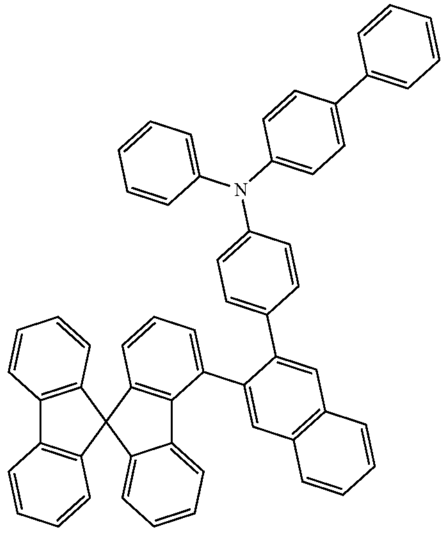

1-100

Sub 2-4 (8.9 g, 36.2 mmol), $Pd_2(dba)_3$ (0.99 g, 1.08 mmol), $P(t\text{-}Bu)_3$ (0.44 g, 2.17 mmol), NaOt-Bu (7 g, 72.3 mmol), Toluene (180 mL) were added to Sub 1-30 (20 g, 36.2 mmol) and reacted for 2 hours. After the reaction was completed, the organic layer was extracted with water, dried over $MgSO_4$, concentrated, and the resulting compound was recrystallized using silicagel column to obtain a product 1-100 (19.6 g, yield: 71%).

9. Synthesis Example of 1-113

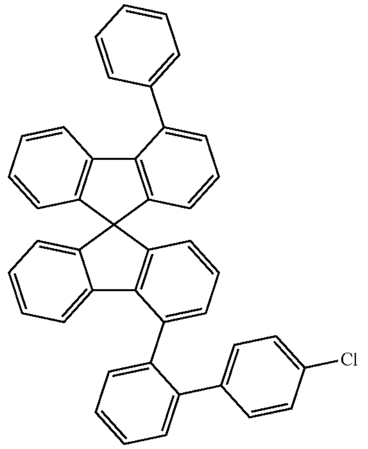

Sub 1-36

+

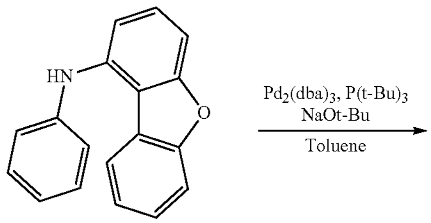

Sub 2-8

-continued

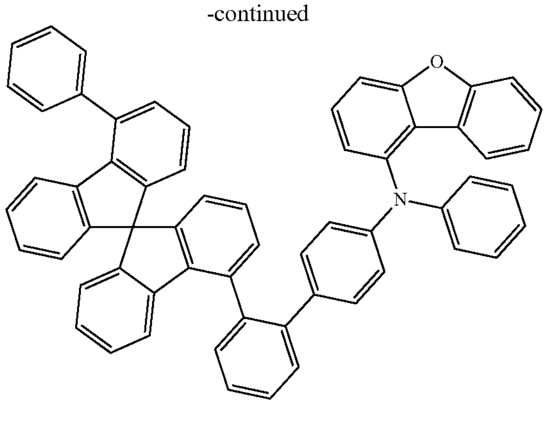

1-113

Sub 2-8 (9 g, 34.5 mmol), $Pd_2(dba)_3$ (0.95 g, 1.04 mmol), $P(t-Bu)_3$ (0.42 g, 2.07 mmol), NaOt-Bu (6.6 g, 69.1 mmol), Toluene (180 mL) were added to Sub 1-36 (20 g, 34.5 mmol) and reacted for 2 hours. After the reaction was completed, the organic layer was extracted with water, dried over $MgSO_4$, concentrated, and the resulting compound was recrystallized using silicagel column to obtain a product 1-113 (19.1 g, yield: 69%).

Meanwhile, FD-MS values of compounds 1-1 to 1-115 of the present invention prepared according to the above synthesis examples are shown in Table 3.

TABLE 3

| compound | FD-MS | compound | FD-MS |
|---|---|---|---|
| 1-1 | m/z = 635.26($C_{49}H_{33}N$ = 635.81) | 1-2 | m/z = 685.28($C_{53}H_{35}N$ = 685.87) |
| 1-3 | m/z = 787.32($C_{61}H_{41}N$ = 788.01) | 1-4 | m/z = 711.29($C_{55}H_{37}N$ = 711.91) |
| 1-5 | m/z = 787.32($C_{61}H_{41}N$ = 788.01) | 1-6 | m/z = 801.3($C_{61}H_{39}NO$ = 801.99) |
| 1-7 | m/z = 775.29($C_{59}H_{37}NO$ = 775.95) | 1-8 | m/z = 725.27($C_{55}H_{35}NO$ = 725.89) |
| 1-9 | m/z = 735.29($C_{57}H_{37}N$ = 735.93) | 1-10 | m/z = 711.29($C_{55}H_{37}N$ = 711.91) |
| 1-11 | m/z = 877.33($C_{67}H_{43}NO$ = 878.09) | 1-12 | m/z = 903.39($C_{70}H_{49}N$ = 904.17) |
| 1-13 | m/z = 847.24($C_{61}H_{37}NS_2$ = 848.09) | 1-14 | m/z = 876.35($C_{67}H_{44}N_2$ = 877.1) |
| 1-15 | m/z = 711.29($C_{55}H_{37}N$ = 711.91) | 1-16 | m/z = 951.39($C_{74}H_{49}N$ = 952.21) |
| 1-17 | m/z = 1025.4($C_{80}H_{51}N$ = 1026.3) | 1-18 | m/z = 791.26($C_{59}H_{37}NS$ = 792.01) |
| 1-19 | m/z = 850.33($C_{65}H_{42}N_2$ = 851.07) | 1-20 | m/z = 861.34($C_{67}H_{43}N$ = 862.09) |
| 1-21 | m/z = 801.3($C_{61}H_{39}NO$ = 801.99) | 1-22 | m/z = 787.32($C_{61}H_{41}N$ = 788.01) |
| 1-23 | m/z = 841.33($C_{64}H_{43}NO$ = 842.05) | 1-24 | m/z = 817.28($C_{61}H_{39}NS$ = 818.05) |
| 1-25 | m/z = 801.3($C_{61}H_{39}NO$ = 801.99) | 1-26 | m/z = 640.29($C_{49}H_{28}D_5N$ = 640.84) |
| 1-27 | m/z = 887.36($C_{69}H_{45}N$ = 888.13) | 1-28 | m/z = 773.31($C_{60}H_{39}N$ = 773.98) |
| 1-29 | m/z = 801.3($C_{61}H_{39}NO$ = 801.99) | 1-30 | m/z = 761.31($C_{59}H_{39}N$ = 761.97) |
| 1-31 | m/z = 691.32($C_{53}H_{41}N$ = 691.92) | 1-32 | m/z = 800.32($C_{61}H_{40}N_2$ = 801.01) |
| 1-33 | m/z = 715.29($C_{54}H_{37}NO$ = 715.9) | 1-34 | m/z = 703.27($C_{53}H_{34}FN$ = 703.86) |
| 1-35 | m/z = 817.28($C_{61}H_{39}NS$ = 818.05) | 1-36 | m/z = 633.25($C_{49}H_{31}N$ = 633.79) |
| 1-37 | m/z = 801.3($C_{61}H_{39}NO$ = 801.99) | 1-38 | m/z = 735.29($C_{57}H_{37}N$ = 735.93) |
| 1-39 | m/z = 893.31($C_{67}H_{43}NS$ = 894.15) | 1-40 | m/z = 787.32($C_{61}H_{41}N$ = 788.01) |
| 1-41 | m/z = 675.29($C_{52}H_{37}N$ = 675.88) | 1-42 | m/z = 791.26($C_{59}H_{37}NS$ = 792.01) |
| 1-43 | m/z = 775.29($C_{59}H_{37}NO$ = 775.95) | 1-44 | m/z = 867.3($C_{65}H_{41}NS$ = 868.11) |
| 1-45 | m/z = 761.31($C_{59}H_{39}N$ = 761.97) | 1-46 | m/z = 775.29($C_{59}H_{37}NO$ = 775.95) |
| 1-47 | m/z = 850.33($C_{65}H_{42}N_2$ = 851.07) | 1-48 | m/z = 801.34($C_{62}H_{43}N$ = 802.03) |
| 1-49 | m/z = 850.33($C_{65}H_{42}N_2$ = 851.07) | 1-50 | m/z = 837.34($C_{65}H_{43}N$ = 838.07) |
| 1-51 | m/z = 801.34($C_{62}H_{43}N$ = 802.03) | 1-52 | m/z = 775.29($C_{59}H_{37}NO$ = 775.95) |
| 1-53 | m/z = 801.34($C_{62}H_{43}N$ = 802.03) | 1-54 | m/z = 850.33($C_{65}H_{42}N_2$ = 851.07) |
| 1-55 | m/z = 817.28($C_{61}H_{39}NS$ = 818.05) | 1-56 | m/z = 741.25($C_{55}H_{35}NS$ = 741.95) |
| 1-57 | m/z = 725.27($C_{55}H_{35}NO$ = 725.89) | 1-58 | m/z = 802.33($C_{61}H_{42}N_2$ = 803.02) |
| 1-59 | m/z = 781.24($C_{57}H_{35}NOS$ = 781.97) | 1-60 | m/z = 741.27($C_{55}H_{35}NO_2$ = 741.89) |
| 1-61 | m/z = 807.3($C_{60}H_{41}NS$ = 808.06) | 1-62 | m/z = 757.24($C_{55}H_{35}NOS$ = 757.95) |
| 1-63 | m/z = 892.35($C_{67}H_{44}N_2O$ = 893.1) | 1-64 | m/z = 765.27($C_{57}H_{35}NO_2$ = 765.91) |
| 1-65 | m/z = 889.33($C_{68}H_{43}NO$ = 890.1) | 1-66 | m/z = 856.29($C_{63}H_{40}N_2S$ = 857.09) |
| 1-67 | m/z = 816.31($C_{61}H_{40}N_2O$ = 817) | 1-68 | m/z = 852.35($C_{65}H_{44}N_2$ = 853.08) |
| 1-69 | m/z = 761.31($C_{59}H_{39}N$ = 761.97) | 1-70 | m/z = 905.31($C_{68}H_{43}NS$ = 906.16) |

TABLE 3-continued

| compound | FD-MS | compound | FD-MS |
|---|---|---|---|
| 1-71 | m/z = 827.36($C_{64}H_{45}N$ = 828.07) | 1-72 | m/z = 887.36($C_{69}H_{45}N$ = 888.13) |
| 1-73 | m/z = 949.37($C_{74}H_{47}N$ = 950.2) | 1-74 | m/z = 660.26($C_{50}H_{32}N_2$ = 660.82) |
| 1-75 | m/z = 712.29($C_{54}H_{36}N_2$ = 712.9) | 1-76 | m/z = 965.37($C_{74}H_{47}NO$ = 966.2) |
| 1-77 | m/z = 831.26($C_{61}H_{37}NOS$ = 832.03) | 1-78 | m/z = 835.32($C_{65}H_{41}N$ = 836.05) |
| 1-79 | m/z = 916.38($C_{70}H_{48}N_2$ = 917.17) | 1-80 | m/z = 890.33($C_{67}H_{42}N_2O$ = 891.09) |
| 1-81 | m/z = 875.36($C_{68}H_{45}N$ = 876.12) | 1-82 | m/z = 789.31($C_{59}H_{39}N_3$ = 789.98) |
| 1-83 | m/z = 839.33($C_{63}H_{41}N_3$ = 840.04) | 1-84 | m/z = 866.34($C_{64}H_{42}N_4$ = 867.07) |
| 1-85 | m/z = 811.32($C_{63}H_{41}N$ = 812.03) | 1-86 | m/z = 767.32($C_{58}H_{41}NO$ = 767.97) |
| 1-87 | m/z = 787.32($C_{61}H_{41}N$ = 788.01) | 1-88 | m/z = 954.4($C_{73}H_{50}N_2$ = 955.22) |
| 1-89 | m/z = 918.4($C_{70}H_{50}N_2$ = 919.18) | 1-90 | m/z = 775.29($C_{59}H_{37}NO$ = 775.95) |
| 1-91 | m/z = 685.28($C_{53}H_{35}N$ = 685.87) | 1-92 | m/z = 761.31($C_{59}H_{39}N$ = 761.97) |
| 1-93 | m/z = 785.31($C_{61}H_{39}N$ = 785.99) | 1-94 | m/z = 775.29($C_{59}H_{37}NO$ = 775.95) |
| 1-95 | m/z = 690.31($C_{53}H_{30}D_5N$ = 690.9) | 1-96 | m/z = 703.27($C_{53}H_{34}FN$ = 703.86) |
| 1-97 | m/z = 837.34($C_{65}H_{43}N$ = 838.07) | 1-98 | m/z = 851.36($C_{66}H_{45}N$ = 852.09) |
| 1-99 | m/z = 867.3($C_{65}H_{41}NS$ = 868.11) | 1-100 | m/z = 761.31($C_{59}H_{39}N$ = 761.97) |
| 1-101 | m/z = 741.34($C_{57}H_{43}N$ = 741.98) | 1-102 | m/z = 837.34($C_{65}H_{43}N$ = 838.07) |
| 1-103 | m/z = 811.32($C_{63}H_{41}N$ = 812.03) | 1-104 | m/z = 893.31($C_{67}H_{43}NS$ = 894.15) |
| 1-105 | m/z = 787.32($C_{61}H_{41}N$ = 788.01) | 1-106 | m/z = 775.29($C_{59}H_{37}NO$ = 775.95) |
| 1-107 | m/z = 876.35($C_{67}H_{44}N_2$ = 877.1) | 1-108 | m/z = 791.26($C_{59}H_{37}NS$ = 792.01) |
| 1-109 | m/z = 781.33($C_{59}H_{43}NO$ = 782) | 1-110 | m/z = 689.3($C_{53}H_{31}D_4N$ = 689.89) |
| 1-111 | m/z = 964.38($C_{74}H_{48}N_2$ = 965.21) | 1-112 | m/z = 915.39($C_{71}H_{49}N$ = 916.18) |
| 1-113 | m/z = 801.3($C_{61}H_{39}NO$ = 801.99) | 1-114 | m/z = 817.28($C_{61}H_{39}NS$ = 818.05) |
| 1-115 | m/z = 877.33($C_{67}H_{43}NO$ = 878.09) | | |

Evaluation of Manufacture of Organic Electronic Element

[Example 1] Blue Organic Light Emitting Diode (Emitting Auxiliary Layer)

After vacuum deposition of 2-TNATA to a thickness of 60 nm on the ITO layer (anode) formed on the glass substrate to form a hole injection layer, NPB was vacuum-deposited on the hole injection layer to a thickness of 60 nm to form a hole transport layer. Then, after vacuum deposition of the compound 1-4 of the present invention to a thickness of 20 nm on the hole transport layer to form an emitting auxiliary layer, 9,10-di(naphthalen-2-yl)anthracene as a host and BD-052X (manufactured by Idemitsu Kosan) as a dopant were used in a weight ratio of 96:4 on the emitting auxiliary layer to form an emitting layer with a thickness of 30 nm. Then, BAlq was vacuum-deposited to a thickness of 10 nm on the emitting layer to form a hole blocking layer, Tris(8-quinolinol)aluminum (hereinafter abbreviated as $Alq_3$) was vacuum-deposited on the hole blocking layer to a thickness of 40 nm to form an electron transport layer. Thereafter, LiF was deposited to a thickness of 0.2 nm to form an electron injection layer, then, Al was deposited to a thickness of 150 nm to form a cathode, thereby manufacturing an organic electroluminescent device.

[Example 2] to [Example 15]

An organic electroluminescent device was manufactured in the same manner as in Example 1, except that the compound of the present invention shown in Table 4 was used instead of Compound 1-4 as a material of the emitting auxiliary layer.

Comparative Example 1

An organic electroluminescent device was manufactured in the same manner as in Example 1, except that the emitting auxiliary layer was not formed.

[Comparative Example 2] to [Comparative Example 3]

An organic electroluminescent device was manufactured in the same manner as in Example 1, except that the following comparative compound A or B was used instead of the compound 1-4 of the present invention as a material of the emitting auxiliary layer.

<comparative compound A>

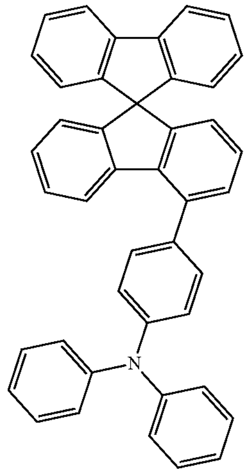

<comparative compound B>

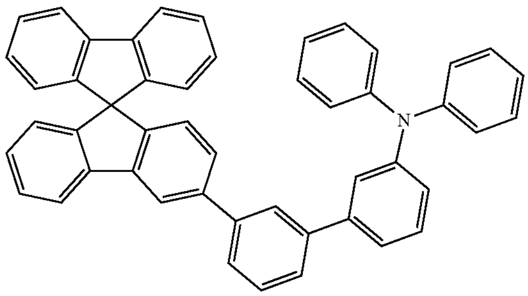

By applying a forward bias DC voltage to the organic electroluminescent devices manufactured by Examples 1 to 15 and Comparative Examples 1 to 3 of the present invention, the electroluminescence (EL) characteristics were measured with PR-650 of photoresearch, The T95 lifetime was measured with a lifetime measuring device manufactured by McScience at 500 cd/$m^2$ standard luminance. The measurement results are shown in Table 4.

TABLE 4

| | compound | Voltage (V) | Current Density (mA/$cm^2$) | Brightness (cd/$m^2$) | Efficiency (cd/A) | T(95) | CIE X | CIE Y |
|---|---|---|---|---|---|---|---|---|
| comparative example(1) | — | 5.7 | 14.3 | 500 | 3.5 | 52.4 | 0.131 | 0.1 |
| comparative example(2) | comparative compound A | 5.4 | 10.6 | 500 | 4.7 | 86.4 | 0.131 | 0.1 |
| comparative example(3) | comparative compound B | 5.5 | 10.4 | 500 | 4.8 | 90.9 | 0.131 | 0.1 |
| example(1) | 1-4 | 4.7 | 8.3 | 500 | 6 | 109.9 | 0.131 | 0.1 |
| example(2) | 1-5 | 4.6 | 8.2 | 500 | 6.1 | 111.4 | 0.131 | 0.1 |
| example(3) | 1-6 | 4.5 | 7.9 | 500 | 6.3 | 112.3 | 0.13 | 0.1 |
| example(4) | 1-7 | 4.6 | 8.5 | 500 | 5.9 | 109.2 | 0.132 | 0.1 |
| example(5) | 1-11 | 4.7 | 8.5 | 500 | 5.9 | 109.5 | 0.131 | 0.1 |
| example(6) | 1-43 | 4.7 | 8.6 | 500 | 5.8 | 108.3 | 0.131 | 0.1 |
| example(7) | 1-59 | 4.8 | 8.8 | 500 | 5.7 | 107.9 | 0.132 | 0.1 |
| example(8) | 1-60 | 4.7 | 8.5 | 500 | 5.9 | 108.8 | 0.131 | 0.1 |
| example(9) | 1-65 | 4.7 | 8.9 | 500 | 5.6 | 107.6 | 0.132 | 0.1 |
| example(10) | 1-71 | 4.7 | 8.6 | 500 | 5.8 | 108.2 | 0.132 | 0.1 |
| example(11) | 1-91 | 4.8 | 9.4 | 500 | 5.3 | 106 | 0.131 | 0.1 |
| example(12) | 1-92 | 4.9 | 9.4 | 500 | 5.3 | 105.7 | 0.131 | 0.1 |
| example(13) | 1-100 | 4.8 | 9.3 | 500 | 5.4 | 106.5 | 0.13 | 0.1 |
| example(14) | 1-108 | 4.7 | 9.3 | 500 | 5.4 | 107.8 | 0.132 | 0.1 |
| example(15) | 1-113 | 4.7 | 9.1 | 500 | 5.5 | 108.1 | 0.131 | 0.1 |

As can be seen from the results in Table 4, when a blue organic light emitting diode is manufactured by using the material for an organic light emitting device of the present invention as an emitting auxiliary layer material, the driving voltage of the organic electroluminescent device could be lowered and the luminous efficiency and lifespan were significantly improved compared to Comparative Example 1 in which the emitting auxiliary layer was not formed and Comparative Examples 2 and 3 using Comparative Compounds A and B as emitting auxiliary layer materials More specifically, Compared to Comparative Example 1 in which the emitting auxiliary layer was not formed, the device results of Comparative Examples 2 and 3 in which the emitting auxiliary layer was formed using Comparative Compounds A and B having similar components to the compound of the present invention showed improved values.

The compound of the present invention, Comparative Compound A, and Comparative Compound B are identical in that 9,9'-spirobi[fluorene] is substituted with an arylene group and an amino group is substituted with the arylene group, but there is a difference in that, in the compound of the present invention a 1,1'-biphenyl moiety is substituted as an arylene group at the 4th position of 9,9'-spirobi[fluorene] and the phenyl bonded to the amino group is substituted with 9,9'-spirobi[fluorene] and the ortho position based on the phenyl bonded to 9,9'-spirobi[fluorene] among 1,1'-biphenyl.

Accordingly, looking at the device results of Comparative Examples and Examples, it can be seen that, although Comparative Compounds A and B and the compounds of the present invention are composed of similar components, the physical properties of the compounds are significantly different depending on the structure of the arylene group and the substitution position of the arylene group. As in the compound of the present invention, a 1,1'-biphenyl moiety is substituted as an arylene group at the 4th position of 9,9'-spirobi[fluorene], and in 1,1'-biphenyl, phenyl bonded to an amino group based on phenyl bonded to 9,9'-spirobi[fluorene] is substituted with 9,9'-spirobi[fluorene] and ortho positions, it can be seen that the physical properties of the compound, such as hole characteristics, light efficiency characteristics, energy levels (LUMO, HOMO level, T1 level), hole injection & mobility characteristics, and electron blocking characteristics are more suitable for the blue emitting auxiliary layer, and thus the device results of Examples 1 to 15, which are completely different from the device properties of Comparative Examples 2 and 3, can be derived.

In addition, in the evaluation results of the above-described device fabrication, the device characteristics in which the compound of the present invention is applied to the emitting auxiliary layer has been described, but the compound of the present invention can be applied to one or more of the emitting layer, the hole transport layer, the emitting auxiliary layer, and the capping layer.

Although exemplary embodiments of the present invention have been described for illustrative purposes, those skilled in the art will appreciate that various modifications, additions and substitutions are possible, without departing from the scope and spirit of the invention as disclosed in the accompanying claims. Therefore, the embodiment disclosed in the present invention is intended to illustrate the scope of the technical idea of the present invention, and the scope of the present invention is not limited by the embodiment. The scope of the present invention shall be construed on the basis of the accompanying claims, and it shall be construed that all of the technical ideas included within the scope equivalent to the claims belong to the present invention.

INDUSTRIAL APPLICABILITY

According to the present invention, it is possible to manufacture an organic device having excellent device characteristics of high luminance, high light emission and long lifespan, and thus there is industrial applicability.

What is claimed:

1. A compound represented by Formula (1):

Formula (1)

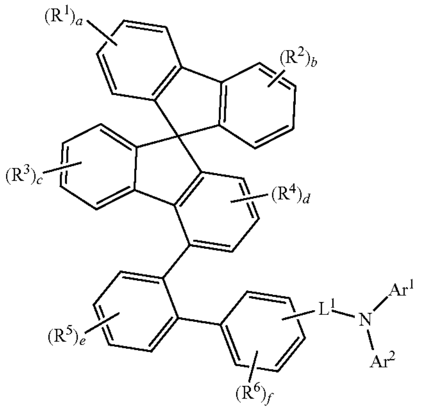

wherein:

1) a, b, c, e and f are each independently an integer of 0 to 4, and d is an integer of 1 to 3, 2) $R^1$, $R^2$, $R^3$, $R^4$, $R^5$ and $R^6$ are each the same or different, and are each independently selected from the group consisting of hydrogen; deuterium; tritium; halogen; cyano group; nitro group; $C_6$-$C_{60}$ aryl group; a fluorenyl group; a $C_2$-$C_{60}$ heterocyclic group including at least one heteroatom of O, N, S, Si or P; a fused ring group of a $C_3$-$C_{60}$ aliphatic ring and a $C_6$-$C_{60}$ aromatic ring; $C_1$-$C_{50}$ alkyl group; $C_2$-$C_{20}$ alkenyl group; $C_2$-$C_{20}$ alkynyl group; $C_1$-$C_{30}$ alkoxyl group; $C_6$-$C_{30}$ aryloxy group; and -L'-N($R_a$)($R_b$), and where a, b, c, d, e or f is an integer of 2 or more, adjacent $R^1$s or adjacent $R^2$s or adjacent $R^3$s or adjacent $R^4$s or adjacent $R^6$s may be bonded to each other to form a ring, with the proviso that adjacent $R^5$s do not form a ring together, 3) $L^1$ is selected from the group consisting of single bond; a $C_6$-$C_{60}$ arylene group; a fluorenylene group; a fused ring group of a $C_3$-$C_{60}$ aliphatic ring and a $C_6$-$C_{60}$ aromatic ring; and a $C_2$-$C_{60}$ heterocyclic group, 4) $Ar^1$ and $Ar^2$ are the same or different from each other, and are each independently selected from the group consisting of deuterium; tritium; halogen; cyano group; nitro group; $C_6$-$C_{60}$ aryl group; a fluorenyl group; a $C_2$-$C_{60}$ heterocyclic group including at least one heteroatom of O, N, S, Si or P; a fused ring group of a $C_3$-$C_{60}$ aliphatic ring and a $C_6$-$C_{60}$ aromatic ring; $C_1$-$C_{50}$ alkyl group; $C_2$-$C_{20}$ alkenyl group; $C_2$-$C_{20}$ alkynyl group; $C_1$-$C_{30}$ alkoxyl group; $C_6$-$C_{30}$ aryloxy group; and -L'-N($R_a$)($R_b$), and $Ar^1$ and $Ar^2$ may be bonded to each other to form a ring, wherein L' is selected from the group consisting of single bond; a $C_6$-$C_{60}$ arylene group; a fluorenylene group; a $C_3$-$C_{60}$ aliphatic ring; a $C_2$-$C_{60}$ heterocyclic group including at least one heteroatom of O, N, S, Si or P; and combinations thereof; wherein $R_a$ and $R_b$ are each independently selected from a $C_6$-$C_{60}$ aryl group; a fluorenyl group; a $C_3$-$C_{60}$ aliphatic ring and a $C_2$-$C_{60}$ heterocyclic group including at least one heteroatom of O, N, S, Si or P, wherein the aryl group, arylene group, heterocyclic group, fluorenyl group, fluorenylene group, fused ring group, alkyl group, alkenyl group, alkoxy group and aryloxy group may be substituted with one or more substituents selected from the group consisting of deuterium; halogen; silane group; siloxane group; boron group; germanium group; cyano group; nitro group; $C_1$-$C_{20}$ alkylthio group; $C_1$-$C_{20}$ alkoxyl group; $C_1$-$C_{20}$ alkyl group; $C_2$-$C_{20}$ alkenyl group; $C_2$-$C_{20}$ alkynyl group; $C_6$-$C_{20}$ aryl group; $C_6$-$C_{20}$ aryl group substituted with deuterium; a fluorenyl group; $C_2$~$C_{20}$ heterocyclic group; $C_3$-$C_{20}$ cycloalkyl group; $C_7$-$C_{20}$ arylalkyl group; $C_8$-$C_{20}$ arylalkenyl group; and -L'-N($R_a$)($R_b$); wherein the substituents may be bonded to each other to form a saturated or unsaturated ring, wherein the term 'ring' means a $C_3$-$C_{60}$ aliphatic ring, a $C_6$-$C_{60}$ aromatic ring, a $C_2$-$C_{60}$ heterocyclic group, a fused ring formed by combination thereof.

2. The compound of claim 1, wherein the compound represented by Formula (1) is represented by any one of Formulas (2) to (4):

Formula (2)

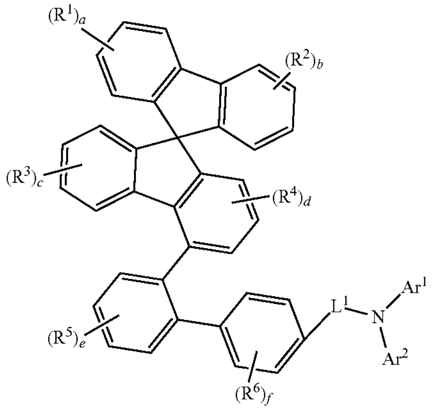

Formula (3)

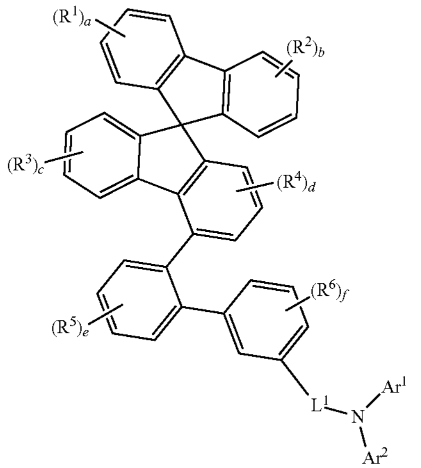

-continued

Formula (4)

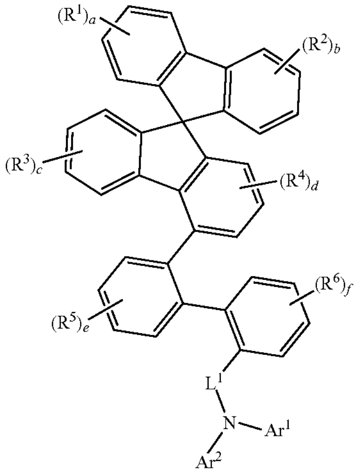

wherein $R^1$, $R^2$, $R^3$, $R^4$, $R^5$, $R^6$, a, b, c, d, e, f, Le, Ar" and $Ar^2$ are the same as defined in claim 1.

3. The compound of claim 1, wherein the compound represented by Formula (1) is represented by any one of Formulas (5) to (7):

Formula (5)

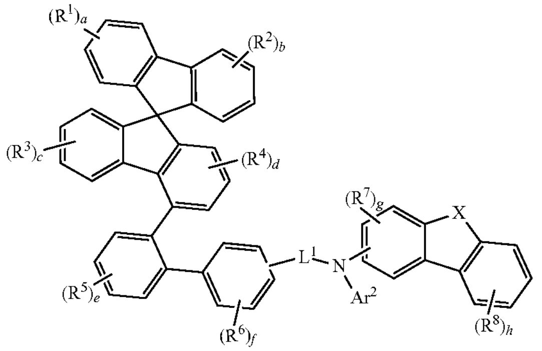

Formula (6)

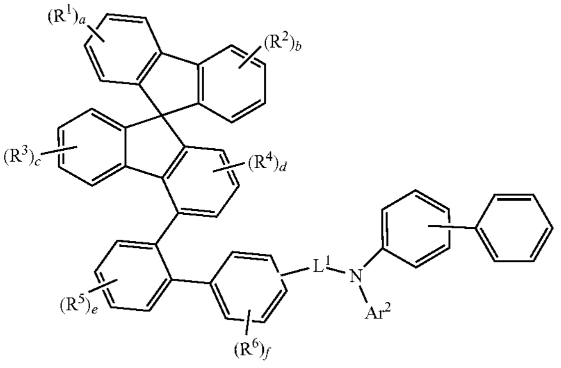

-continued

Formula (7)

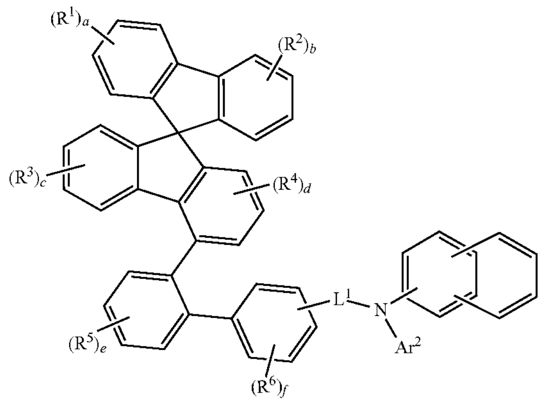

wherein:

1) $R^1$, $R^2$, $R^3$, $R^4$, $R^5$, $R^6$, a, b, c, d, e, f, $L^1$, and $Ar^2$ are the same as defined in claim 1, 2) $R^7$ and $R^8$ are selected from the group consisting of hydrogen; deuterium; tritium; halogen; cyano group; nitro group; $C_6$-$C_{60}$ aryl group; a fluorenyl group; a $C_2$-$C_{60}$ heterocyclic group including at least one heteroatom of O, N, S, Si or P; a fused ring group of a $C_3$-$C_{60}$ aliphatic ring and a $C_6$-$C_{60}$ aromatic ring; $C_1$-$C_{50}$ alkyl group; $C_2$-$C_{20}$ alkenyl group; $C_2$-$C_{20}$ alkynyl group; $C_1$-$C_{30}$ alkoxyl group; $C_6$-$C_{30}$ aryloxy group; and -L'-N($R_a$)($R_b$), wherein L', $R_a$ and $R_b$ are the same as defined in claim 1, and adjacent $R^7$s or adjacent $R^8$s may be bonded to each other to form a ring, 3) g is an integer of 0 to 3, and h is an integer of 0 to 4, 4) X is 0, S NR' or CR'R", wherein R' and R" are each independently selected from the group consisting of a $C_6$-$C_{60}$ aryl group; a fluorenyl group; a $C_3$-$C_{60}$ aliphatic ring; and a $C_2$-$C_{60}$ heterocyclic group including at least one heteroatom of O, N, S, Si or P.

4. The compound of claim 1, wherein the compound represented by Formula (1) is represented by any one of Formulas (8) to (13):

Formula (8)

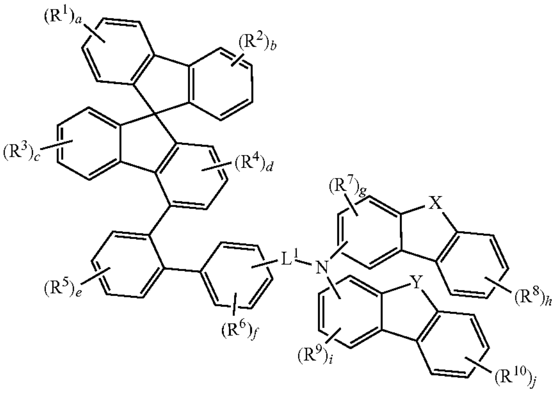

-continued

Formula (9)

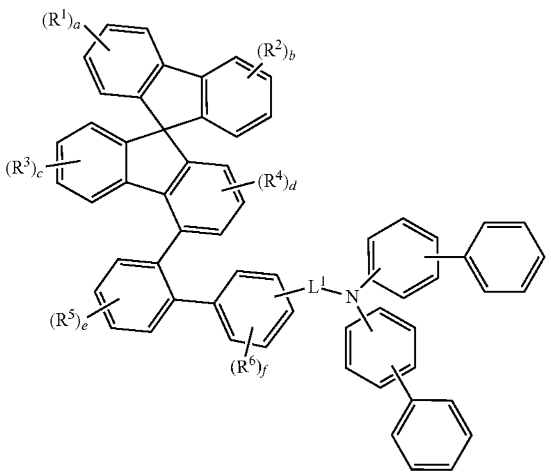

Formula (10)

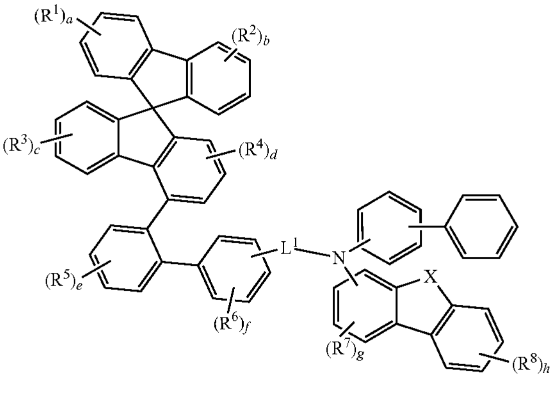

Formula (11)

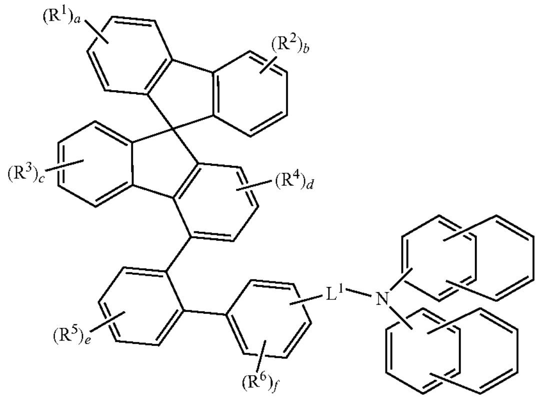

-continued

Formula (12)

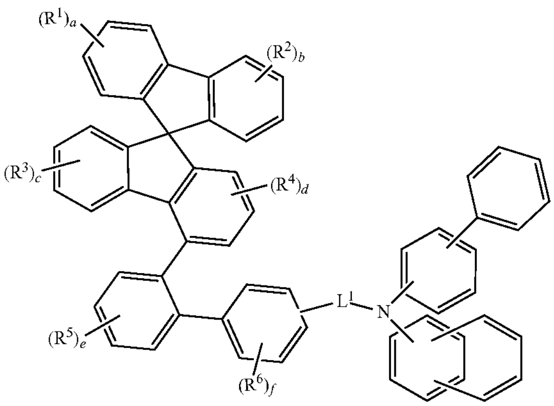

Formula (13)

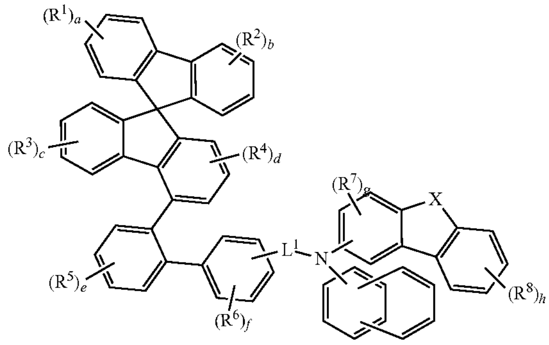

wherein:

1) $R^1$, $R^2$, $R^3$, $R^4$, $R^5$, $R^6$, a, b, c, d, e, f and $L^1$ are the same as defined in claim 1, 2) $R^7$, $R^8$, $R^9$ and $R^{10}$ are selected from the group consisting of hydrogen; deuterium; tritium; halogen; cyano group; nitro group; $C_6$-$C_{60}$ aryl group; a fluorenyl group; a $C_2$-$C_{60}$ heterocyclic group including at least one heteroatom of O, N, S, Si or P; a fused ring group of a $C_3$-$C_{60}$ aliphatic ring and a $C_6$-$C_{60}$ aromatic ring; $C_1$-$C_{50}$ alkyl group; $C_2$-$C_{20}$ alkenyl group; $C_2$-$C_{20}$ alkynyl group; $C_1$-$C_{30}$ alkoxyl group; $C_6$-$C_{30}$ aryloxy group; and -L'-N($R_a$)($R_b$), wherein L', $R_a$ and $R_b$ are the same as defined in claim 1, and adjacent $R^7$s or adjacent $R^8$s or adjacent $R^9$s or adjacent $R^{10}$ s may be bonded to each other to form a ring, 3) g and i are each independently an integer of 0 to 3, and h and j are each independently an integer of 0 to 4, 4) X and Y are each independently O, S, NR' or CR'R", wherein R' and R" are each independently selected from the group consisting of a $C_6$-$C_{60}$ aryl group; a fluorenyl group; a $C_3$-$C_{60}$ aliphatic ring; and a $C_2$-$C_{60}$ heterocyclic group including at least one heteroatom of O, N, S, Si or P.

5. The compound of claim 1, wherein the compound represented by Formula (1) is represented by Formulas (14) to (16):

<Formula (14)>
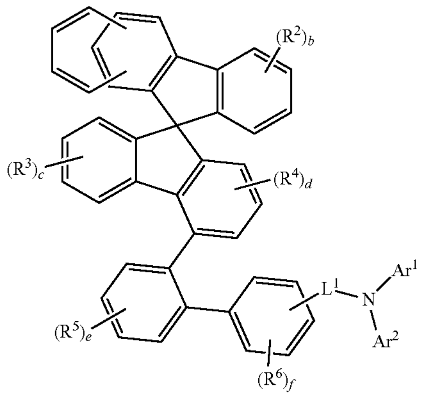
<Formula (15)>
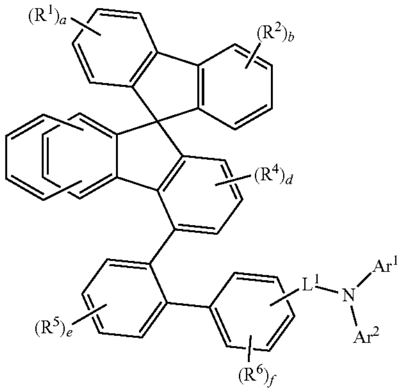
<Formula (16)>
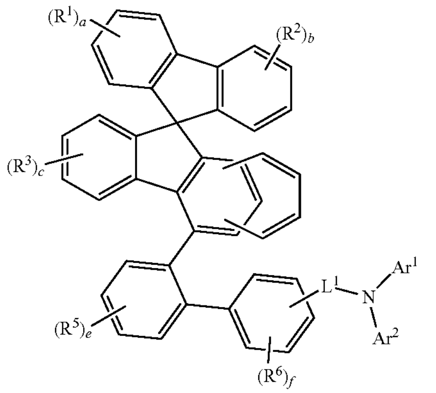
wherein $R^1$, $R^2$, $R^3$, $R^4$, $R^5$, $R^6$, a, b, c, d, e, f, $L^1$, $Ar^1$ and $Ar^2$ are the same as defined in claim 1.
6. The compound of claim 1, wherein the compound represented by Formula (1) is represented by any one of the following compounds:
1-1
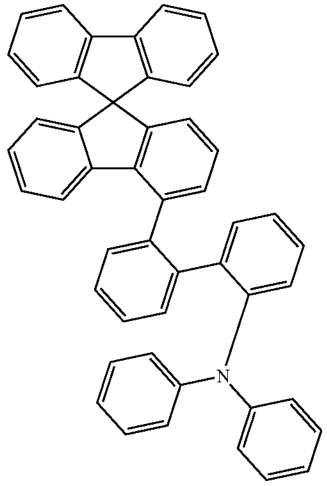
1-2
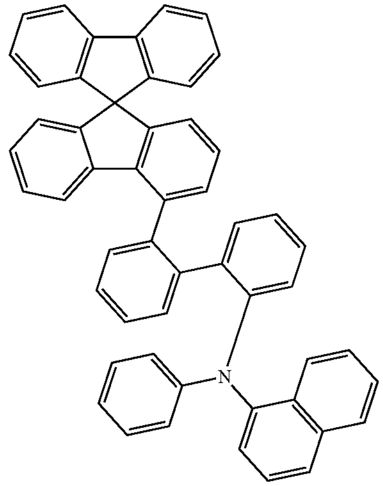
1-3
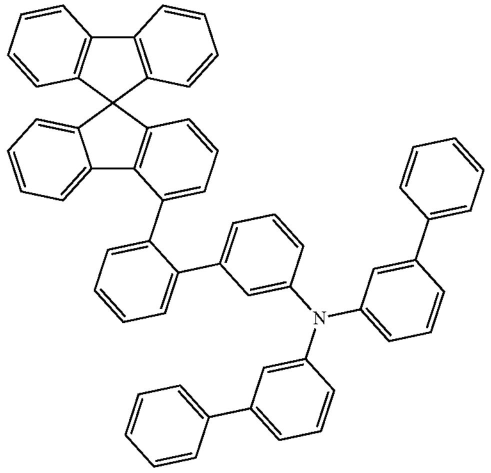

1-4
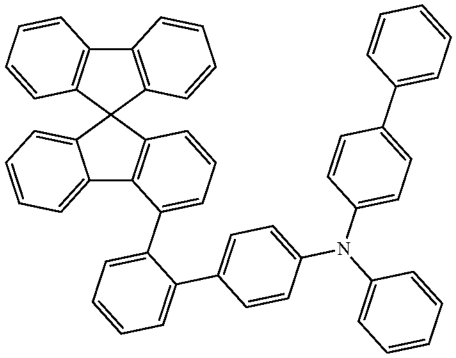
1-5
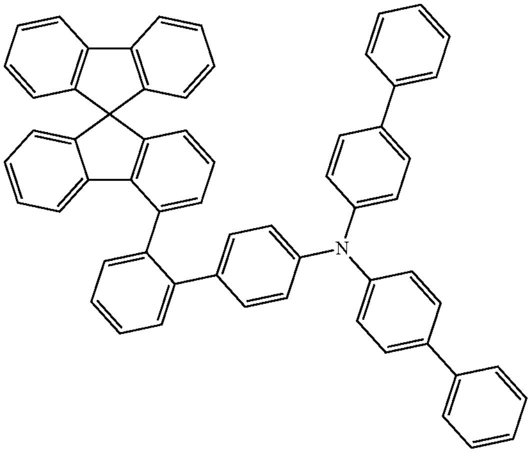
1-6
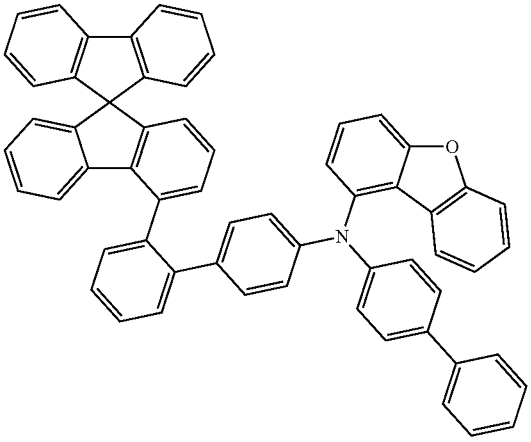
1-7
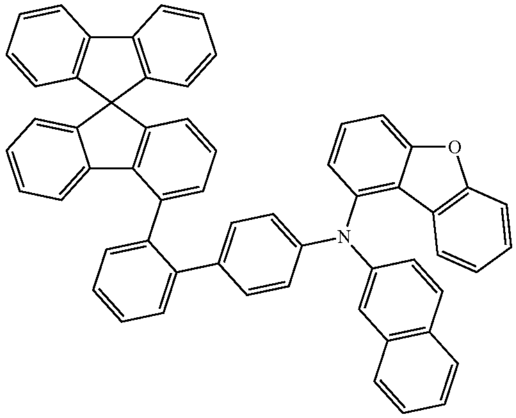
1-8
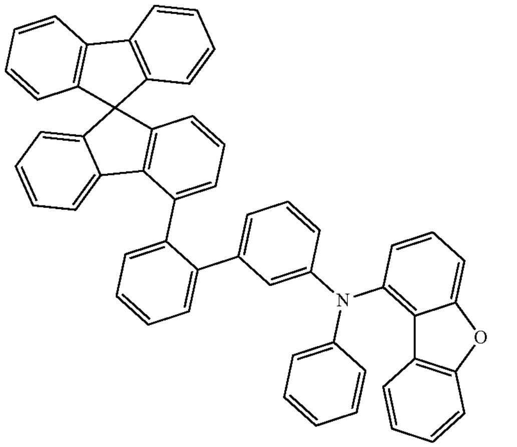
1-9
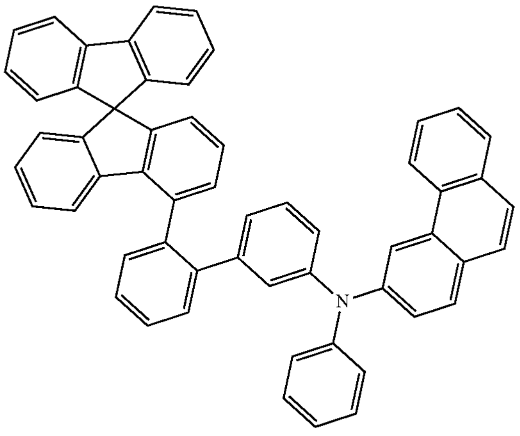

1-10
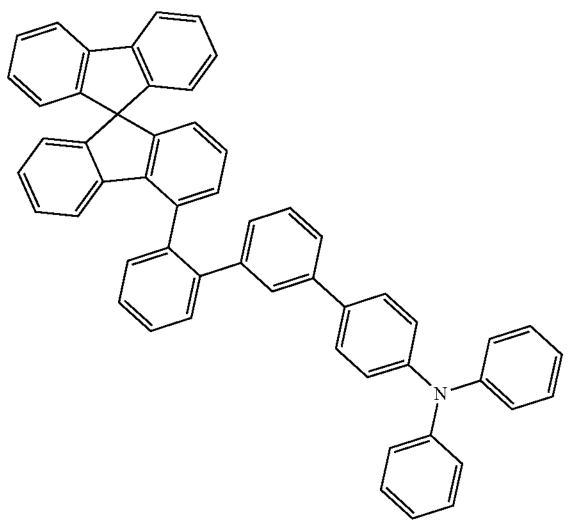
1-11
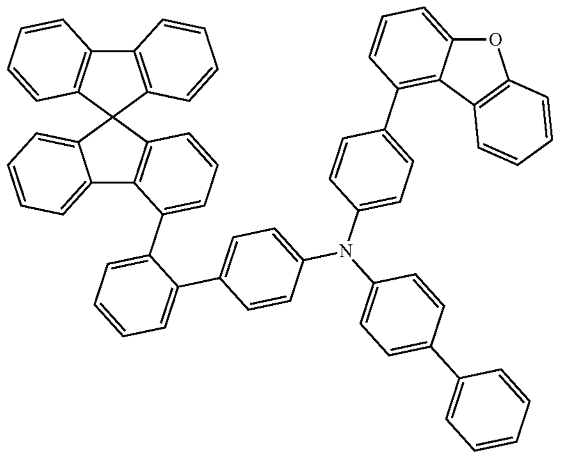
1-12
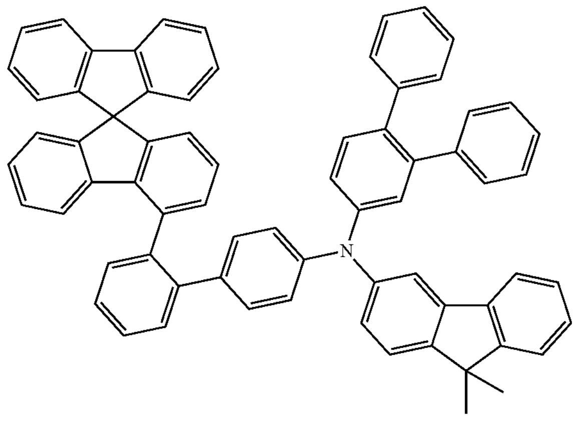
1-13
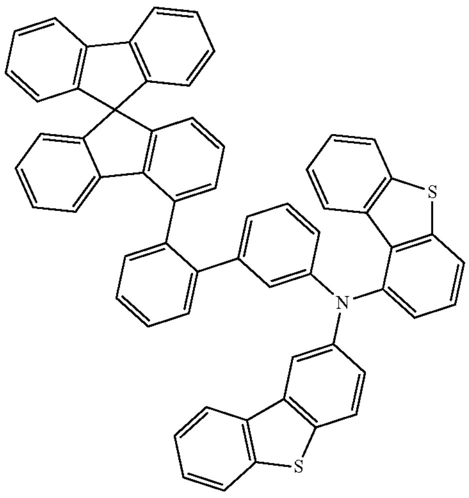
1-14
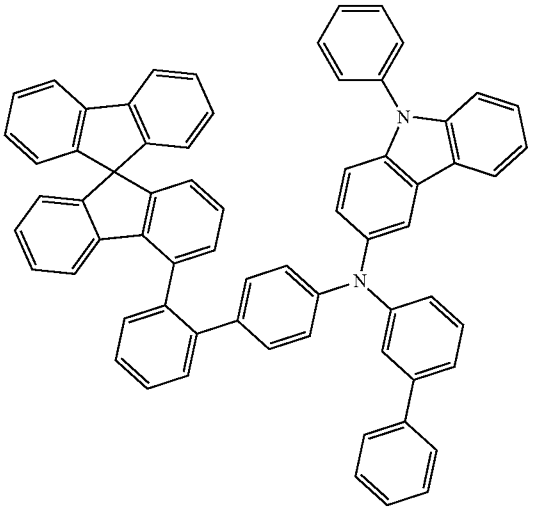
1-15
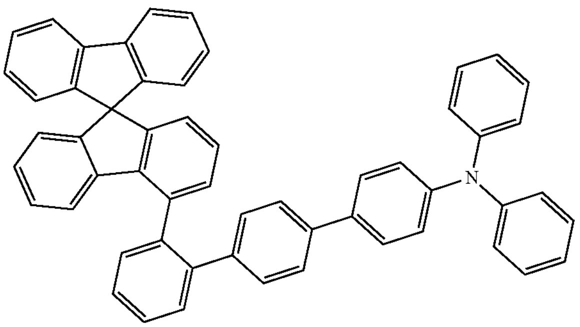

-continued
1-16
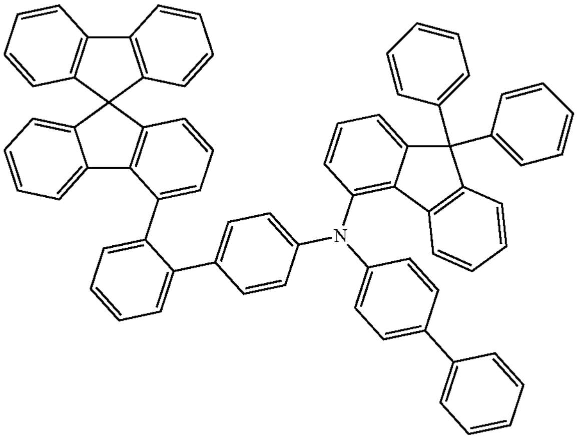
1-17
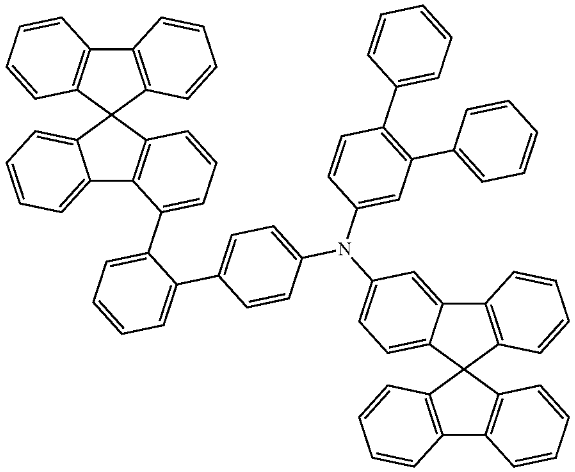
1-18
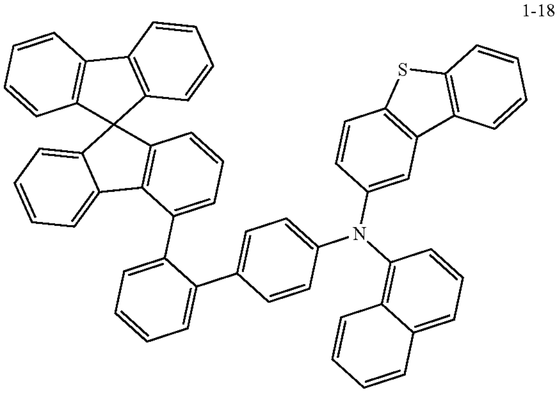
-continued
1-19
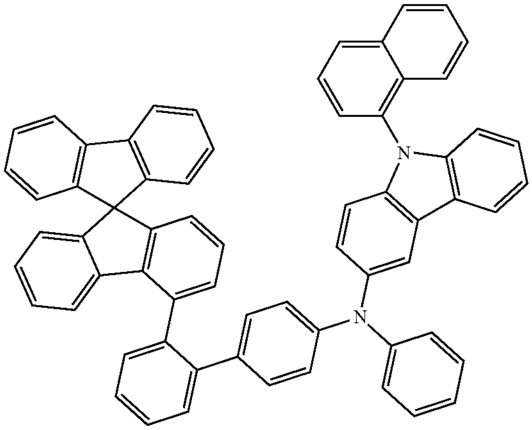
1-20
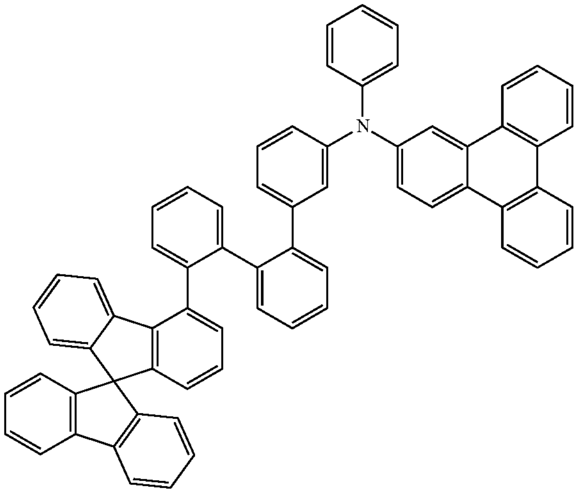
1-21
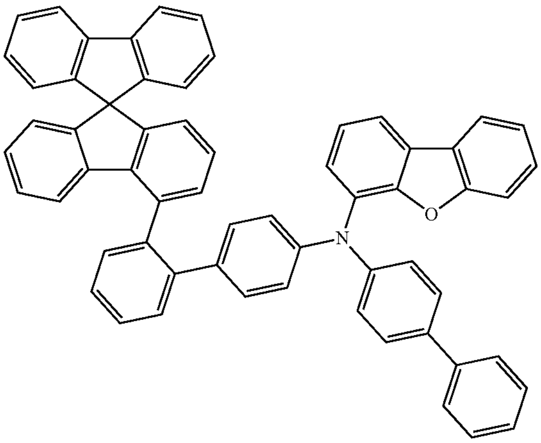

-continued
1-22
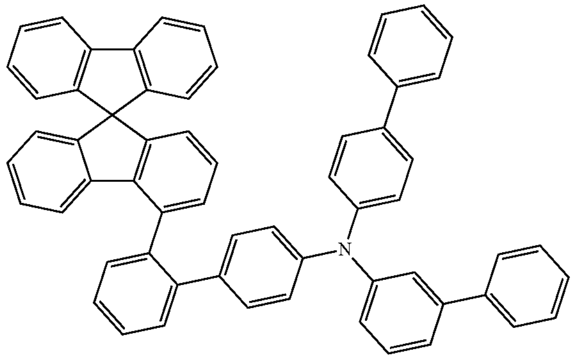
1-23
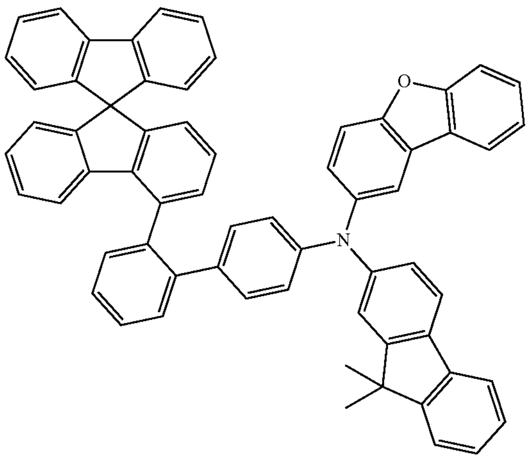
1-24
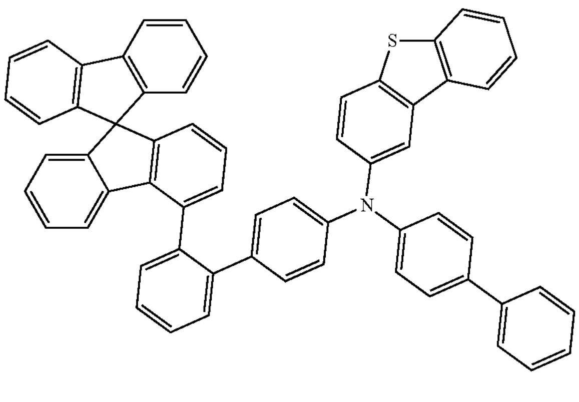
-continued
1-25
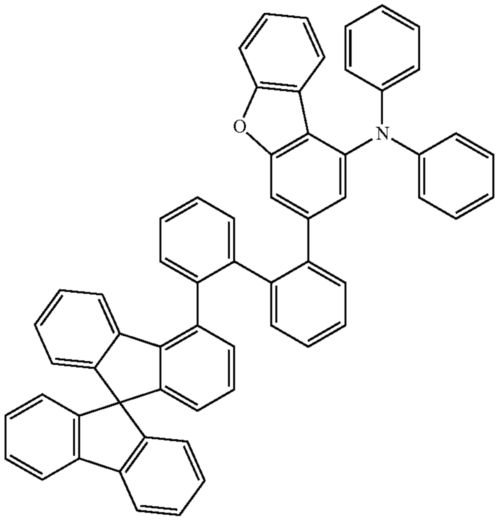
1-26
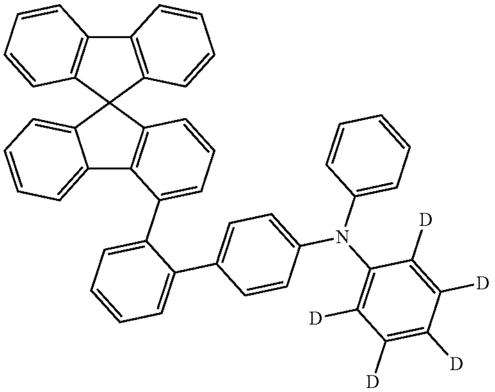
1-27
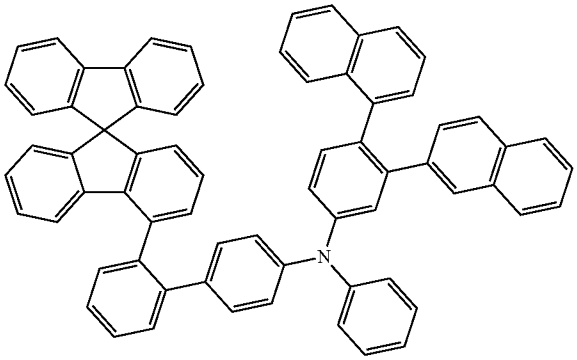

-continued
1-28
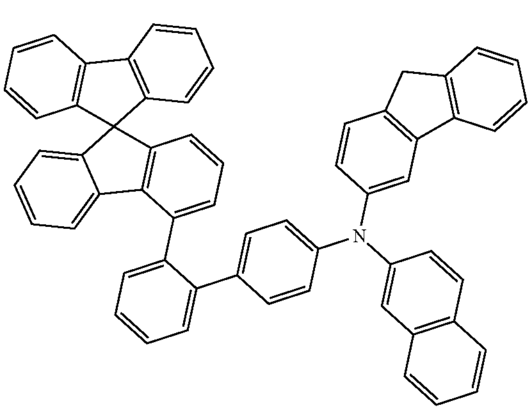
1-29
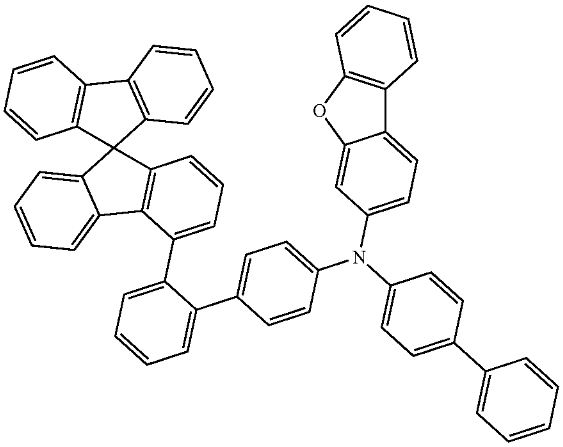
1-30
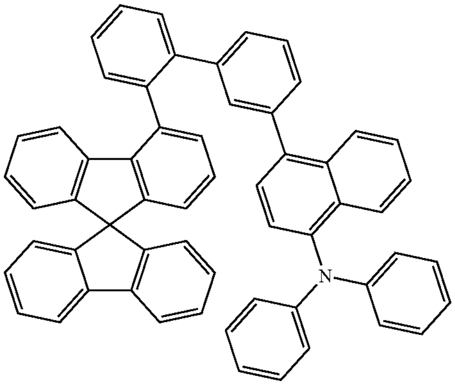
-continued
1-31
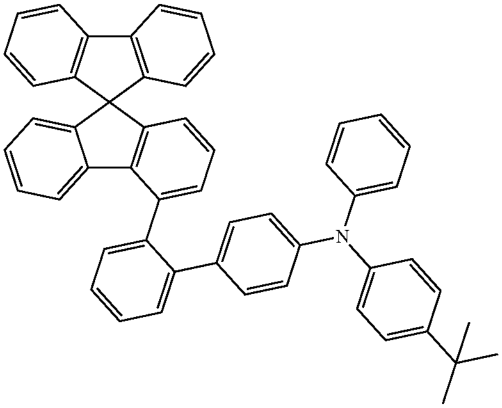
1-32
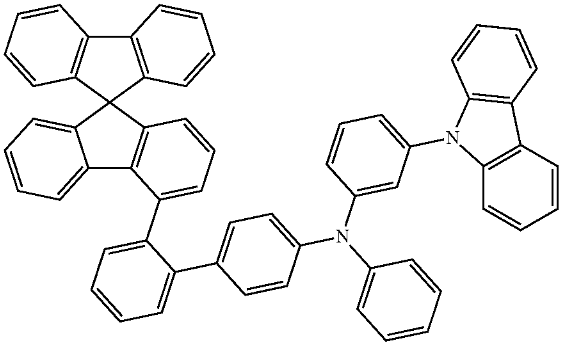
1-33
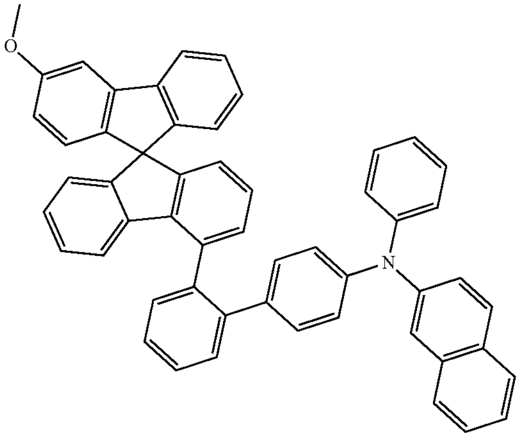
1-34
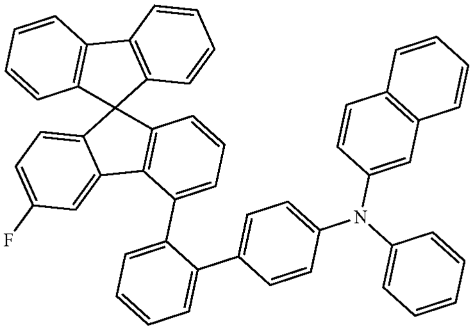

-continued
1-35
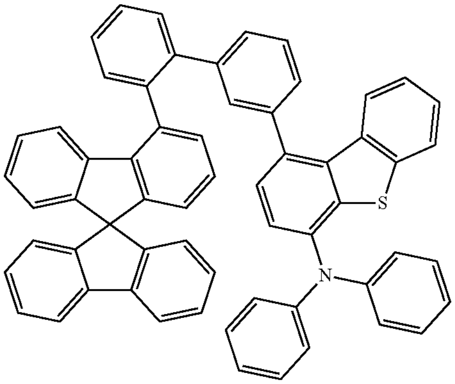
1-36
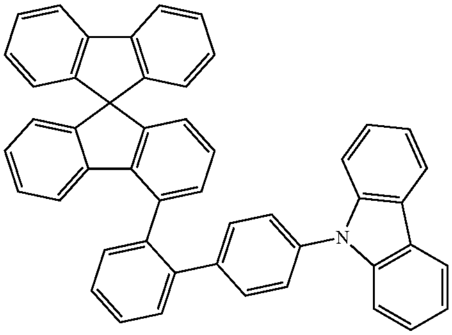
1-37
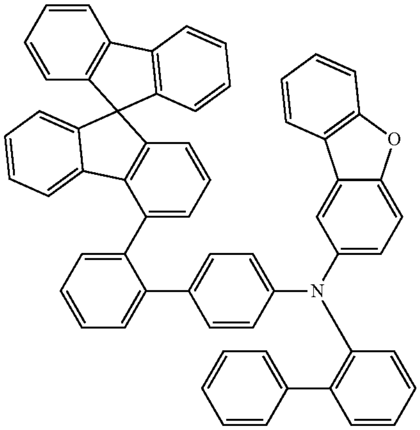
1-38
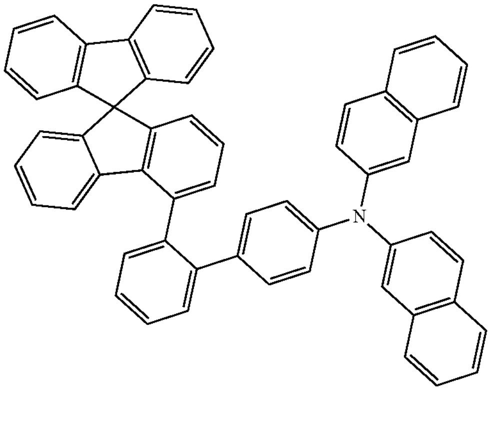
-continued
1-39
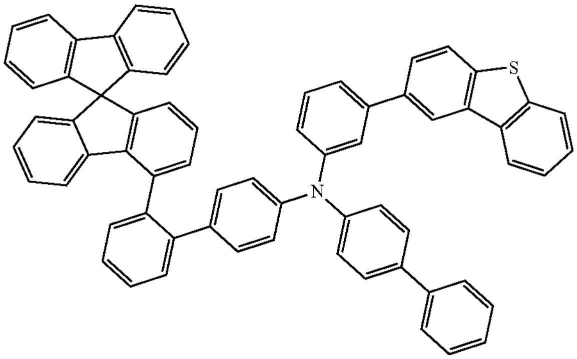
1-40
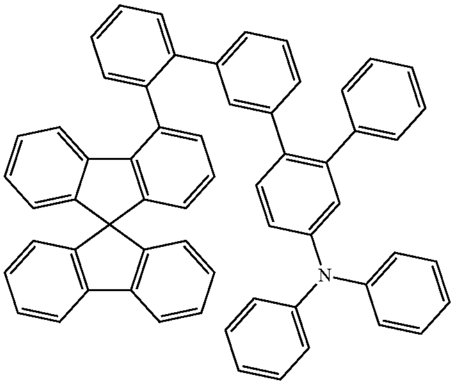
1-41
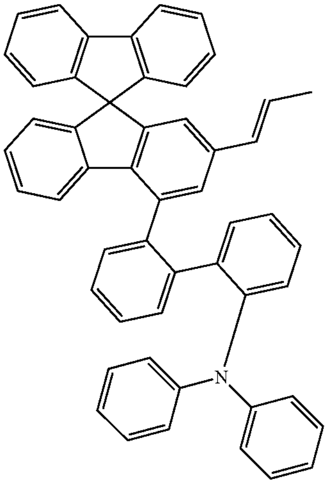

-continued
1-42
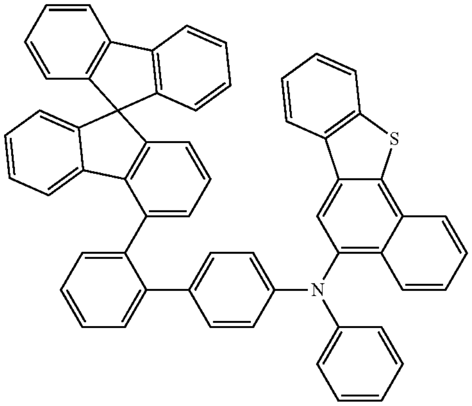
1-43
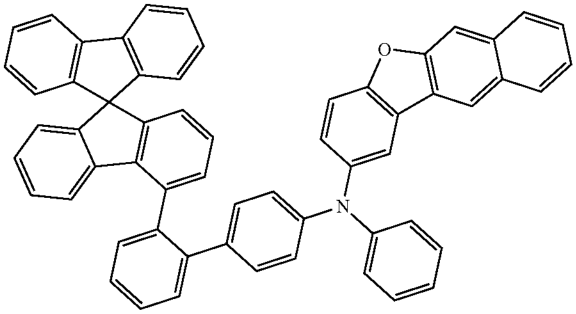
1-44
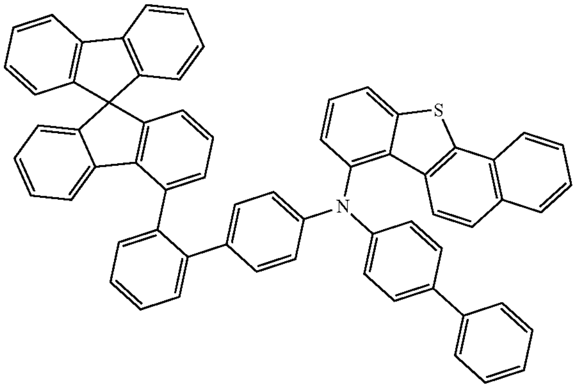
1-45
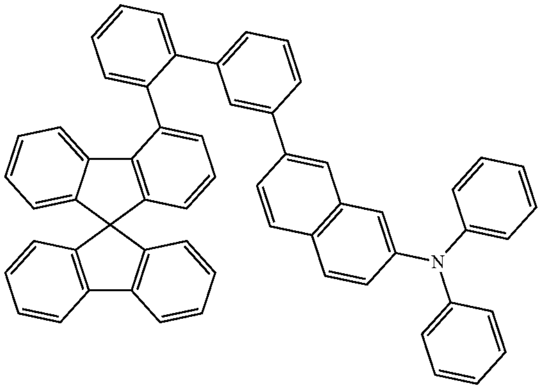
-continued
1-46
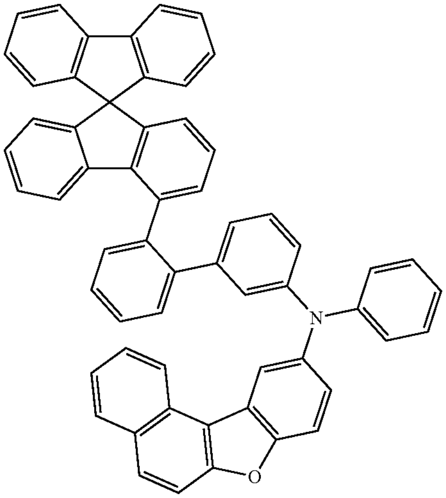
1-47
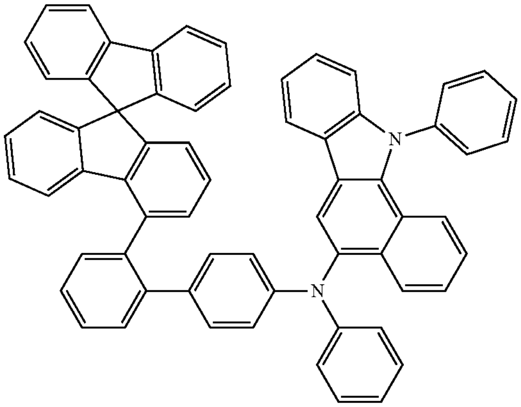
1-48
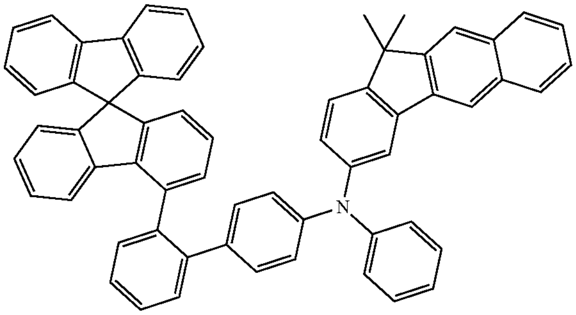
1-49
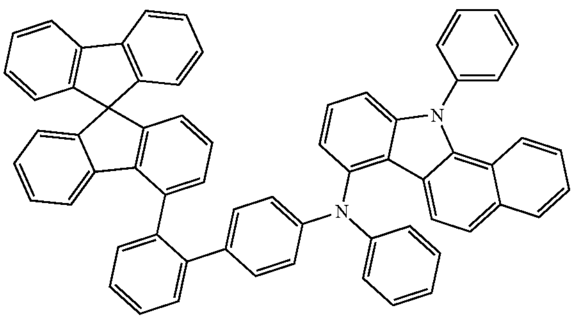

-continued
1-50
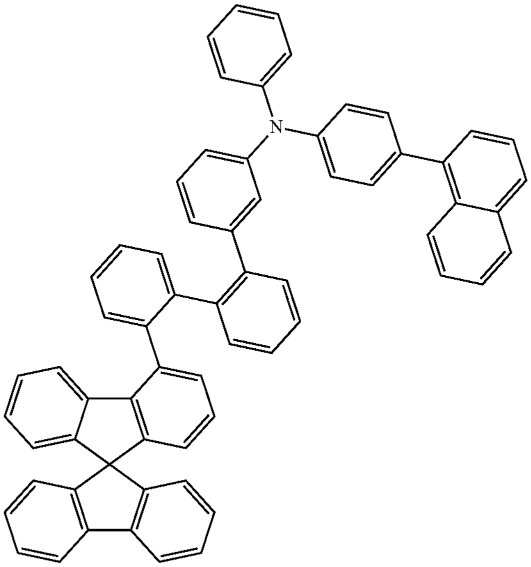
1-51
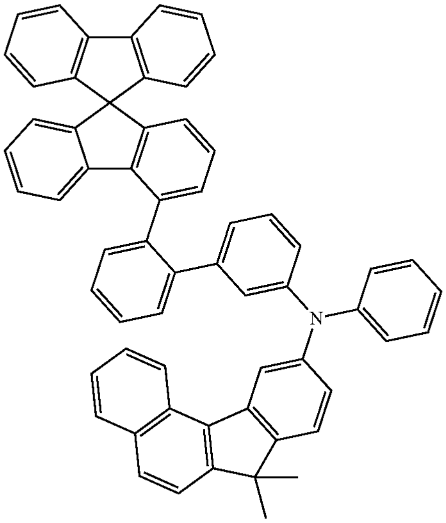
1-52
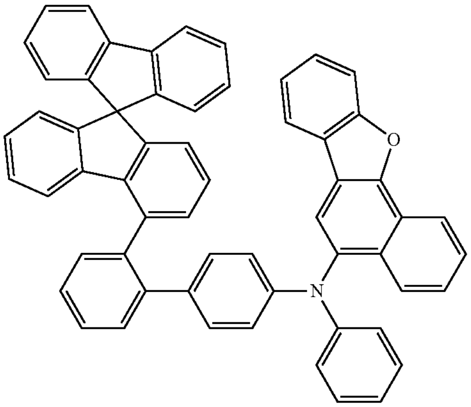
-continued
1-53
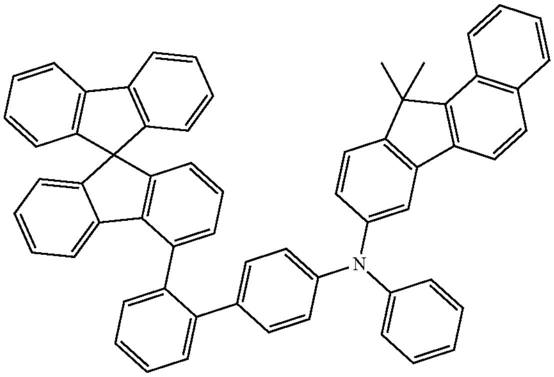
1-54
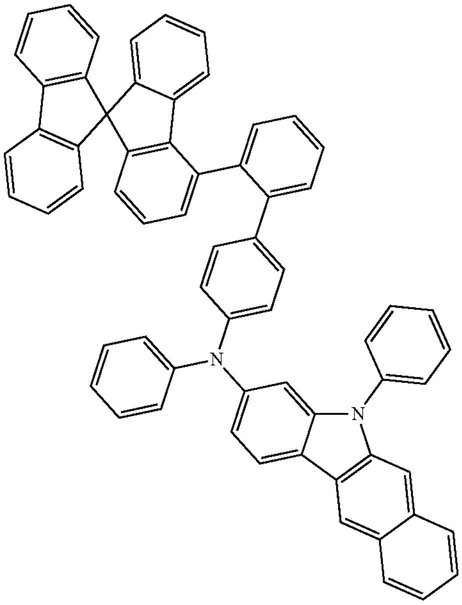
1-55
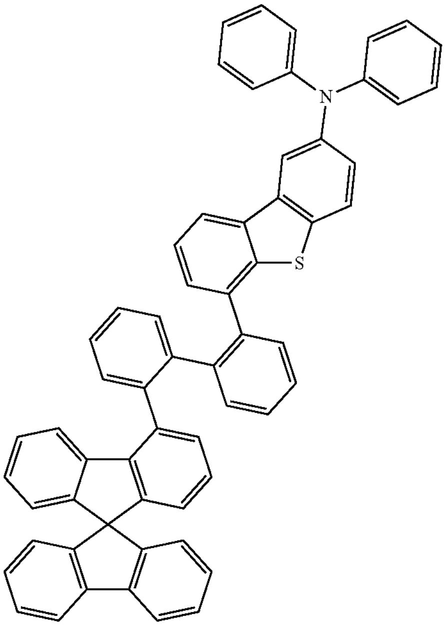

-continued
1-56
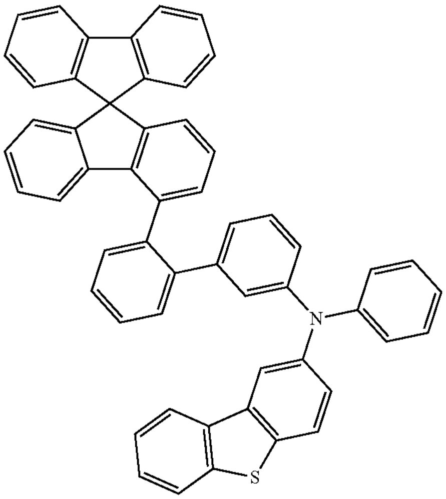
1-57
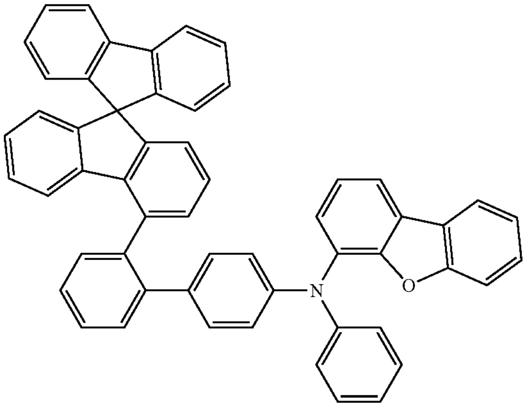
1-58
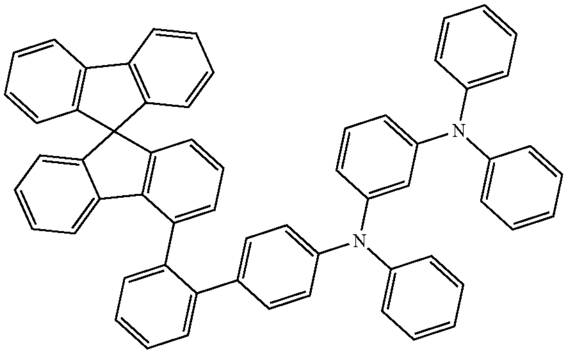
-continued
1-59
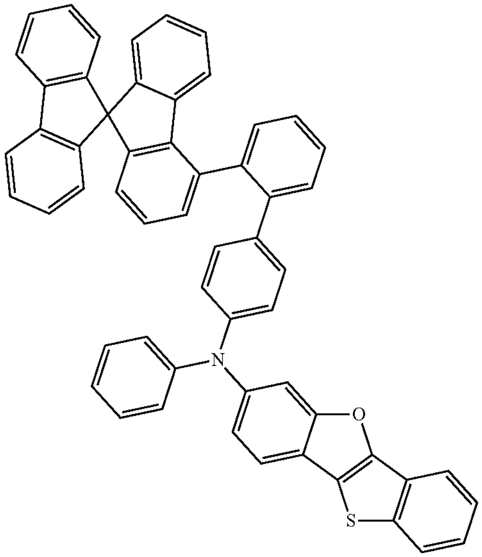
1-60
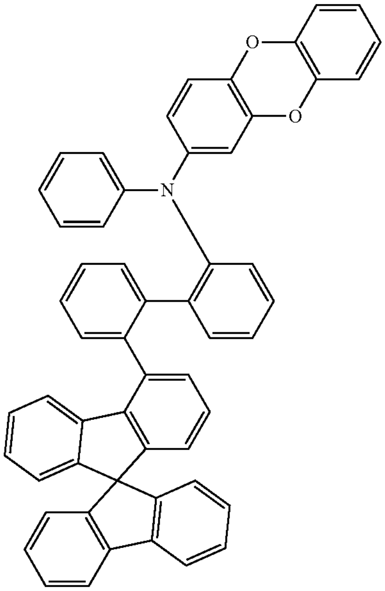

-continued
1-61
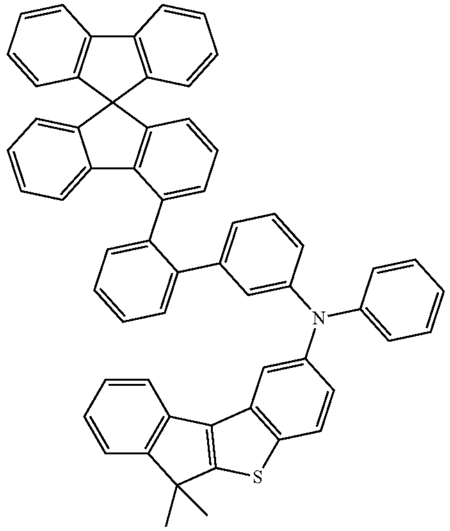
1-62
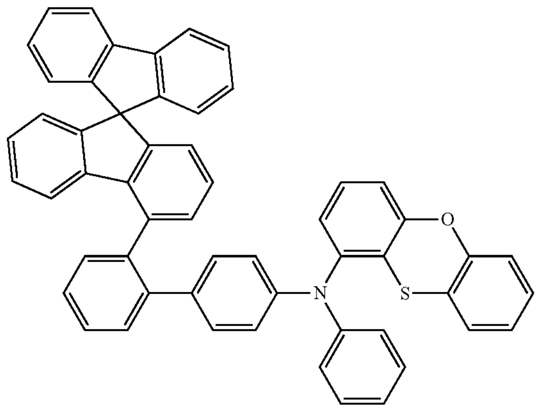
1-63
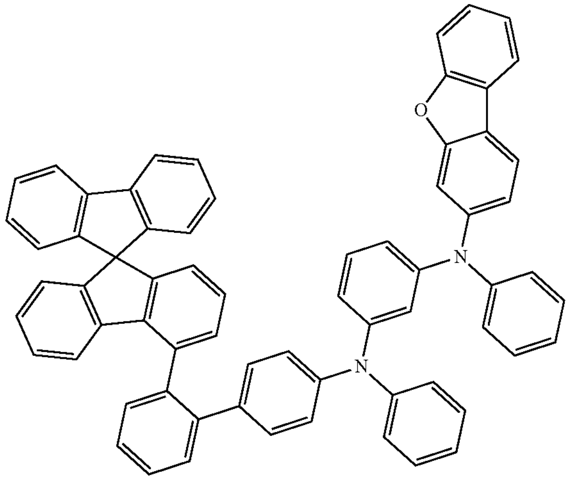
-continued
1-64
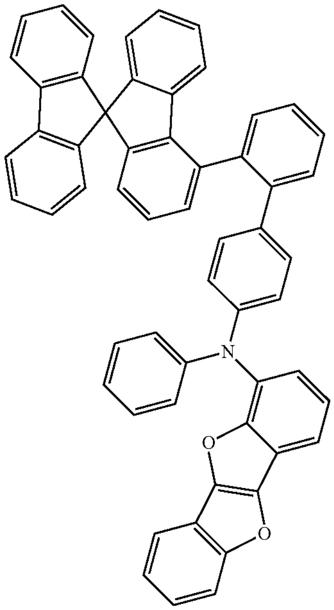
1-65
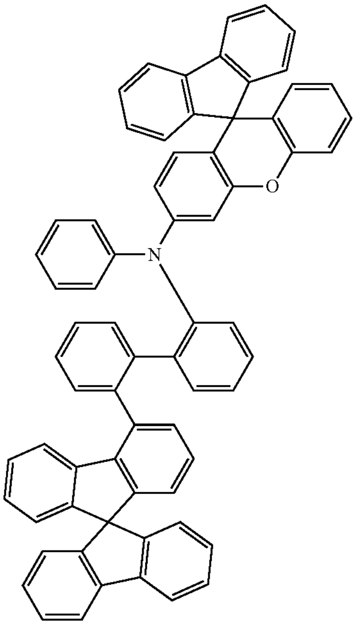

-continued
1-66
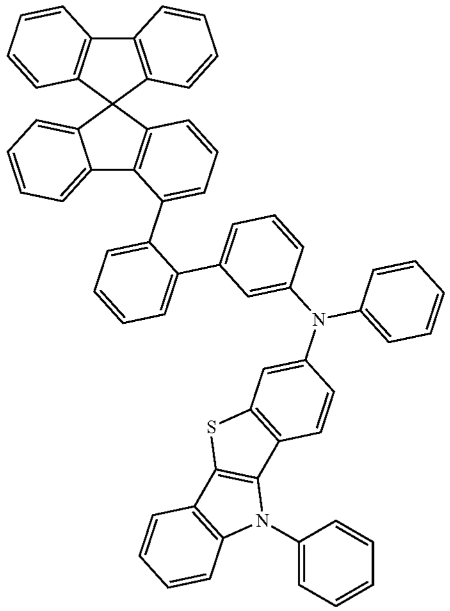
1-67
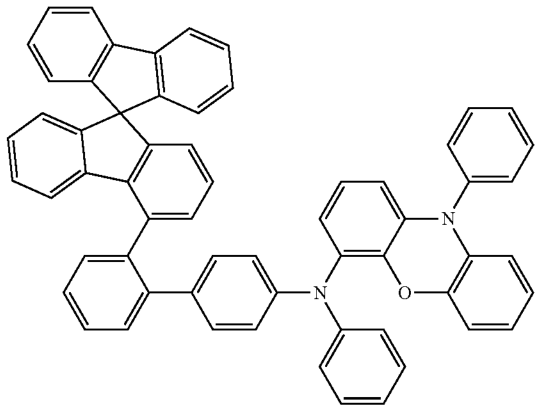
1-68
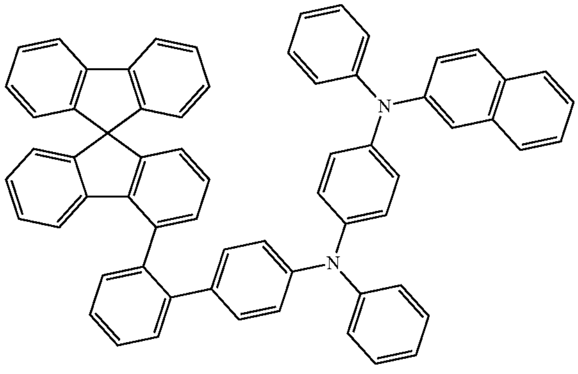
-continued
1-69
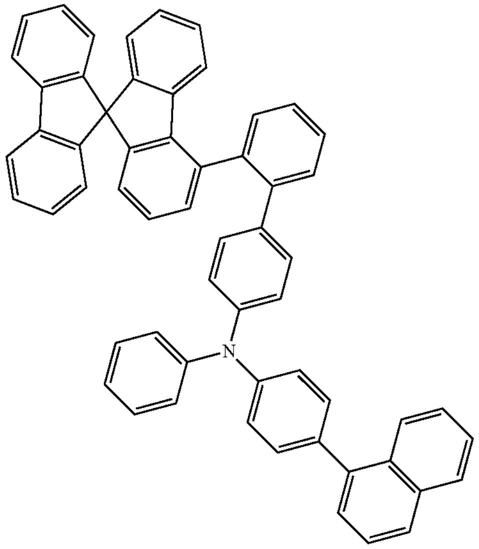
1-70
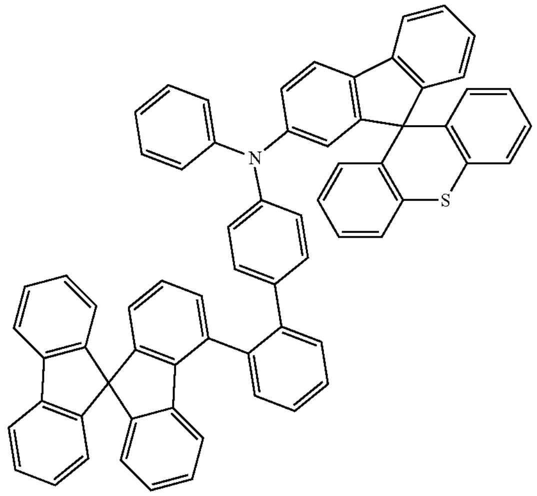
1-71
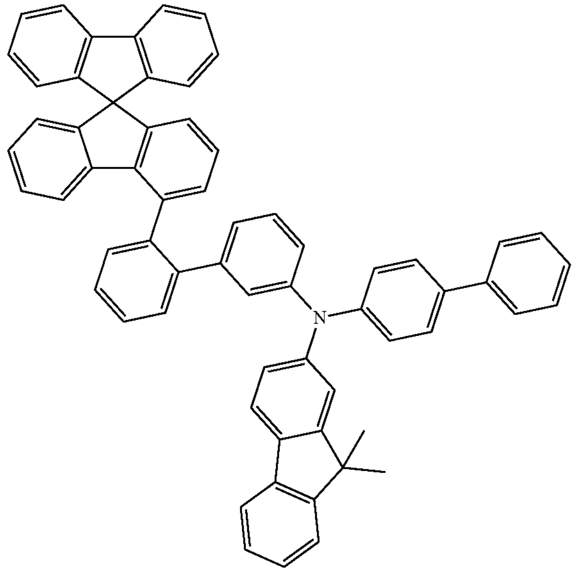

-continued
1-72
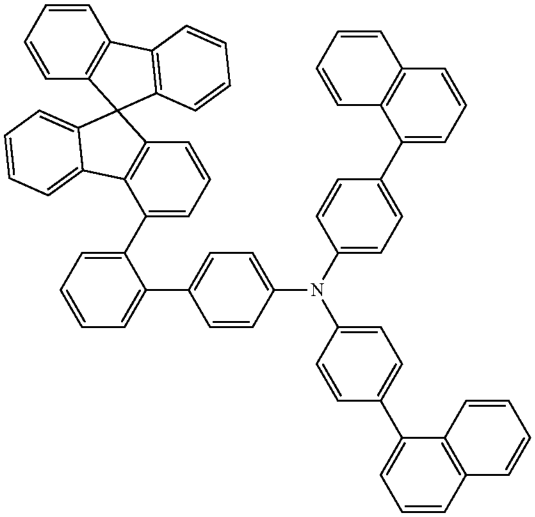
1-73
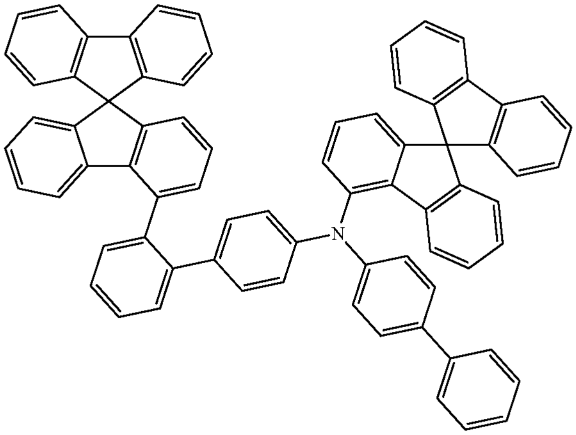
1-74
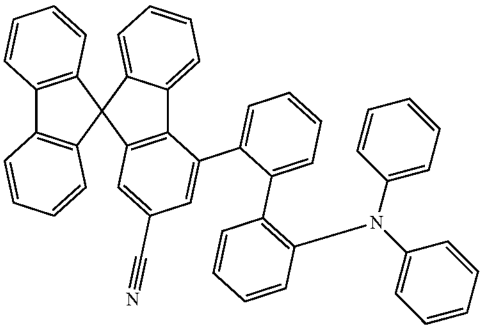
-continued
1-75
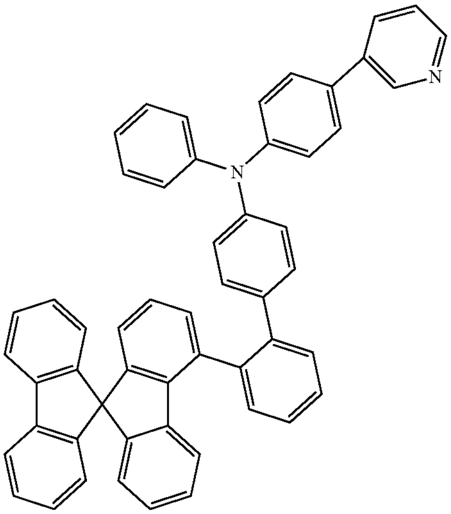
1-76
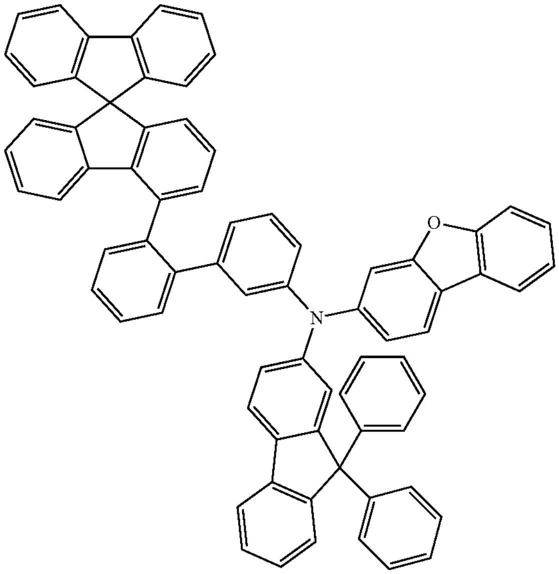
1-77
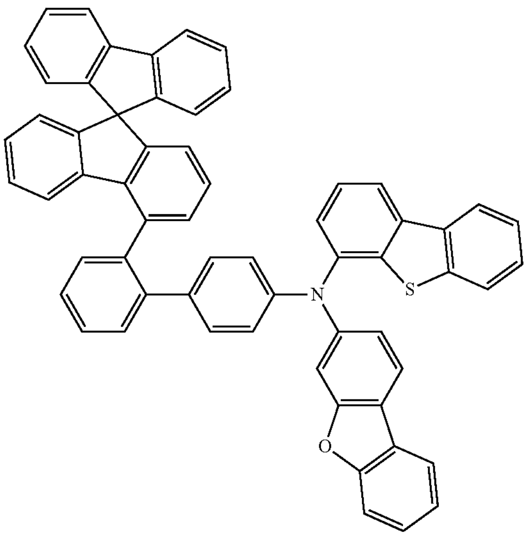

-continued
1-78
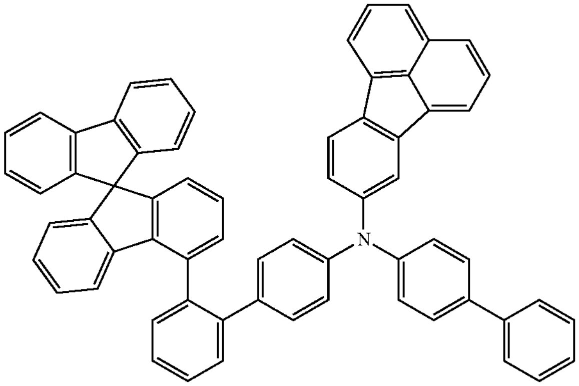
1-79
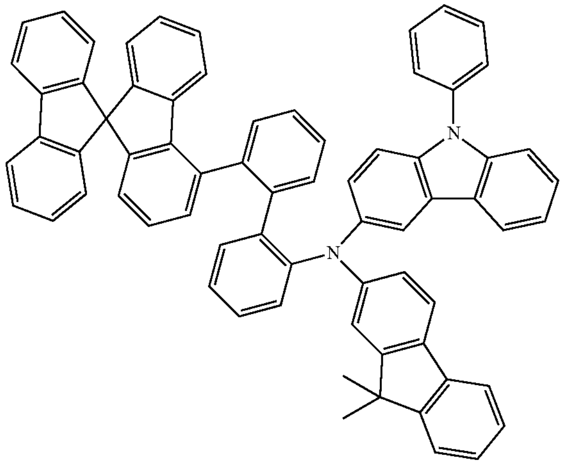
1-80
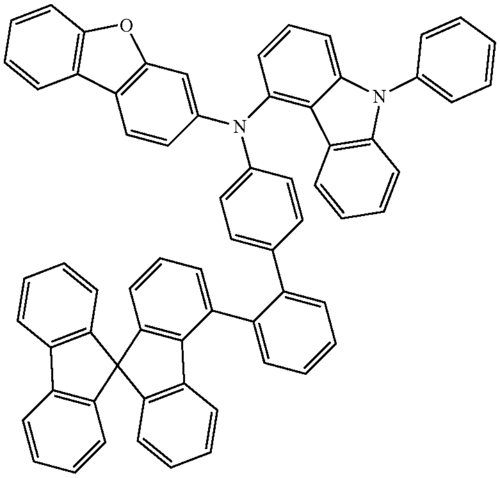
-continued
1-81
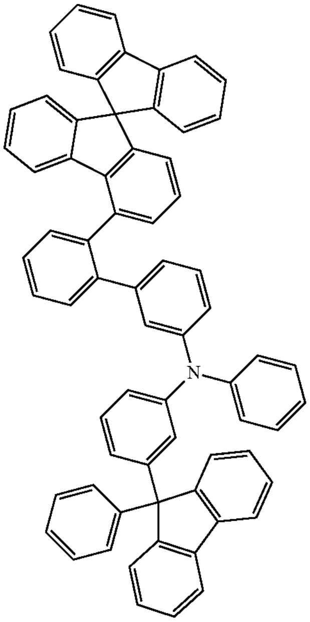
1-82
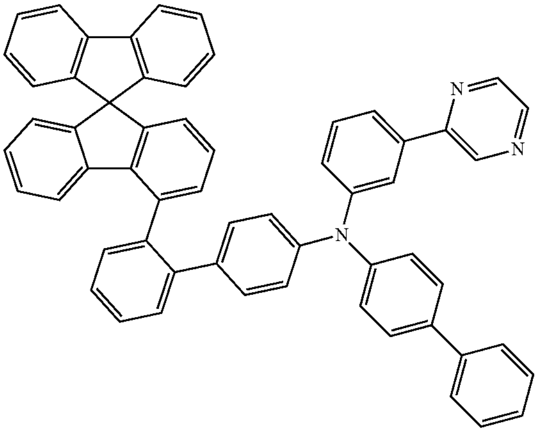
1-83
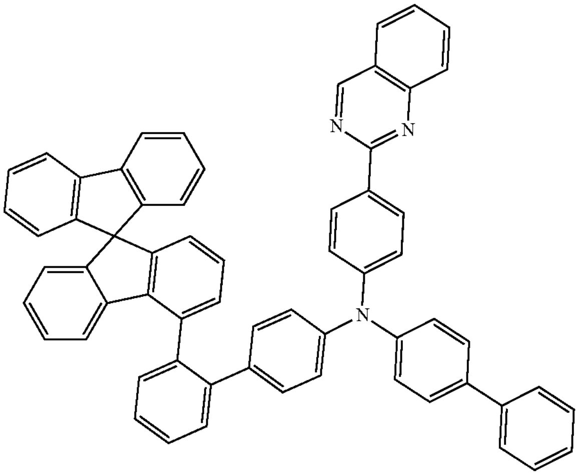

1-84
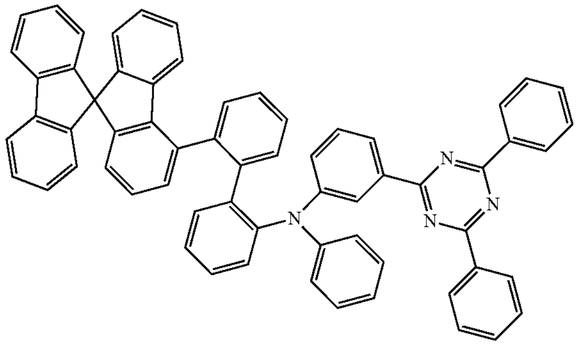
1-85
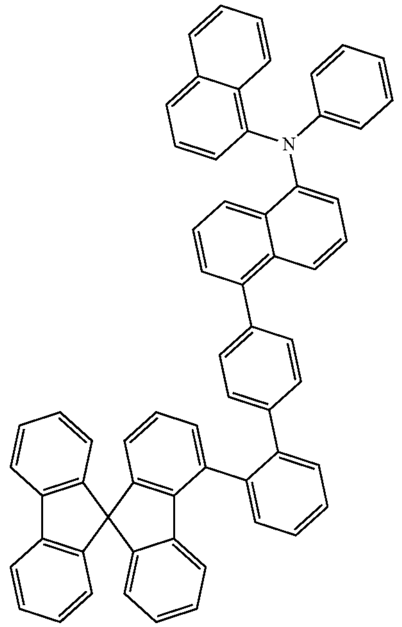
1-86
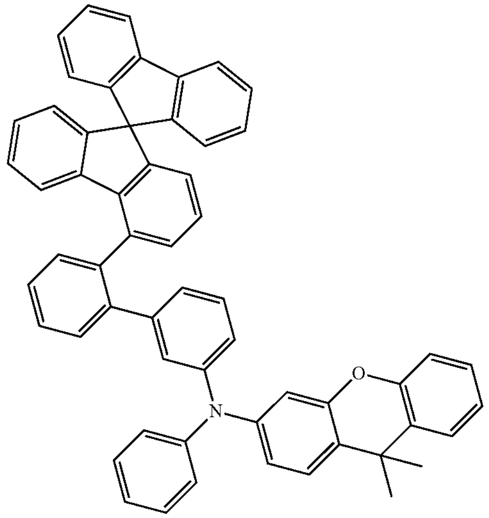
1-87
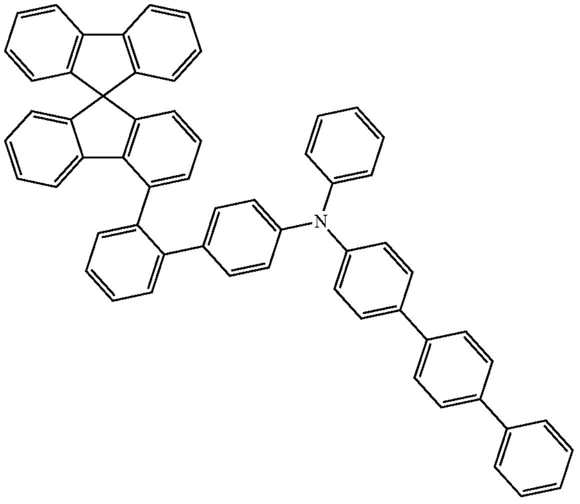
1-88
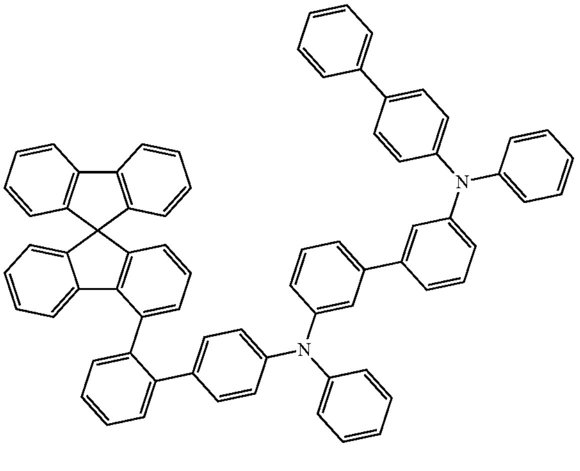
1-89
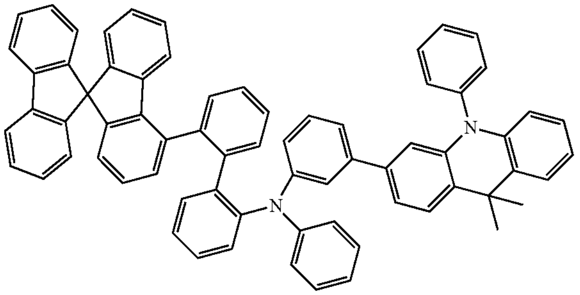

-continued
1-90
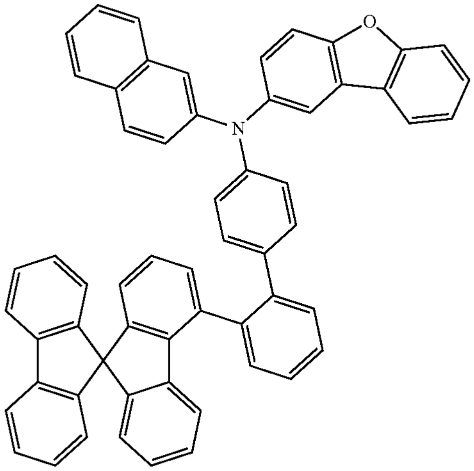
1-91
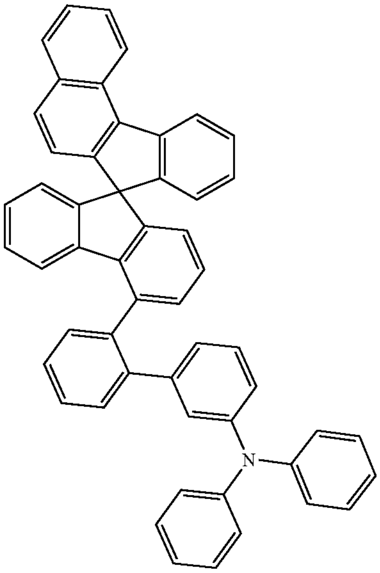
1-92
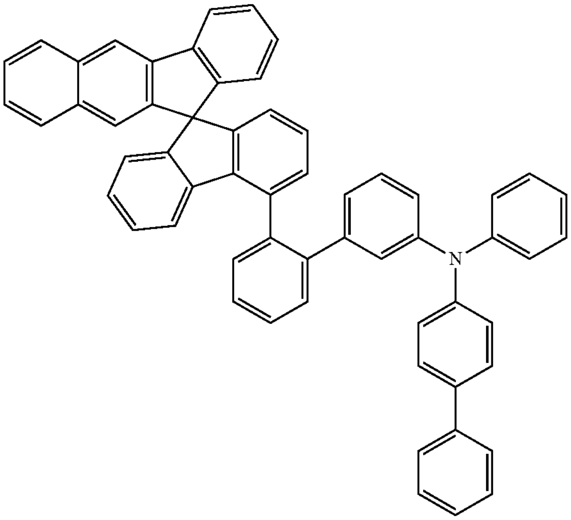
-continued
1-93
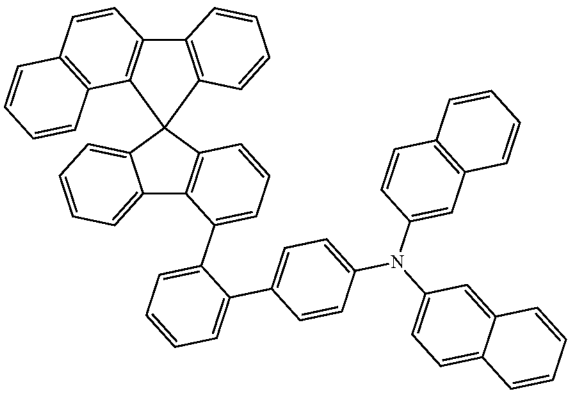
1-94
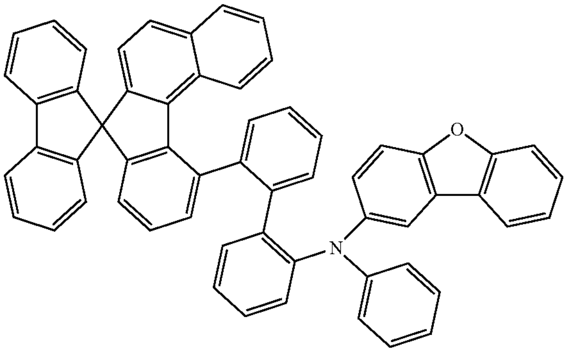
1-95
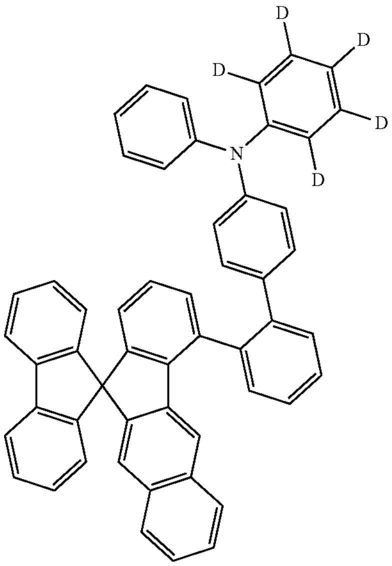

-continued
1-96
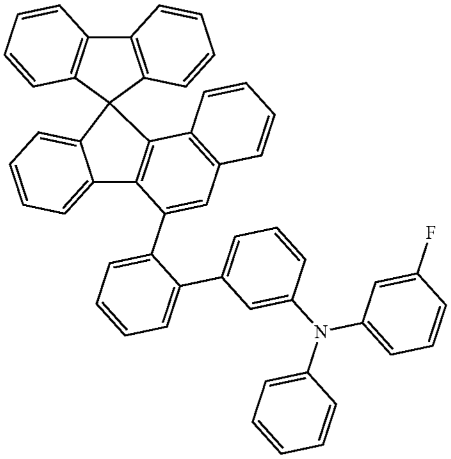
1-97
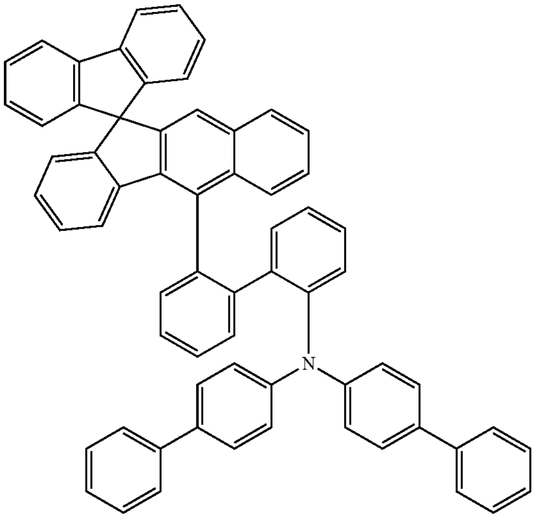
1-98
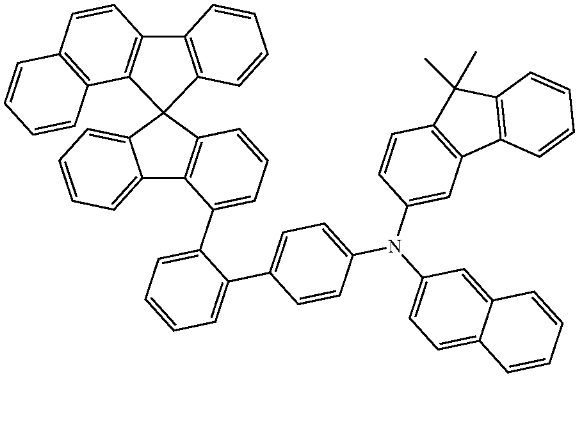
-continued
1-99
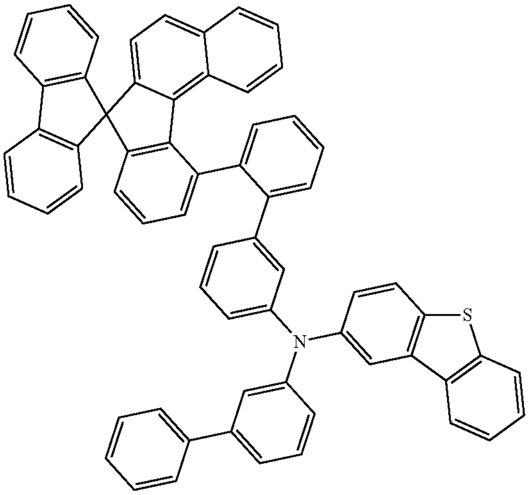
1-100
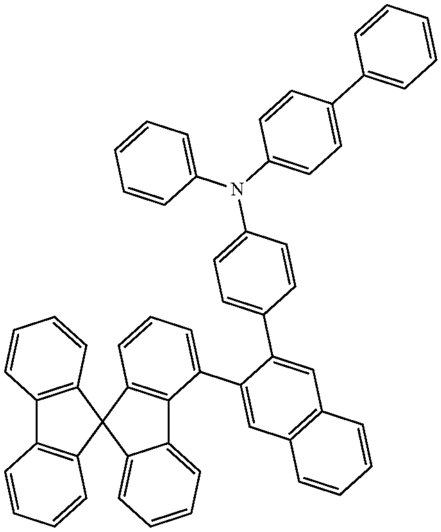
1-101
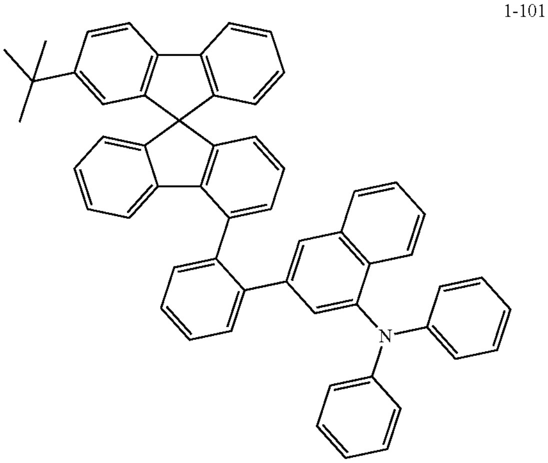

-continued
1-102
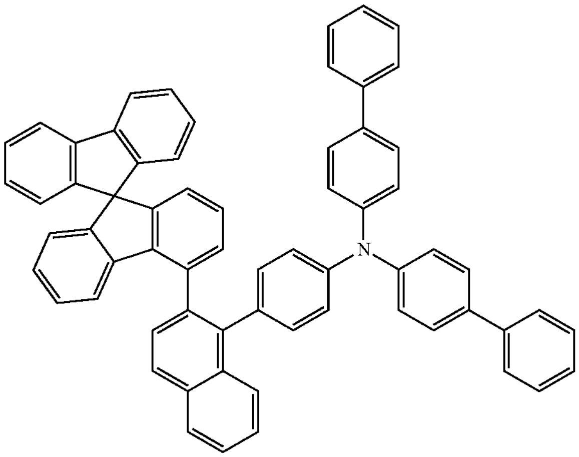
1-103
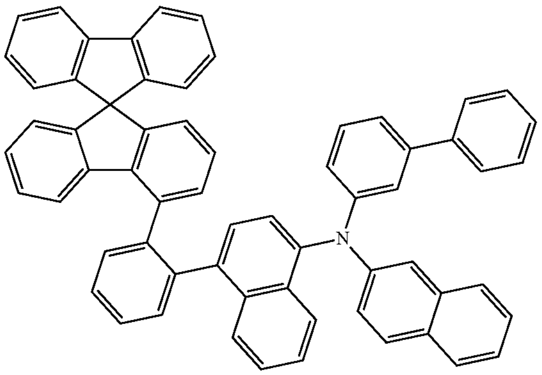
1-104
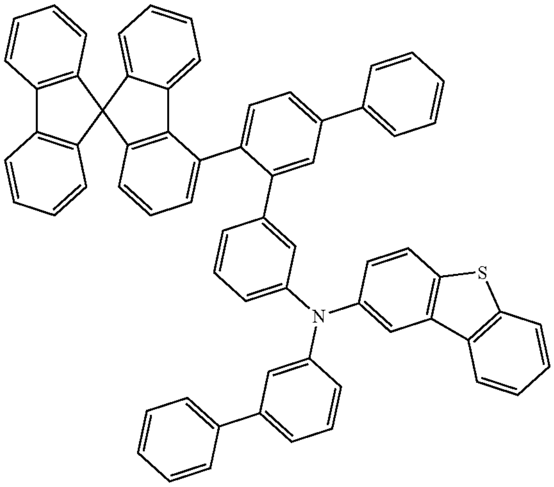
-continued
1-105
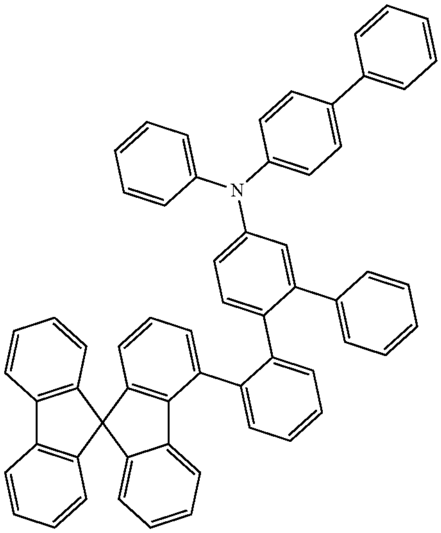
1-106
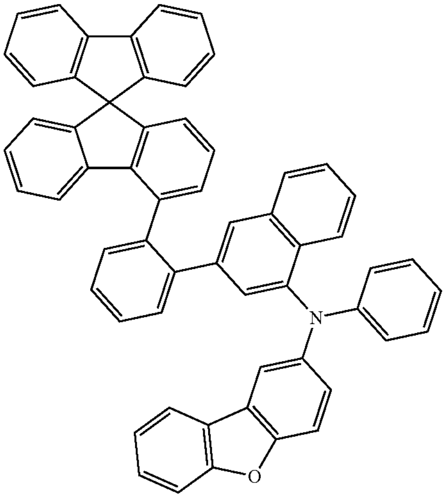
1-107
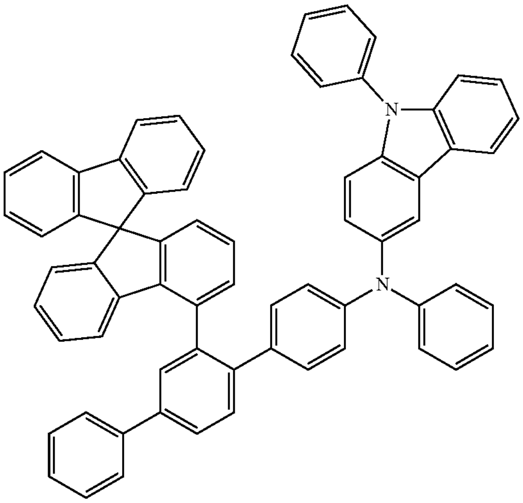

-continued
1-108
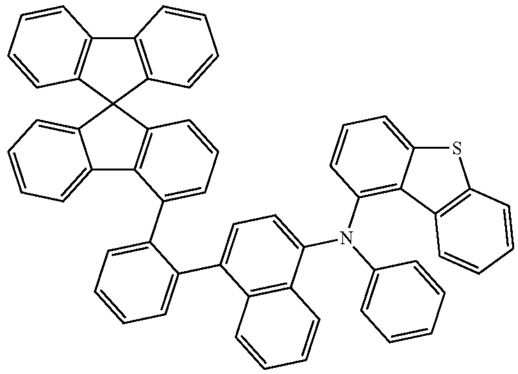
1-109
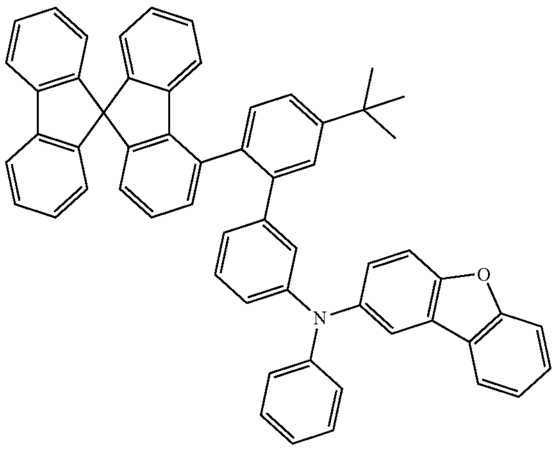
1-110
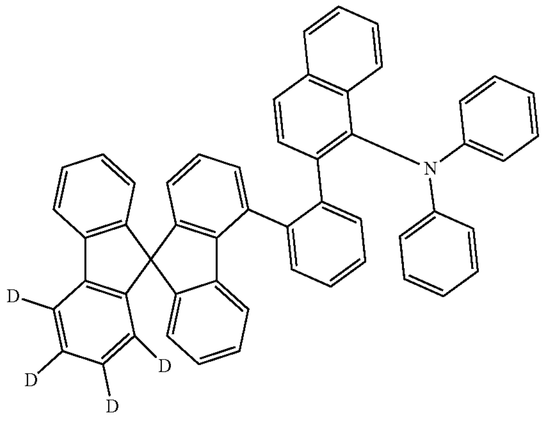
-continued
1-111
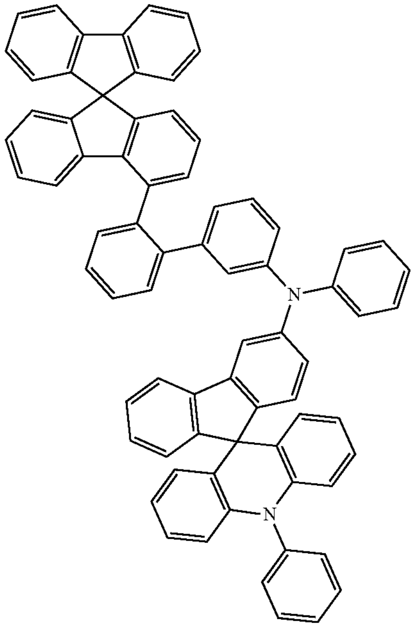
1-112
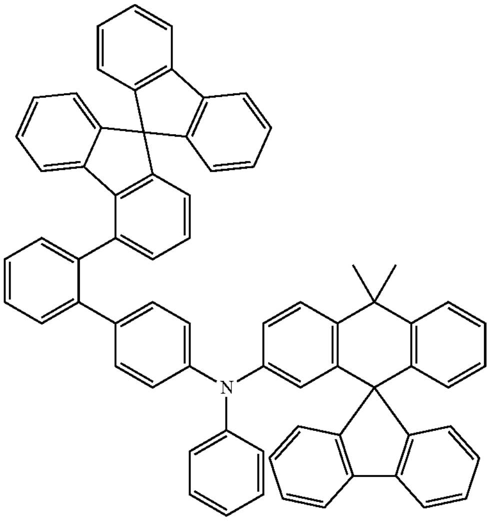
1-113
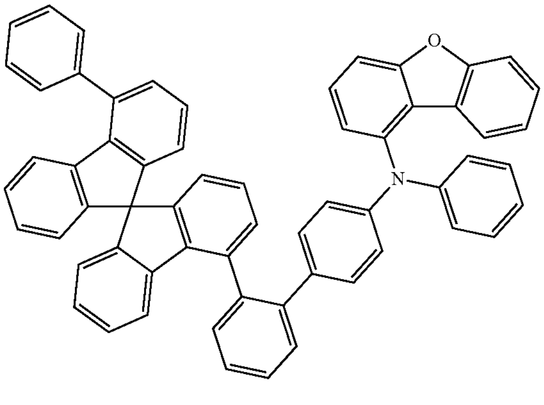

-continued 1-114

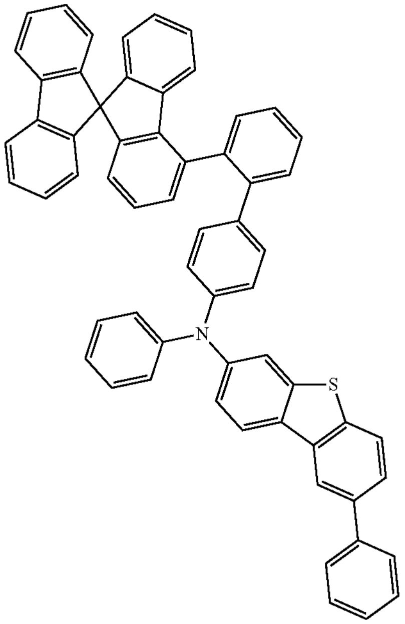

1-115

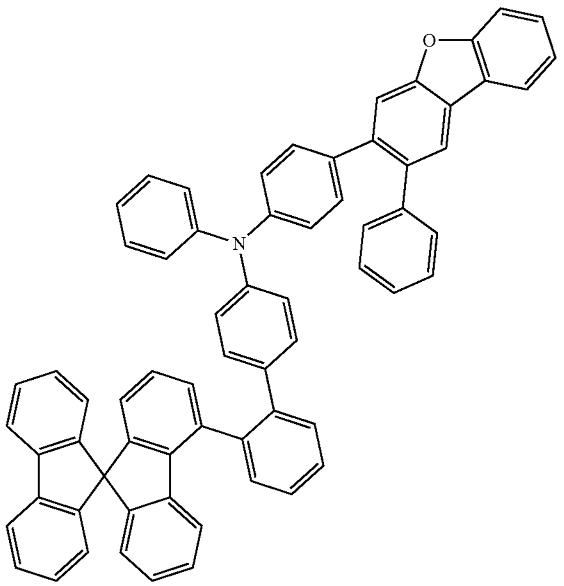

7. An organic electronic element comprising an anode, a cathode, and an organic material layer formed between the anode and the cathode, wherein the organic material layer comprises a single compound or 2 or more compounds represented by Formula 1 of claim 1.

8. The organic electronic element of claim 7, wherein the organic material layer comprises at least one of a hole injection layer, a hole transport layer, an emitting auxiliary layer, an emitting layer, an electron transport auxiliary layer, an electron transport layer, and an electron injection layer.

9. The organic electronic element of claim 7, wherein the organic material layer is an emitting auxiliary layer.

10. The organic electronic element of claim 7, wherein the organic electronic device further comprises a light efficiency enhancing layer formed on at least one surface of the anode and the cathode, the surface being opposite to the organic material layer.

11. The organic electronic element of claim 7, wherein the organic material layer comprises 2 or more stacks including a hole transport layer, an emitting layer, and an electron transport layer sequentially formed on the anode.

12. The organic electronic element of claim 11, wherein the organic material layer further comprises a charge generation layer formed between the 2 or more stacks.

13. An electronic device comprising a display device comprising the organic electronic element of claim 7; and a control unit for driving the display device.

14. An electronic device according to claim 13, wherein the organic electronic element is at least one of an OLED, an organic solar cell, an organic photo conductor (OPC), organic transistor (organic TFT) and an element for monochromic or white illumination.

15. An organic electronic element comprising an anode; a cathode; an organic material layer formed between the anode and the cathode; and a light efficiency enhancing layer, wherein the light efficiency enhancing layer is formed on one of both surfaces of the anode that is not in contact with the organic material layer or on one of both surfaces of the cathode that is not in contact with the organic material layer, and wherein the organic material layer or the light efficiency enhancing layer comprises the compound represented by Formula (1) of claim 1 as a single compound or a mixture of 2 or more compounds.

* * * * *